(12) United States Patent
Lui et al.

(10) Patent No.: US 10,564,643 B2
(45) Date of Patent: Feb. 18, 2020

(54) TIME-WARPING FOR AUTONOMOUS DRIVING SIMULATION

(71) Applicants: Nissan North America, Inc., Franklin, TN (US); Renault S.A.S., Boulogne-Billancourt (FR)

(72) Inventors: Richard Lui, Sunnyvale, CA (US); Stefan Witwicki, San Carlos, CA (US)

(73) Assignees: Nissan North America, Inc., Franklin, TN (US); Renault S.A.S., Boulogne-Billancourt (FR)

( * ) Notice: Subject to any disclaimer, the term of this patent is extended or adjusted under 35 U.S.C. 154(b) by 0 days.

(21) Appl. No.: 16/050,731

(22) Filed: Jul. 31, 2018

(65) Prior Publication Data

US 2019/0369626 A1 Dec. 5, 2019

Related U.S. Application Data

(63) Continuation-in-part of application No. 16/019,291, filed on Jun. 26, 2018, which is a continuation of
(Continued)

(51) Int. Cl.
*G05D 1/02* (2006.01)
*G06F 17/50* (2006.01)
*B60W 50/00* (2006.01)

(52) U.S. Cl.
CPC ......... *G05D 1/0221* (2013.01); *G05D 1/0219* (2013.01); *G06F 17/5009* (2013.01); *B60W 2050/0011* (2013.01)

(58) Field of Classification Search
CPC .............. G05D 1/0221; G05D 1/0219; G06F 17/5009; B60W 2050/0011
(Continued)

(56) References Cited

U.S. PATENT DOCUMENTS 5,684,696 A 11/1997 Rao et al.
5,684,845 A 11/1997 Whitt et al.
(Continued)

FOREIGN PATENT DOCUMENTS

DE 102016212292 A1 8/2017
WO 2017079349 A1 5/2017

OTHER PUBLICATIONS

Torkkola, K., et al., Techniques to Synchronize and Align Driving Simulator Data, DSC 2005 North America—Orlando—Nov. 2005, pp. 353-361.
(Continued)

*Primary Examiner* — Gertrude Arthur Jeanglaude
(74) *Attorney, Agent, or Firm* — Young Basile Hanlon & MacFarlane, P.C.

(57) ABSTRACT

Autonomous driving simulation using recorded driving data is disclosed. A method of simulating autonomous driving includes receiving recorded driving data from a recorded autonomous vehicle (AV), the recorded driving data includes decision-making data generated using a first decision-making algorithm, sensing data, and movement data including positions of the recorded AV; obtaining simulation data from the recorded driving data by excluding the decision-making data from the recorded driving data; and simulating, by a simulation AV, a second decision-making algorithm using the simulation data. The simulating the second decision-making algorithm includes determining a first position of the simulation AV at a first time and adjusting a playback speed of the simulation data based on a difference between the first position and a second position of the positions of the recorded AV at the first time.

20 Claims, 29 Drawing Sheets

Related U.S. Application Data application No. PCT/US2018/035455, filed on May 31, 2018.

(58) Field of Classification Search
USPC .......................................................... 701/27
See application file for complete search history.

(56) References Cited

U.S. PATENT DOCUMENTS

| | | | |
|---|---|---|---|
| 7,912,596 | B2 | 3/2011 | Goossen et al. |
| 9,229,453 | B1 | 1/2016 | Lee |
| 9,857,795 | B2 | 1/2018 | Gupta et al. |
| 9,868,443 | B2 | 1/2018 | Zeng et al. |
| 2003/0014165 | A1 | 1/2003 | Baker et al. |
| 2011/0143319 | A1* | 6/2011 | Bennett .................. G09B 9/301 434/14 |
| 2012/0083960 | A1 | 4/2012 | Zhu et al. |
| 2013/0179382 | A1 | 7/2013 | Fritsch et al. |
| 2015/0046078 | A1 | 2/2015 | Biess et al. |
| 2015/0120138 | A1 | 4/2015 | Zeng et al. |
| 2015/0153735 | A1 | 6/2015 | Clarke et al. |
| 2015/0175168 | A1 | 6/2015 | Hoye et al. |
| 2016/0091897 | A1 | 3/2016 | Nilsson et al. |
| 2016/0200317 | A1 | 7/2016 | Danzl et al. |
| 2017/0109644 | A1 | 4/2017 | Nariyambut Murali et al. |
| 2017/0132334 | A1* | 5/2017 | Levinson ............ G06F 17/5009 |
| 2017/0154529 | A1 | 6/2017 | Zhao et al. |
| 2018/0089563 | A1 | 3/2018 | Redding et al. |
| 2018/0096597 | A1 | 4/2018 | Mortazavi et al. |
| 2019/0121362 | A1 | 4/2019 | Russell et al. |

OTHER PUBLICATIONS

Waymo Safety Report 2018, On the Road to Fully Self-Driving.
Pivtoraiko, Mihail et al., Differentially Constrained Mobile Robot Motion Planning in State Lattices, Journal of Field Robotics, 2009, pp. 308-333, vol. 26(3).
McNaughton, M. et al., Motion Planning for Autonomous Driving with a Conformal Spatiotemporal Lattice, IEEE International Conference on Robotics and Automation, 2011, pp. 4889-4895, Shanghai, China.
Wenda, X. et al., Motion Planning under Uncertainty for On-Road Autonomous Driving, International Conference on Robotics and Automation, 2014, pp. 2507-2512.
Murphy, K. et al., Rao-Blackwellised Particle Filtering for Dynamic Bayesian Networks, Sequential Monte Carlo Methods in Practice, 2001, pp. 499-515.
Vasquez Govea, D. et al., Motion Prediction for Moving Objects: a Statistical Approach, Proc. of the IEEE Int. Conf. on Robotics and Automation, Apr. 2004, pp. 3931-3936.
Lidström, K. et al., Model-based estimation of driver intentions using particle filtering, 11th International IEEE Conference on Intelligent Transportation Systems, 2008, pp. 1177-1182.
Gindele, T. et al., A Probabilistic Model for Estimating Driver Behaviors and Vehicle Trajectories in Traffic Environments, 13th International IEEE Conference on Intelligent Transportation Systems, 2010, pp. 1625-1631.
Lefèvre, S. et al., A survey on motion prediction and risk assessment for intelligent vehicles, ROBOMECH Journal, 2014, vol. 1(1).
Karasev, V. et al., Intent-Aware Long-Term Prediction of Pedestrian Motion, IEEE International Conference on Robotics and Automation, 2016.
Luo, W., et al., Fast and Furious: Real Time End-to-End 3D Detection, Tracking and Motion Forecasting with a Single Convolution Net, The IEEE Conference on Computer Vision and Pattern Recognition, 2018, pp. 3569-3577.
U.S. Appl. No. 62/633,414, filed Feb. 21, 2018.
Wei, J., et al., Autonomous Vehicle Social Behavior for Highway Entrance Ramp Management, IEEE Conference Publication, 2013, pp. 201-207.
Dong, C., et al., Intention Estimation for Ramp Merging Control in Autonomous Driving, IEEE Conference Publication, 2017.
Lee, N., et al., DESIRE: Distant Future Prediction in Dynamic Scenes with Interacting Agents, Arxiv.org, 2017.

* cited by examiner

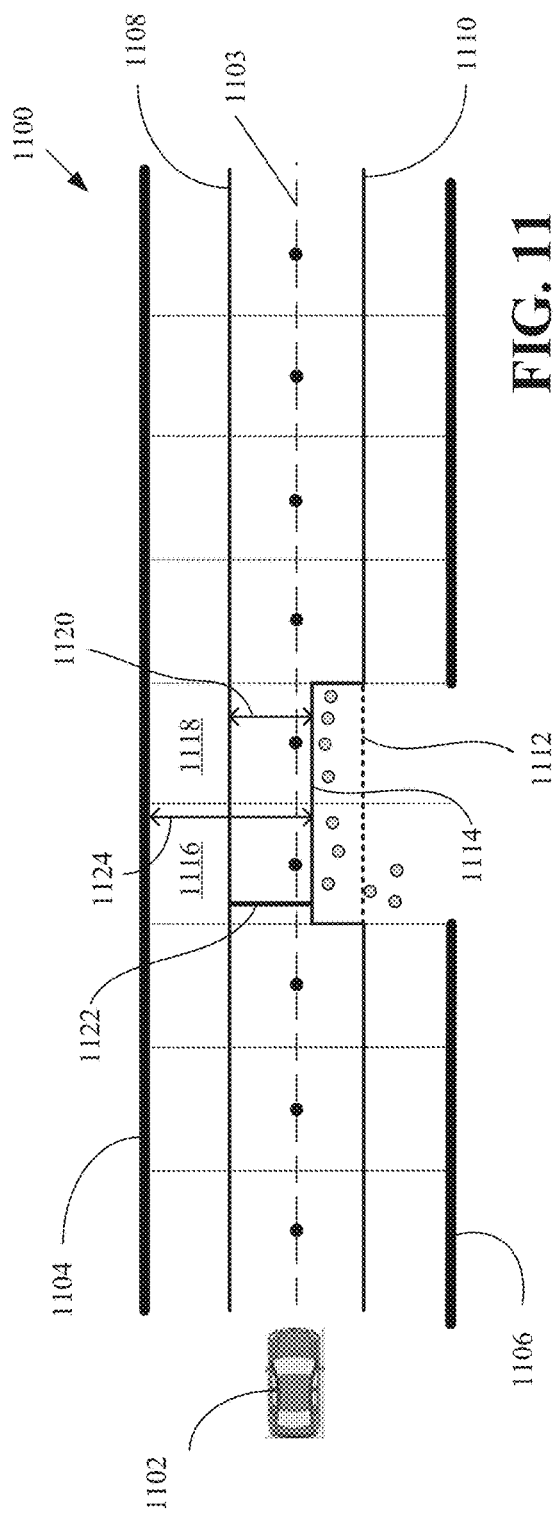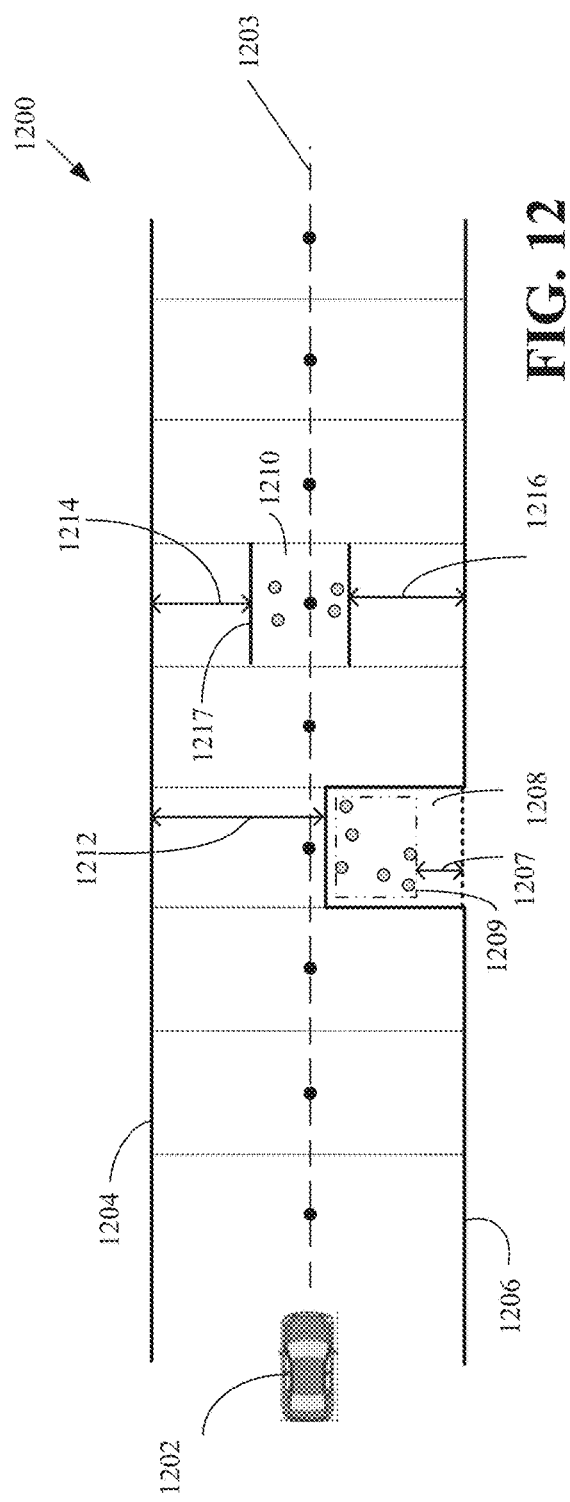

| TIME | TYPE | POSITION | OBJECTS | IMAGE | OTHER DATA |
|---|---|---|---|---|---|
| t10 | POSITION | Pos 10 | Obj 10 | IMG 10 | |
| t11 | POSITION | Pos 11 | Obj 11 | IMG 11 | |
| t11.1 | OBSERVATION | Pos 11.1 | Obj 11.1 | IMG 11.1 | SWITH TO RIGHT LANE |
| t11.8 | DECISION | Pos 11.8 | Obj 11.8 | IMG 11.8 | |
| t12 | POSITION | Pos 12 | Obj 12 | IMG 12 | |
| t12.5 | OPERATOR | Pos 12.5 | Obj 12.5 | IMG 12.5 | ACCELERATE |
| t13 | POSITION | Pos 13 | Obj 13 | IMG 13 | |
| t14 | POSITION | Pos 14 | Obj 14 | IMG 14 | |
| t15 | POSITION | Pos 15 | Obj 15 | IMG 15 | |
| t16 | POSITION | Pos 16 | Obj 16 | IMG 16 | |
| t17 | OBSERVATION | Pos 17 | Obj 17 | IMG 17 | |
| t17.3 | OPERATOR | Pos 17.3 | Obj 17.3 | IMG 17.3 | SLOW |
| t18 | POSITION | Pos 18 | Obj 18 | IMG 18 | |
| t19 | POSITION | Pos 19 | Obj 19 | IMG 19 | |

FIG. 30

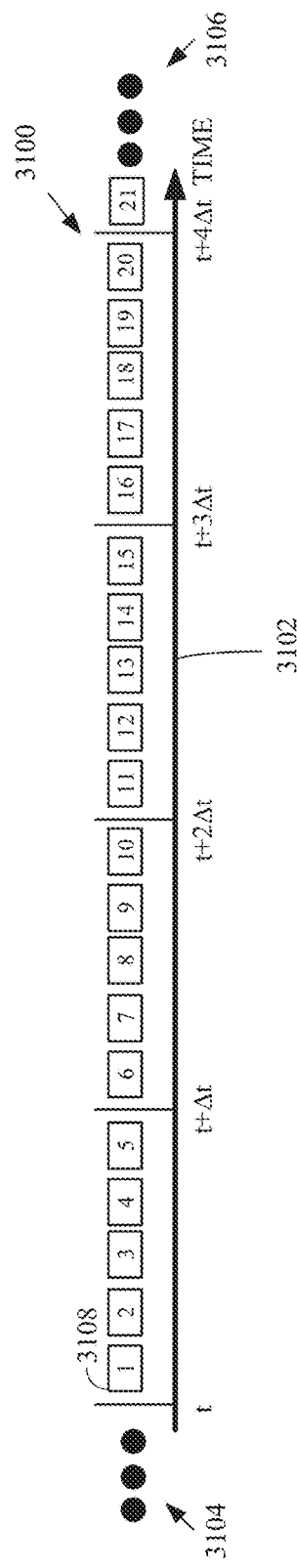

FIG. 31

TIME-WARPING FOR AUTONOMOUS DRIVING SIMULATION

CROSS-REFERENCE TO RELATED APPLICATION(S)

This application is a continuation-in-part of U.S. application Ser. No. 16/019,291, filed Jun. 26, 2018, which is a continuation of International Application Number PCT/US18/35455, filed May 31, 2018, the entire disclosures of which are hereby incorporated by reference.

TECHNICAL FIELD

This application relates to autonomous vehicles, including methods, apparatuses, systems, and non-transitory computer-readable media for simulation of autonomous driving.

BACKGROUND

Increasing autonomous vehicle usage creates the potential for more efficient movement of passengers and cargo through a transportation network. Moreover, the use of autonomous vehicles can result in improved vehicle safety and more effective communication between vehicles. However, it is critical, such as in autonomous driving simulations, that autonomous vehicles can detect static objects and/or predict the trajectories of other nearby dynamic objects to plan a trajectory such that autonomous vehicles can safely traverse the transportation network and avoid such objects.

SUMMARY

Disclosed herein are aspects, features, elements, and implementations for remote support of autonomous operation of a vehicle. The implementations support remote operation that extends an existing route to an alternative end point at a destination.

An aspect of the disclosed implementations is a method of simulating autonomous driving. The method includes receiving recorded driving data from a recorded autonomous vehicle (AV), the recorded driving data includes decision-making data generated using a first decision-making algorithm, sensing data, and movement data including positions of the recorded AV; obtaining simulation data from the recorded driving data by excluding the decision-making data from the recorded driving data; and simulating, by a simulation AV, a second decision-making algorithm using the simulation data. The simulating the second decision-making algorithm includes determining a first position of the simulation AV at a first time and adjusting a playback speed of the simulation data based on a difference between the first position and a second position of the positions of the recorded AV at the first time.

An aspect of the disclosed implementations is an apparatus for simulating autonomous driving including a memory and a processor. The processor is configured to execute instructions of a simulation autonomous vehicle (AV) stored in the memory to receive recorded driving data from a recorded AV, the recorded driving data includes decision-making data generated using a first decision-making algorithm, sensing data, and movement data including positions of the recorded AV; obtain simulation data from the recorded driving data by excluding the decision-making data from the recorded driving data; and simulate a second decision-making algorithm using the simulation data. To simulate the second decision-making algorithm includes to determine a first position of the simulation AV at a first time and adjust a playback speed of the simulation data based on a difference between the first position and a second position of the positions of the recorded AV at the first time.

Another aspect of the disclosed implementations is a method of simulating autonomous driving. The method includes receiving recorded driving data from a recorded autonomous vehicle (AV), the recorded AV using a first decision-making algorithm; and simulating, by a simulation AV, a second decision-making algorithm using at least some of the recorded driving data. Simulating the second decision-making algorithm includes adjusting a playback speed of the at least some of the recorded driving data based on a difference between a first position of the simulation AV at a first time and a second of the position of the recorded AV at the first time.

These and other aspects of the present disclosure are disclosed in the following detailed description of the embodiments, the appended claims and the accompanying figures.

BRIEF DESCRIPTION OF THE DRAWINGS

The disclosed technology is best understood from the following detailed description when read in conjunction with the accompanying drawings. It is emphasized that, according to common practice, the various features of the drawings may not be to scale. On the contrary, the dimensions of the various features may be arbitrarily expanded or reduced for clarity. Further, like reference numbers refer to like elements throughout the drawings unless otherwise noted.

FIGS. 10-12 are examples of adjusting a drivable area for static objects according to implementations of this disclosure.

FIG. 30 is an example of recorded driving data according to implementations of this disclosure.

FIG. 31 is an example of simulation data according to implementations of this disclosure.

DETAILED DESCRIPTION

Figure 1:
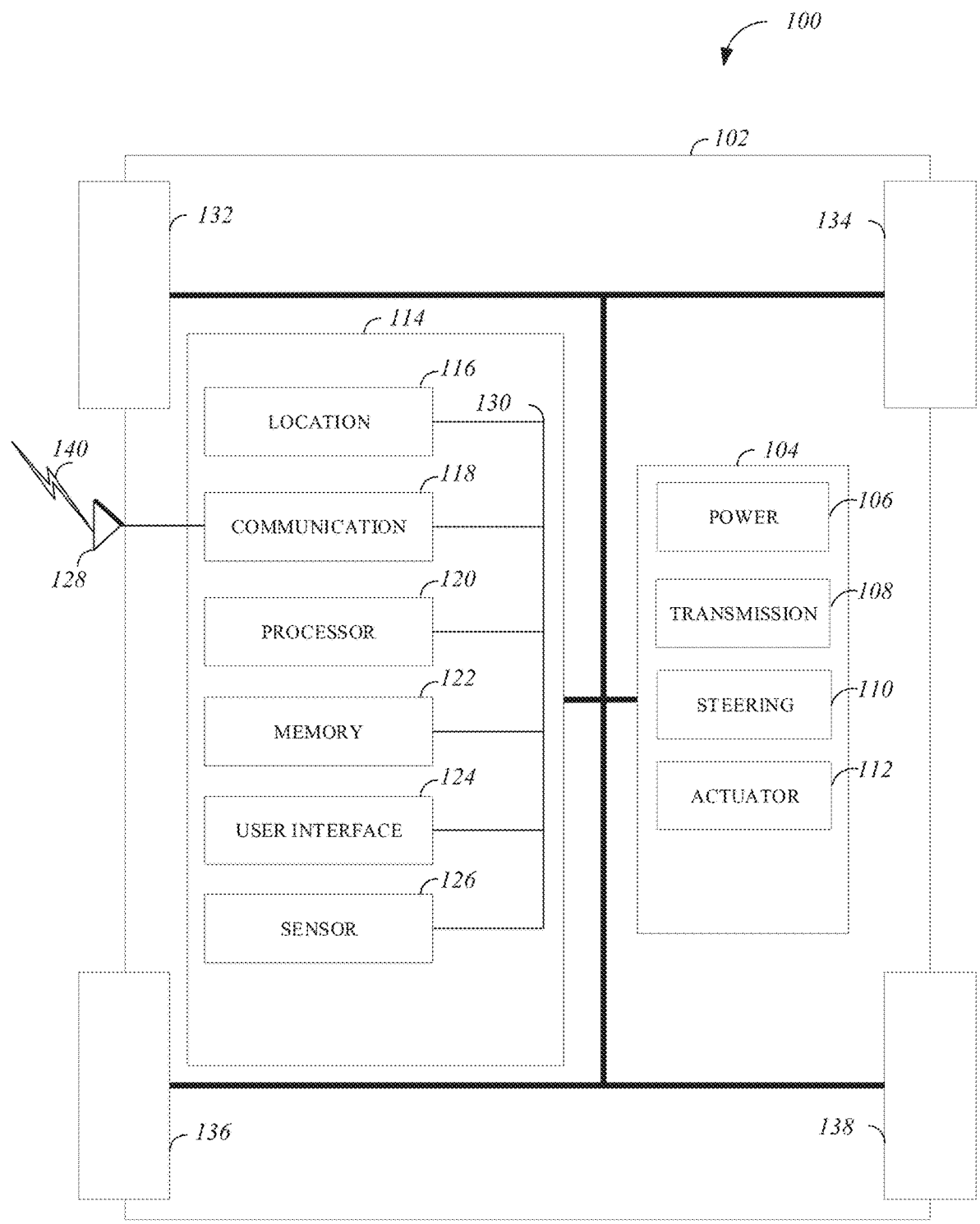
FIG. 1 is a diagram of an example of a portion of a vehicle in which the aspects, features, and elements disclosed herein may be implemented.

A vehicle, such as an autonomous vehicle or a semi-autonomous vehicle, may traverse a portion of a vehicle transportation network. The vehicle transportation network can include one or more unnavigable areas, such as a building; one or more partially navigable areas, such as a parking area (e.g., a parking lot, a parking space, etc.); one or more navigable areas, such as roads (which include lanes, medians, intersections, etc.); or a combination thereof.

The vehicle may include one or more sensors. Traversing the vehicle transportation network may include the sensors generating or capturing sensor data, such as data corresponding to an operational environment of the vehicle, or a portion thereof. For example, the sensor data may include information corresponding to one or more external objects (or simply, objects).

An external object can be a static object. A static object is one that is stationary and is not expected to move in the next few seconds. Examples of static objects include a bike with no rider, a cold vehicle, an empty vehicle, a road sign, a wall, a building, a pothole, etc.

An external object can be a stopped object. A stopped object is one that is stationary but might move at any time. Examples of stopped objects include a vehicle that is stopped at a traffic light and a vehicle on the side of the road with an occupant (e.g., a driver) therein. In some implementations, stopped objects are considered static objects.

An external object can be a dynamic (i.e., moving) object, such as a pedestrian, a remote vehicle, a motorcycle, a bicycle, etc. The dynamic object can be oncoming (toward the vehicle) or can be moving in the same direction as the vehicle. The dynamic object can be moving longitudinally or laterally with respect to the vehicle. A static object can become a dynamic object, and vice versa.

In general, traversing (e.g., driving within) the vehicle transportation network can be considered a robotic behavior. That is, predictable responses by a vehicle to certain situations (e.g., traffic or road situations) can be anticipated. For example, an observer of a traffic situation can anticipate what the response of a vehicle will be over the next few seconds. That is, for example, while the driving environment (i.e., the vehicle transportation network, the roadways) may be dynamic, the response, such as by a vehicle (i.e., driven by a human, remotely operated, etc.), to a road condition, can be predicted/anticipated.

The response(s) can be predicted because traversing a vehicle transportation network is governed by rules of the road (e.g., a vehicle turning left must yield to oncoming traffic, a vehicle must drive between a lane's markings), by social conventions (e.g., at a stop sign, the driver on the right is yielded to), and physical limitations (e.g., a stationary object does not instantaneously move laterally into a vehicle's right of way). Additional examples of predictable responses are illustrated with respect to FIG. 3.

Implementations according to this disclosure determine a trajectory for an autonomous vehicle by detecting (e.g., sensing, observing, etc.) the presence of static objects and anticipating (i.e., predicting) the trajectories of other users of the vehicle transportation network (e.g., road users, dynamic objects). Implementations according to this disclosure can accurately and efficiently plan trajectories of dynamic objects (e.g., other road users) contributing to smooth control (e.g., stop, wait, accelerate, decelerate, merge, etc.) of an autonomous vehicle and socially acceptable behavior (e.g., operations) of the autonomous vehicle.

As further described below, implementations of a trajectory planner according to this disclosure can generate a smooth trajectory for an autonomous vehicle (AV), from a source location to a destination location, by, for example, receiving HD map data, teleoperation data, and other input data; stitching (e.g., fusing, connecting, etc.) the input data longitudinally to determine a speed profile for a path from the source location to the destination location (e.g., the speed profile specifying how fast the AV can be driven along different segments of the path from the source location to the destination location); and, at discrete time points (e.g., every few milliseconds), having the trajectory planner process constraints related to static and dynamic objects, which are observed based on sensor data of the AV, to generate a smooth trajectory for the AV for the next time window (e.g., a look-ahead time of 6 seconds).

The trajectory planner can receive the anticipated (i.e., predicted) trajectories of other users of the vehicle transportation network (also referred to herein as real-world objects) from a module (e.g., a world model module). For each detected dynamic object (e.g., a real-world object, such as a vehicle, a pedestrian, a bicycle, and the like), the world model module can maintain (e.g., predict and update) one or more hypothesis regarding the possible intentions of the real-world object. Examples of intentions (e.g., hypotheses) include stop, turn right, turn left, go straight, pass, and park. A likelihood is associated with each hypothesis. The likelihood is updated based on observations received from sensor data.

The real-world objects are detected based on received sensor data (also referred to herein as measurements or sensor observations). The world model module maintains (i.e., associates and updates over time) a state for each hypothesis (e.g., intention) associated with a real-world object. States are further described below. For example, the state includes predicted locations of the associated real-world object given the intention of a hypothesis.

The world model module continuously receives observations (e.g., sensor data). For a given observation, the world model module determines the real-world object that the observation is associated with. If an associated real-world object is found, then the state of each of the hypotheses associated with real-world object are updated based on the observation. That is, for example, the predicted location of the real-world object is updated based on the observation received from the real (e.g., physical) world.

It is noted that sensor observations can be noisy. The noise can be due to limitations of the sensing capabilities and/or sensor setup. For example, sensors may have limited fields of view, have limited sensing ranges, provide false positive and/or false negative readings, provide observations with large uncertainties, and/or provide erroneous object classifications. Also, different sensor types used by the autonomous vehicle may provide different, partial, and/or conflicting observations (e.g., classifications, locations, etc.). As such a level of uncertainty is associated with the sensor data received by the world model module.

An autonomous vehicle can use (e.g., fuse) data from the multiple types of sensors (e.g., cameras, LiDAR, radar, etc.) to estimate at least one of a velocity, a pose (position and heading), a trajectory, a class, and the like of a real-world object that is external to the autonomous vehicle. A world model module, according to implementations of this disclosure, can provide the best estimation of current statuses of real-world objects (i.e., road users) by fusing information from multiple sensors together and taking sensor characteristics into consideration.

To summarize, as the intentions of other road users are not known to an AV, the AV predicts and tracks multiple possible intentions (i.e., hypotheses) for what the road users might do so that the AV (e.g., a trajectory planner of the AV) can plan a smooth trajectory based on the predicted intentions of the road users. Given observations from sensor data, the world model module, according to implementations of this disclosure, tracks and estimates the states of observed objects (i.e., real-world objects) and predicts the future states of the real-world objects with multiple hypotheses in a probabilistic manner. That is, the world model module can provide for improved tracking of objects in the real world. The world model module predicts multiple hypotheses for possible trajectories of real-world objects. That is, for example, the world model module can predict where an object may be going, whether the object is stopping, whether the object is parking, or the like, as further described below.

As will become apparent from the description below, the world model module can provide benefits including (1) tracking continuous (e.g., object pose, velocity, geometry, etc.) and discrete object states (e.g., object classification, intention, etc.); (2) estimating and tracking multiple object state hypotheses (e.g., intentions) with associated probabilities (e.g., likelihoods); (3) generating and tracking abstract object intentions, depending on object state, map and/or environmental information; (4) predicting future object states with multiple hypotheses for a variable-length of time; and (5) performing real-time processing and fusing data from various sensors (e.g., LiDAR, radar, camera, etc.). The teachings herein can be applied to a wide range of objects and road users (including, but not limit to, cars, bikes, and pedestrians).

Although described herein with reference to an autonomous vehicle, the methods and apparatus described herein may be implemented in any vehicle capable of autonomous or semi-autonomous operation. Although described with reference to a vehicle transportation network, the method and apparatus described herein may include the autonomous vehicle operating in any area navigable by the vehicle.

Implementations according to this disclosure can also use recorded data (i.e., recording driving data) from an autonomous vehicle (i.e., a recorded autonomous vehicle or recorded AV) to simulate autonomous driving. Simulating autonomous driving can mean driving around, using a simulation AV, in a virtual three-dimensional world that includes virtual other road users (e.g., pedestrians, bicyclists, pets, other vehicles, etc.) that interact with the simulation AV.

Simulation of autonomous driving can be a key part of testing, for example, the trajectory planning, decision making, object detection and classification, and/or other aspects related to autonomous driving. For example, simulation can be used to test (e.g., validate, uncover defects, etc.) improved decision-making algorithms before using the improved decision-making algorithms in a real autonomous vehicle that is driven on a real-world road and encountering real-world objects (i.e., other road users). As can be appreciated, simulations are less costly to perform than real-world testing, and, more importantly, no injuries can occur in simulations due to, for example, faulty decision-making algorithms.

Simulation testing can be based on simulated world objects or on recorded on-road driving.

In the simulated world objects scenario, the other road users used in the simulation can be computer-generated objects. As such, the simulation is said to be performed with perfect perception. Perfect perception can mean that the position, classification, velocity, pose, more, fewer, or other aspects (e.g., properties, characteristics, measurements, etc.) of each of other road users can be known without uncertainty. That is, perfect perception can mean that the ground truth with respect to each other road user can be known.

However, and as already mentioned above, sensor data can be noisy. Due, at least partially, to the noise, a recorded AV (i.e., an AV that navigates in the real world) is said to have imperfect perception. As decision-making algorithms need to be desirably robust against imperfect perception, testing (e.g., simulating) the decision-making algorithms using perfect perception (e.g., by using computer-generated other road users) is unsatisfactory because, for example, while one set of results (e.g., optimal decisions) may be generated by the simulation AV under perfect perception, less than optimal decisions (e.g., decisions that lead to collisions) may be generated when the same decision-making algorithms are used under imperfect perception (e.g., in the real world) by a recorded AV.

In recorded on-road driving scenarios, an AV (i.e., a recorded AV) is used to drive around in the real-world. The drive can be recorded and played back during a simulation. Recording the drive can include recording, at some sampling rate, recorded driving data. For example, the sampling rate can be 10 recorded data points per second. However, the disclosure herein is not so limited and other sampling rates (e.g., more or fewer recorded data points per second) can be used. In an example, the recorded driving data can include, at each sampling time, the objects (e.g., referred to herein as other road users and/or real-world objects) that the AV observed (e.g., "seen" or detected via visual sensors and/or heard via auditory sensors) by the recorded AV, the locations of the observed objects, the location (e.g., position) of the recorded AV at the sampling time, and one or more images of the sensing area of the recorded AV. The sensing area can be defined as the area of the real-world that can be observed by the sensors of the recorded AV.

The recorded driving data can be used to perform the simulation. That is, for example, the observed data from the recorded AV can be used, by the simulation AV, as the observations of the other road users during the simulation. That is, instead of receiving sensor information from physical sensors, the recorded driving data (which include sensing data that are captured by the physical sensors of the recorded AV) can be used. As such, the simulation can be performed under imperfect perception (since the recorded driving data were captured under the imperfect perception of the recorded AV, as described above).

However, using recorded driving data for autonomous driving simulation, can present a challenge of time synchronization. The time synchronization challenge can be attributed to a drift between the positions (i.e., locations) of the recorded AV and the positions (i.e., locations) of the simulation AV. That is, for example, a first position of the recorded AV at time t of the recorded data may be different from the second position of the simulation AV at the same time t. In some situations, and as further described below, the drift (e.g., the distance) between the first position and the second position may be sufficiently large such that the simulation AV does not timely receive, as further described below, at least some of the recorded driving data, thereby resulting in decision-making that is not based on the observed (by the recorded AV) other road users.

To reiterate, while the simulation AV and the recorded AV may start the simulation at the same exact position, the simulation AV and the recorded AV may drift away from each other in terms of positions (e.g., location in space). Several sources can contribute to the drift in positions between the recorded AV and the simulation AV.

For example, the drift may be caused by operator intervention. In a typical scenario, an AV (i.e., the recorded AV) is used to drive around in the real world. The AV can include an operator (e.g., a human drive, a tele-operator) who can, for example, override the decision making and/or the planned trajectory of the AV. For example, the operator may accelerate, decelerate, and/or stop to avoid another road user; the operator may hold and/or turn the steering wheel, while the recorded AV is cornering, thereby overriding the steering angle of the recorded AV; or the operator may change lanes whereas the recorded AV would have stayed in the same lane.

In another example, the simulation AV and the recorded AV may use different motion models (e.g., motion control models, kinematic motion models, etc.). A motion model can describe (e.g., model) the amount of power that is applied to the AV, the tire dynamics of the AV, fewer, more, or other aspects of an AV. In an example, where simulating motion control is not an object of the simulation, a simpler motion control model may be used for the simulation AV than that used by the recorded AV, thereby contributing to the position drift.

In another example, the simulation AV and the recorded AV may use different decision-making algorithms. For example, the decision-making algorithm of the simulation AV may be an improved version of the decision-making algorithm of the recorded AV. As such, the drift may be due to different autonomous driving decisions being made by the decision-making algorithms of the recorded AV and the simulation AV.

Regardless of the sources and/or causes of the drift, and as mentioned above, the recorded driving data can be used in autonomous driving simulations to, for example, evaluate the decision-making algorithms of the simulation AV. However, the positions of the recorded AV and the simulation AV are desirably synchronized so that the simulation AV can perform its decision-making using all the data observed by the recorded AV.

It is noted that synchronizing the positions of the simulation AV and the recorded AV does not mean adjusting the position or either, or both, of the recoded AV and the simulation AV. Rather, synchronizing the positions of the simulation AV and the recorded AV means, as further described below, adjusting (e.g., continuously adjusting) a playback speed of the simulation data (which may be the recorded driving data) based on differences between first positions of the simulation AV and second positions of the recorded AV at the same time points. That is, for example, the distance between a first position of the simulation AV at a time T during the simulation and a second position of the recorded AV at the time T of the recorded drive is used to determine the playback speed. By adjusting the playback speed, all other road users (available via sensing data, as further described below) captured by the recorded AV can be used by the decision-making algorithms of the simulation AV. That is, by adjusting the playback speed of the recorded data, the simulation AV can execute its decision-making algorithms using the same data that the recorded AV used in executing its decision-making algorithms.

Implementations according to this disclosure can overcome the above-described limitations of autonomous driving simulations that are based on simulated world objects and/or on recorded on-road driving data. By varying the playback speed of the recorded driving data of the recorded AV to match the position of the simulation AV, autonomous driving can be simulated (such as to evaluate the decision-making algorithms of the simulation AV) using imperfect perception and without the risk of omitting recorded observations. Accordingly, when the position of the simulation AV drifts from the position of the recorded AV, the simulation AV does not overlook observations (e.g., measurements) recorded by the recorded AV.

To describe some implementations of the teachings herein in greater detail, reference is first made to the environment in which this disclosure may be implemented.

FIG. 1 is a diagram of an example of a portion of a vehicle 100 in which the aspects, features, and elements disclosed herein may be implemented. The vehicle 100 includes a chassis 102, a powertrain 104, a controller 114, wheels 132/134/136/138, and may include any other element or combination of elements of a vehicle. Although the vehicle 100 is shown as including four wheels 132/134/136/138 for simplicity, any other propulsion device or devices, such as a propeller or tread, may be used. In FIG. 1, the lines interconnecting elements, such as the powertrain 104, the controller 114, and the wheels 132/134/136/138, indicate that information, such as data or control signals, power, such as electrical power or torque, or both information and power, may be communicated between the respective elements. For example, the controller 114 may receive power from the powertrain 104 and communicate with the powertrain 104, the wheels 132/134/136/138, or both, to control the vehicle 100, which can include accelerating, decelerating, steering, or otherwise controlling the vehicle 100.

The powertrain 104 includes a power source 106, a transmission 108, a steering unit 110, a vehicle actuator 112, and may include any other element or combination of elements of a powertrain, such as a suspension, a drive shaft, axles, or an exhaust system. Although shown separately, the wheels 132/134/136/138 may be included in the powertrain 104.

The power source 106 may be any device or combination of devices operative to provide energy, such as electrical energy, thermal energy, or kinetic energy. For example, the power source 106 includes an engine, such as an internal combustion engine, an electric motor, or a combination of an internal combustion engine and an electric motor, and is operative to provide kinetic energy as a motive force to one or more of the wheels 132/134/136/138. In some embodiments, the power source 106 includes a potential energy unit, such as one or more dry cell batteries, such as nickel-cadmium (NiCd), nickel-zinc (NiZn), nickel metal hydride (NiMH), lithium-ion (Li-ion); solar cells; fuel cells; or any other device capable of providing energy.

The transmission 108 receives energy, such as kinetic energy, from the power source 106 and transmits the energy to the wheels 132/134/136/138 to provide a motive force. The transmission 108 may be controlled by the controller 114, the vehicle actuator 112, or both. The steering unit 110 may be controlled by the controller 114, the vehicle actuator 112, or both and controls the wheels 132/134/136/138 to steer the vehicle. The vehicle actuator 112 may receive signals from the controller 114 and may actuate or control the power source 106, the transmission 108, the steering unit 110, or any combination thereof to operate the vehicle 100.

In the illustrated embodiment, the controller 114 includes a location unit 116, an electronic communication unit 118, a processor 120, a memory 122, a user interface 124, a sensor 126, and an electronic communication interface 128. Although shown as a single unit, any one or more elements of the controller 114 may be integrated into any number of separate physical units. For example, the user interface 124 and the processor 120 may be integrated in a first physical unit, and the memory 122 may be integrated in a second physical unit. Although not shown in FIG. 1, the controller 114 may include a power source, such as a battery. Although shown as separate elements, the location unit 116, the electronic communication unit 118, the processor 120, the memory 122, the user interface 124, the sensor 126, the electronic communication interface 128, or any combination thereof can be integrated in one or more electronic units, circuits, or chips.

In some embodiments, the processor 120 includes any device or combination of devices, now-existing or hereafter developed, capable of manipulating or processing a signal or other information, for example optical processors, quantum processors, molecular processors, or a combination thereof. For example, the processor 120 may include one or more special-purpose processors, one or more digital signal processors, one or more microprocessors, one or more controllers, one or more microcontrollers, one or more integrated circuits, one or more Application Specific Integrated Circuits, one or more Field Programmable Gate Arrays, one or more programmable logic arrays, one or more programmable logic controllers, one or more state machines, or any combination thereof. The processor 120 may be operatively coupled with the location unit 116, the memory 122, the electronic communication interface 128, the electronic communication unit 118, the user interface 124, the sensor 126, the powertrain 104, or any combination thereof. For example, the processor may be operatively coupled with the memory 122 via a communication bus 130.

The processor 120 may be configured to execute instructions. Such instructions may include instructions for remote operation, which may be used to operate the vehicle 100 from a remote location, including the operations center. The instructions for remote operation may be stored in the vehicle 100 or received from an external source, such as a traffic management center, or server computing devices, which may include cloud-based server computing devices. Remote operation was introduced in U.S. provisional patent application Ser. No. 62/633,414, filed Feb. 21, 2018, and entitled "REMOTE OPERATION EXTENDING AN EXISTING ROUTE TO A DESTINATION."

The memory 122 may include any tangible non-transitory computer-usable or computer-readable medium capable of, for example, containing, storing, communicating, or transporting machine-readable instructions or any information associated therewith, for use by or in connection with the processor 120. The memory 122 may include, for example, one or more solid state drives, one or more memory cards, one or more removable media, one or more read-only memories (ROM), one or more random-access memories (RAM), one or more registers, one or more low power double data rate (LPDDR) memories, one or more cache memories, one or more disks (including a hard disk, a floppy disk, or an optical disk), a magnetic or optical card, or any type of non-transitory media suitable for storing electronic information, or any combination thereof.

The electronic communication interface 128 may be a wireless antenna, as shown, a wired communication port, an optical communication port, or any other wired or wireless unit capable of interfacing with a wired or wireless electronic communication medium 140.

The electronic communication unit 118 may be configured to transmit or receive signals via the wired or wireless electronic communication medium 140, such as via the electronic communication interface 128. Although not explicitly shown in FIG. 1, the electronic communication unit 118 is configured to transmit, receive, or both via any wired or wireless communication medium, such as radio frequency (RF), ultra violet (UV), visible light, fiber optic, wire line, or a combination thereof. Although FIG. 1 shows a single one of the electronic communication unit 118 and a single one of the electronic communication interface 128, any number of communication units and any number of communication interfaces may be used. In some embodiments, the electronic communication unit 118 can include a dedicated short-range communications (DSRC) unit, a wireless safety unit (WSU), IEEE 802.11p (WiFi-P), or a combination thereof.

The location unit 116 may determine geolocation information, including but not limited to longitude, latitude, elevation, direction of travel, or speed, of the vehicle 100. For example, the location unit includes a global positioning system (GPS) unit, such as a Wide Area Augmentation System (WAAS) enabled National Marine Electronics Association (NMEA) unit, a radio triangulation unit, or a combination thereof. The location unit 116 can be used to obtain information that represents, for example, a current heading of the vehicle 100, a current position of the vehicle 100 in two or three dimensions, a current angular orientation of the vehicle 100, or a combination thereof.

The user interface 124 may include any unit capable of being used as an interface by a person, including any of a virtual keypad, a physical keypad, a touchpad, a display, a touchscreen, a speaker, a microphone, a video camera, a sensor, and a printer. The user interface 124 may be operatively coupled with the processor 120, as shown, or with any other element of the controller 114. Although shown as a single unit, the user interface 124 can include one or more physical units. For example, the user interface 124 includes an audio interface for performing audio communication with a person, and a touch display for performing visual and touch-based communication with the person.

The sensor 126 may include one or more sensors, such as an array of sensors, which may be operable to provide information that may be used to control the vehicle. The sensor 126 can provide information regarding current operating characteristics of the vehicle or its surroundings. The sensor 126 includes, for example, a speed sensor, acceleration sensors, a steering angle sensor, traction-related sensors, braking-related sensors, or any sensor, or combination of sensors, that is operable to report information regarding some aspect of the current dynamic situation of the vehicle 100.

In some embodiments, the sensor 126 includes sensors that are operable to obtain information regarding the physical environment surrounding the vehicle 100. For example, one or more sensors detect road geometry and obstacles, such as fixed obstacles, vehicles, cyclists, and pedestrians. The sensor 126 can be or include one or more video cameras, laser-sensing systems, infrared-sensing systems, acoustic-sensing systems, or any other suitable type of on-vehicle environmental sensing device, or combination of devices, now known or later developed. The sensor 126 and the location unit 116 may be combined.

Although not shown separately, the vehicle 100 may include a trajectory controller. For example, the controller 114 may include a trajectory controller. The trajectory controller may be operable to obtain information describing a current state of the vehicle 100 and a route planned for the vehicle 100, and, based on this information, to determine and optimize a trajectory for the vehicle 100. In some embodiments, the trajectory controller outputs signals operable to control the vehicle 100 such that the vehicle 100 follows the trajectory that is determined by the trajectory controller. For example, the output of the trajectory controller can be an optimized trajectory that may be supplied to the powertrain 104, the wheels 132/134/136/138, or both. The optimized trajectory can be a control input, such as a set of steering angles, with each steering angle corresponding to a point in time or a position. The optimized trajectory can be one or more paths, lines, curves, or a combination thereof.

One or more of the wheels 132/134/136/138 may be a steered wheel, which is pivoted to a steering angle under control of the steering unit 110; a propelled wheel, which is torqued to propel the vehicle 100 under control of the transmission 108; or a steered and propelled wheel that steers and propels the vehicle 100.

A vehicle may include units or elements not shown in FIG. 1, such as an enclosure, a Bluetooth® module, a frequency modulated (FM) radio unit, a Near-Field Communication (NFC) module, a liquid crystal display (LCD) display unit, an organic light-emitting diode (OLED) display unit, a speaker, or any combination thereof.

Figure 2:
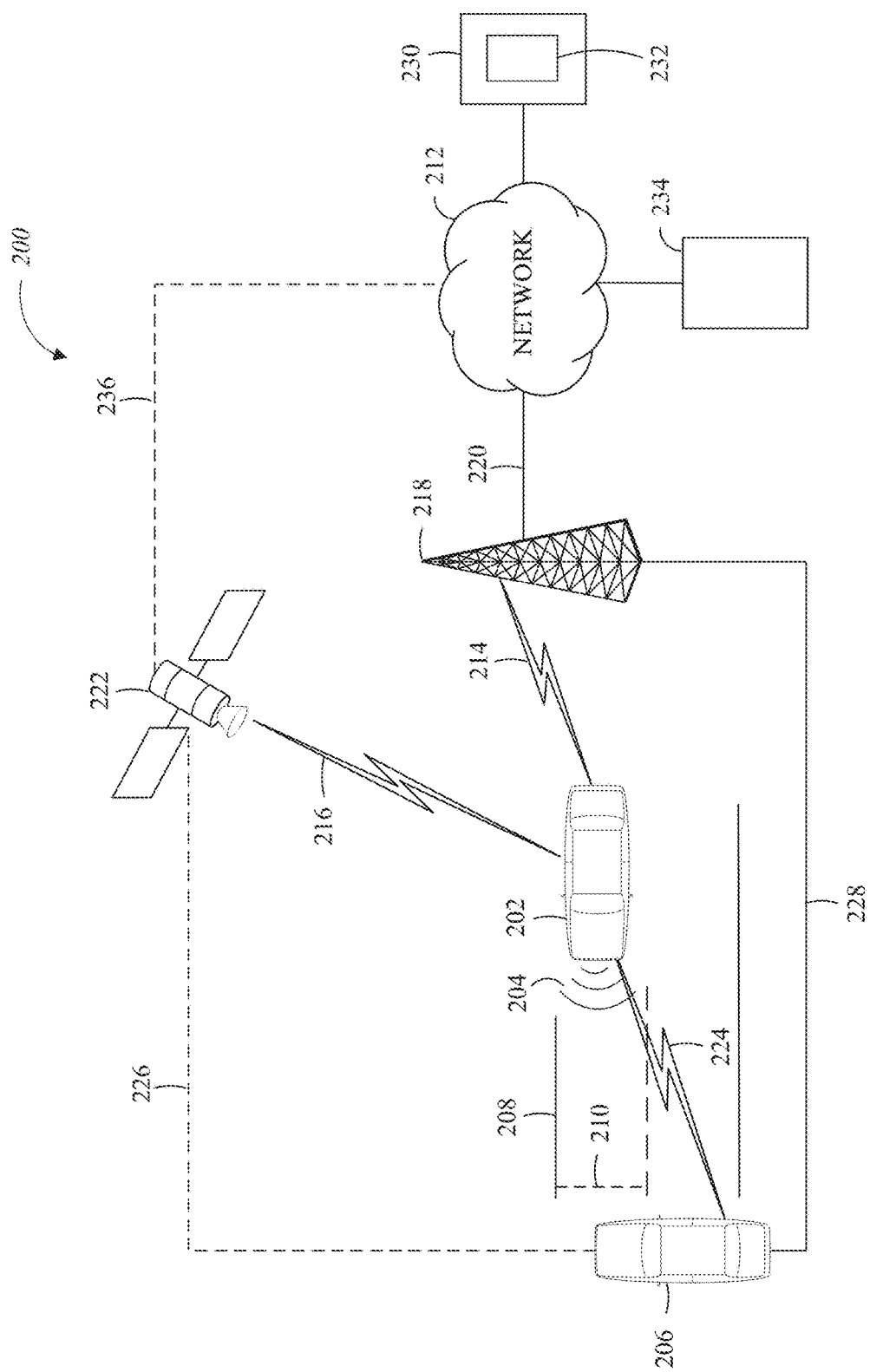
FIG. 2 is a diagram of an example of a portion of a vehicle transportation and communication system in which the aspects, features, and elements disclosed herein may be implemented.

FIG. 2 is a diagram of an example of a portion of a vehicle transportation and communication system 200 in which the aspects, features, and elements disclosed herein may be implemented. The vehicle transportation and communication system 200 includes a vehicle 202, such as the vehicle 100 shown in FIG. 1, and one or more external objects, such as an external object 206, which can include any form of transportation, such as the vehicle 100 shown in FIG. 1, a pedestrian, cyclist, as well as any form of a structure, such as a building. The vehicle 202 may travel via one or more portions of a transportation network 208, and may communicate with the external object 206 via one or more of an electronic communication network 212. Although not explicitly shown in FIG. 2, a vehicle may traverse an area that is not expressly or completely included in a transportation network, such as an off-road area. In some embodiments, the transportation network 208 may include one or more of a vehicle detection sensor 210, such as an inductive loop sensor, which may be used to detect the movement of vehicles on the transportation network 208.

The electronic communication network 212 may be a multiple access system that provides for communication, such as voice communication, data communication, video communication, messaging communication, or a combination thereof, between the vehicle 202, the external object 206, and an operations center 230. For example, the vehicle 202 or the external object 206 may receive information, such as information representing the transportation network 208, from the operations center 230 via the electronic communication network 212.

The operations center 230 includes a controller apparatus 232, which includes some or all of the features of the controller 114 shown in FIG. 1. The controller apparatus 232 can monitor and coordinate the movement of vehicles, including autonomous vehicles. The controller apparatus 232 may monitor the state or condition of vehicles, such as the vehicle 202, and external objects, such as the external object 206. The controller apparatus 232 can receive vehicle data and infrastructure data including any of: vehicle velocity; vehicle location; vehicle operational state; vehicle destination; vehicle route; vehicle sensor data; external object velocity; external object location; external object operational state; external object destination; external object route; and external object sensor data.

Further, the controller apparatus 232 can establish remote control over one or more vehicles, such as the vehicle 202, or external objects, such as the external object 206. In this way, the controller apparatus 232 may teleoperate the vehicles or external objects from a remote location. The controller apparatus 232 may exchange (send or receive) state data with vehicles, external objects, or a computing device, such as the vehicle 202, the external object 206, or a server computing device 234, via a wireless communication link, such as the wireless communication link 226, or a wired communication link, such as the wired communication link 228.

The server computing device 234 may include one or more server computing devices, which may exchange (send or receive) state signal data with one or more vehicles or computing devices, including the vehicle 202, the external object 206, or the operations center 230, via the electronic communication network 212.

In some embodiments, the vehicle 202 or the external object 206 communicates via the wired communication link 228, a wireless communication link 214/216/224, or a combination of any number or types of wired or wireless communication links. For example, as shown, the vehicle 202 or the external object 206 communicates via a terrestrial wireless communication link 214, via a non-terrestrial wireless communication link 216, or via a combination thereof. In some implementations, a terrestrial wireless communication link 214 includes an Ethernet link, a serial link, a Bluetooth link, an infrared (IR) link, an ultraviolet (UV) link, or any link capable of electronic communication.

A vehicle, such as the vehicle 202, or an external object, such as the external object 206, may communicate with another vehicle, external object, or the operations center 230. For example, a host, or subject, vehicle 202 may receive one or more automated inter-vehicle messages, such as a basic safety message (BSM), from the operations center 230 via a direct communication link 224 or via an electronic communication network 212. For example, the operations center 230 may broadcast the message to host vehicles within a defined broadcast range, such as three hundred meters, or to a defined geographical area. In some embodiments, the vehicle 202 receives a message via a third party, such as a signal repeater (not shown) or another remote vehicle (not shown). In some embodiments, the vehicle 202 or the external object 206 transmits one or more automated inter-vehicle messages periodically based on a defined interval, such as one hundred milliseconds (ms).

The vehicle 202 may communicate with the electronic communication network 212 via an access point 218. The access point 218, which may include a computing device, is configured to communicate with the vehicle 202, with the electronic communication network 212, with the operations center 230, or with a combination thereof via wired or wireless communication links 214/220. For example, an access point 218 is a base station, a base transceiver station (BTS), a Node-B, an enhanced Node-B (eNode-B), a Home Node-B (HNode-B), a wireless router, a wired router, a hub, a relay, a switch, or any similar wired or wireless device. Although shown as a single unit, an access point can include any number of interconnected elements.

The vehicle 202 may communicate with the electronic communication network 212 via a satellite 222 or other non-terrestrial communication device. The satellite 222, which may include a computing device, may be configured to communicate with the vehicle 202, with the electronic communication network 212, with the operations center 230, or with a combination thereof via one or more communication links 216/236. Although shown as a single unit, a satellite can include any number of interconnected elements.

The electronic communication network 212 may be any type of network configured to provide for voice, data, or any other type of electronic communication. For example, the electronic communication network 212 includes a local area network (LAN), a wide area network (WAN), a virtual private network (VPN), a mobile or cellular telephone network, the Internet, or any other electronic communication system. The electronic communication network 212 may use a communication protocol, such as the Transmission Control Protocol (TCP), the User Datagram Protocol (UDP), the Internet Protocol (IP), the Real-time Transport Protocol (RTP), the Hyper Text Transport Protocol (HTTP), or a combination thereof. Although shown as a single unit, an electronic communication network can include any number of interconnected elements.

In some embodiments, the vehicle 202 communicates with the operations center 230 via the electronic communication network 212, access point 218, or satellite 222. The operations center 230 may include one or more computing devices, which are able to exchange (send or receive) data from a vehicle, such as the vehicle 202; data from external objects, including the external object 206; or data from a computing device, such as the server computing device 234.

In some embodiments, the vehicle 202 identifies a portion or condition of the transportation network 208. For example, the vehicle 202 may include one or more on-vehicle sensors 204, such as the sensor 126 shown in FIG. 1, which includes a speed sensor, a wheel speed sensor, a camera, a gyroscope, an optical sensor, a laser sensor, a radar sensor, a sonic sensor, or any other sensor or device or combination thereof capable of determining or identifying a portion or condition of the transportation network 208.

The vehicle 202 may traverse one or more portions of the transportation network 208 using information communicated via the electronic communication network 212, such as information representing the transportation network 208, information identified by one or more on-vehicle sensors 204, or a combination thereof. The external object 206 may be capable of all or some of the communications and actions described above with respect to the vehicle 202.

For simplicity, FIG. 2 shows the vehicle 202 as the host vehicle, the external object 206, the transportation network 208, the electronic communication network 212, and the operations center 230. However, any number of vehicles, networks, or computing devices may be used. In some embodiments, the vehicle transportation and communication system 200 includes devices, units, or elements not shown in FIG. 2.

Although the vehicle 202 is shown communicating with the operations center 230 via the electronic communication network 212, the vehicle 202 (and the external object 206) may communicate with the operations center 230 via any number of direct or indirect communication links. For example, the vehicle 202 or the external object 206 may communicate with the operations center 230 via a direct communication link, such as a Bluetooth communication link. Although, for simplicity, FIG. 2 shows one of the transportation network 208 and one of the electronic communication network 212, any number of networks or communication devices may be used.

The external object 206 is illustrated as a second, remote vehicle in FIG. 2. An external object is not limited to another vehicle. An external object may be any infrastructure element, for example, a fence, a sign, a building, etc., that has the ability transmit data to the operations center 230. The data may be, for example, sensor data from the infrastructure element.

Figure 3:
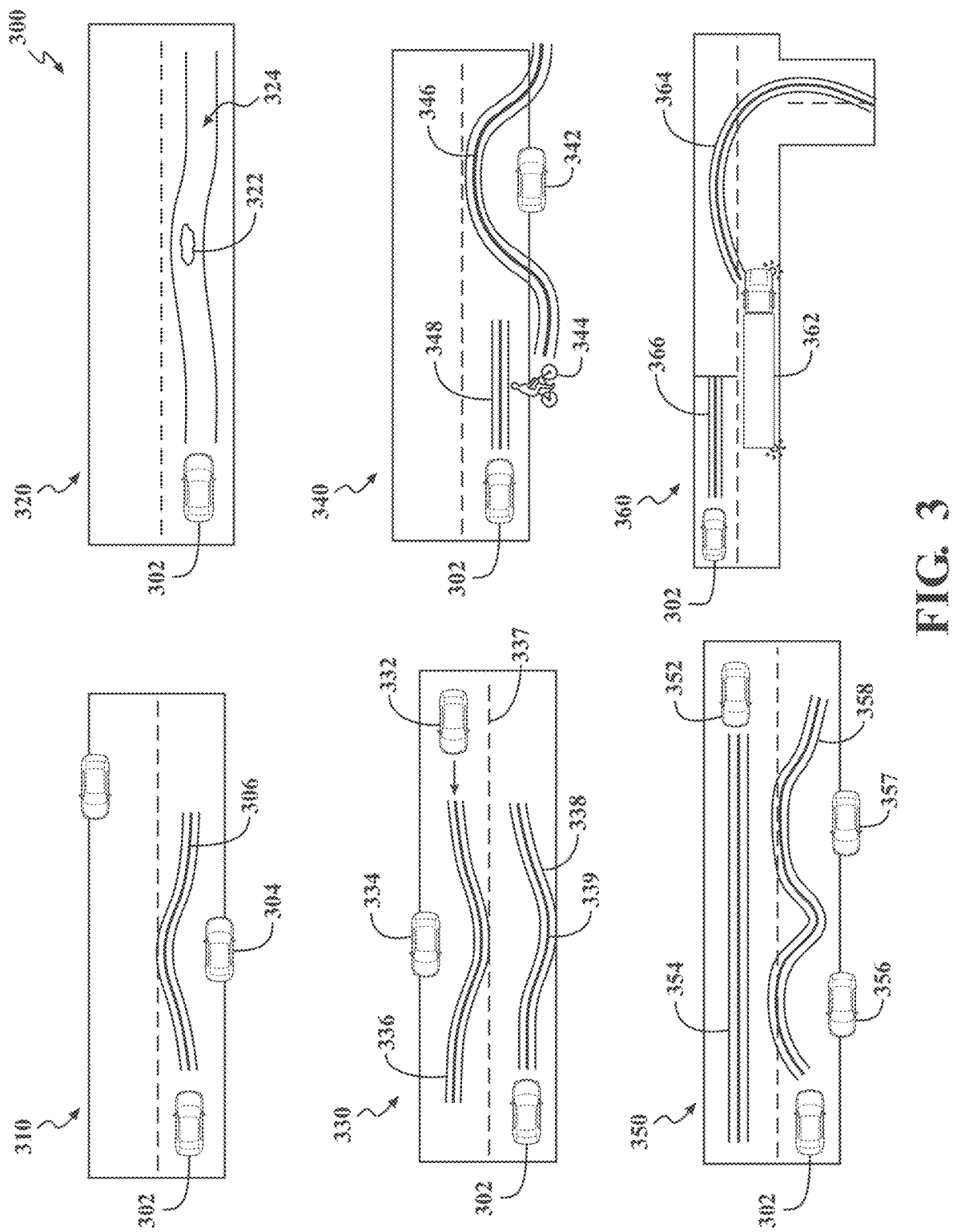
FIG. 3 is a diagram of situations of predictable responses according to implementations of this disclosure.

FIG. 3 is a diagram of situations 300 of predictable responses according to implementations of this disclosure. The situations 300 include situations 310-360 in which responses of an autonomous vehicle (AV) 302 can be predicted and a trajectory planned.

The situations 300 represent examples of predictable situations and responses of road users. The situations take place (e.g., happen, occur, etc.) at a slow time scale. That is, even if the AV 302 might be going at a high speed (e.g., 60 miles per hour (MPH)), the situations 310-360 are considered to be slow scenarios because, due to the computing power (e.g., the computing power of a processor, such as the processor 120 of FIG. 1, and/or a controller, such as the controller 114 of FIG. 1) of the AV 302, predicting responses of external objects and determining a trajectory for the autonomous vehicle can be accomplished within a sub-second of elapsed time.

The AV 302 can include a world modeling module, which can track at least some detected external objects. The world modeling module can predict one or more potential hypotheses (i.e., trajectories, paths, or the like) for each tracked object of at least some of the tracked objects. The AV 302 can include a trajectory planning system (or, simply, a trajectory planner) that can be executed by a processor to generate (considering an initial state, desired actions, and at least some tracked objects with predicted trajectories) a collision-avoiding, law-abiding, comfortable response (e.g., trajectory, path, etc.).

In the situation 310, the AV 302 detects (i.e., by the tracking component) a parked car 304 (i.e., a static object) at the side of the road. The AV 302 (i.e., the trajectory planner of the AV 302) can plan a path (i.e., a trajectory), as further described below, that navigates the AV 302 around the parked car 304, as shown by a trajectory 306.

The situation 320 is another situation where the AV 302 detects another static object. The detected static object is a pothole 322. The AV 302 can plan a trajectory 324 such that the AV 302 drives over the pothole 322 in a way that none of the tires of the AV 302 drive into the pothole 322.

In the situation 330, the AV 302 detects an oncoming vehicle 332 and a parked vehicle 334 that is on the same side of the road as the oncoming vehicle 332. The oncoming vehicle 332 is moving. As such, the oncoming vehicle 332 is a dynamic object. The oncoming vehicle 332 is moving in the same (or at least substantially the same) longitudinal direction as the AV 302. As such, the oncoming vehicle 332 can be classified as a longitudinal constraint, as further described below. The oncoming vehicle 332 is moving in the direction opposite that of the AV 302. As such, the oncoming vehicle 332 can be classified as an oncoming longitudinal constraint. The parked vehicle 334 is a static object.

The AV 302 can predict (i.e., by the prediction component), with a certain degree of certainty that exceeds a threshold, that the oncoming vehicle 332 is likely to follow a trajectory 336 in order to avoid (e.g., get around) the parked vehicle 334. The trajectory 336 overlaps a centerline 337 of the road. In order to keep a safe distance from the oncoming vehicle 332, the trajectory planner of the AV 302 can plan a trajectory 338 that includes a curvature at location 339. That is, the planned trajectory of the AV 302 moves the AV 302 to the right in anticipation of the route of the oncoming vehicle 332.

In the situation 340, the tracking component of the AV 302 can detect a parked vehicle 342 (i.e., a static object) and a bicycle 344 that is moving (i.e., a dynamic object that is a longitudinal constraint). The prediction component may determine, with a certain degree of certainty, that the bicycle 344 will follow a trajectory 346 to get around the parked vehicle 342. As such, the AV 302 determines (i.e., plans, calculates, selects, generates, or otherwise determines) a trajectory 348 such that the AV 302 slows down to allow the bicycle 344 to pass the parked vehicle 342. In another example, the AV 302 can determine more than one possible trajectory. For example, the AV 302 can determine a first trajectory as described above, a second trajectory whereby the AV 302 accelerates to pass the bicycle 344 before the bicycle 344 passes the parked car, and a third trajectory whereby the AV 302 passes around the bicycle 344 as the bicycle 344 is passing the parked vehicle 342. The trajectory planner then selects one of the determined possible trajectories.

In the situation 350, the tracking component of the AV 302 detects an oncoming vehicle 352, a first parked vehicle 356, and a second parked vehicle 357. The prediction component of the AV 302 determines that the oncoming vehicle 352 is following a trajectory 354. The AV 302 selects a trajectory 358 such that the AV 302 passes the first parked vehicle 356, waits between the first parked vehicle 356 and the second parked vehicle 357 until the oncoming vehicle 352 passes, and then proceeds to pass the second parked vehicle 357.

In the situation 360, the prediction component of the AV 302 determines that a large truck 362 is most likely turning right. The trajectory planner determines (e.g., based on a motion model of a large truck) that, since a large truck requires a large turning radius, the large truck 362 is likely to follow a trajectory 364. As the trajectory 364 interferes with the path of the AV 302, the trajectory planner of the AV 302 determines a trajectory 366 for the AV 302, such that the AV 302 is brought to a stop until the large truck 362 is out of the way.

Figure 4:
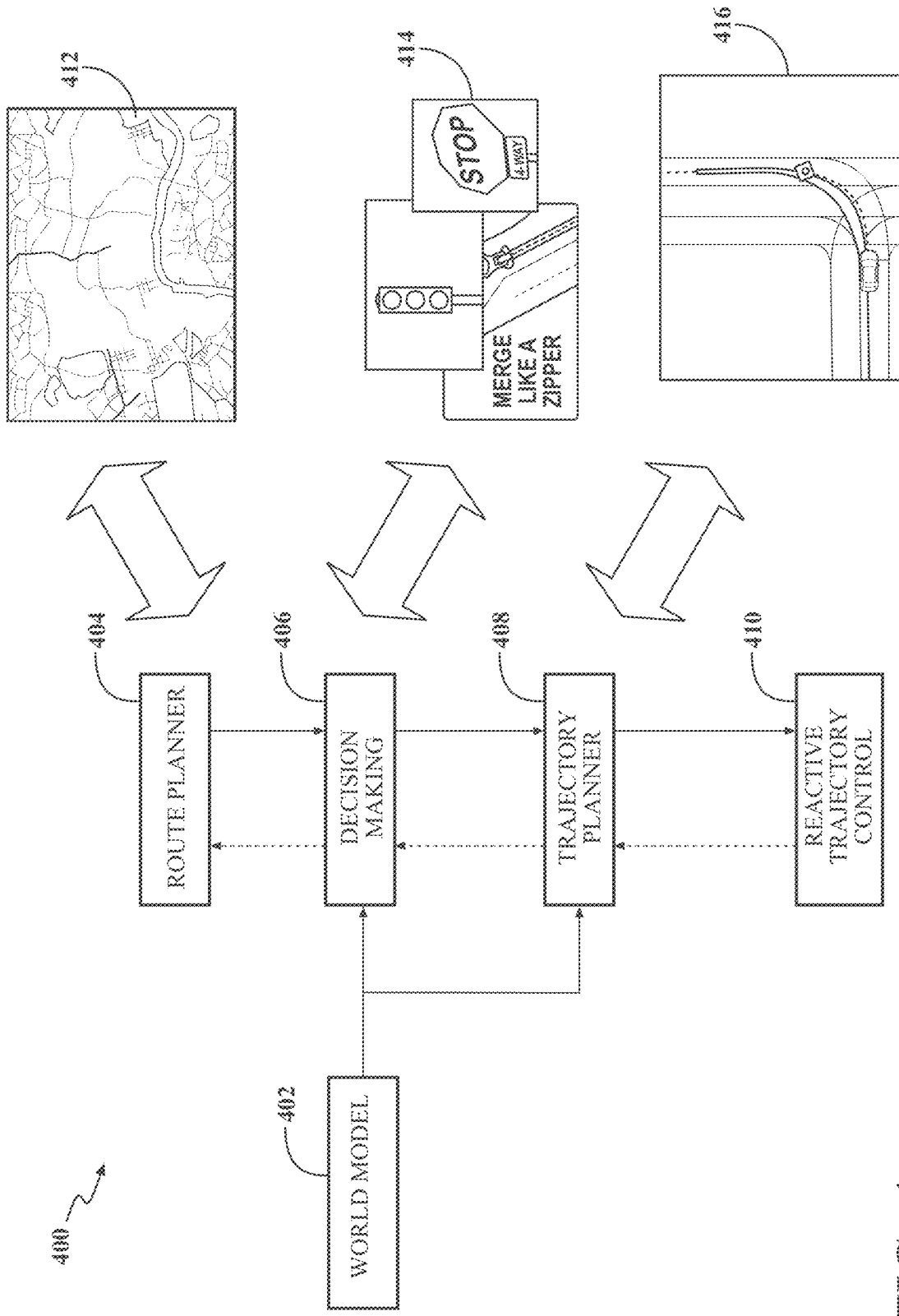
FIG. 4 is an example of components of a system for an autonomous vehicle according to implementations of this disclosure.

FIG. 4 is an example of components of a system 400 for an autonomous vehicle according to implementations of this disclosure. The system 400 represents a software pipeline of an autonomous vehicle, such as the vehicle 100 of FIG. 1. The system 400 includes a world model module 402, a route planning module 404, a decision-making module 406, a trajectory planner 408, and a reactive trajectory control module 410. Other examples of the system 400 can include more, fewer, or other modules. In some examples, the modules can be combined; in other examples, a module can be divided into one or more other modules.

The world model module 402 receives sensor data, such as from the sensor 126 of FIG. 1, and determines (e.g., converts to, detects, etc.) objects from the sensor data. That is, for example, the world model module 402 determines the road users from the received sensor data. For example, the world model module 402 can convert a point cloud received from a light detection and ranging (LiDAR) sensor (i.e., a sensor of the sensor 126) into an object. Sensor data from several sensors can be fused together to determine (e.g., guess the identity of) the objects. Examples of objects include a bicycle, a pedestrian, a vehicle, etc.

The world model module 402 can receive sensor information that allows the world model module 402 to calculate and maintain additional information for at least some of the detected objects. For example, the world model module 402 can maintain a state for at least some of the determined objects. For example, the state for an object can include zero or more of a velocity, a pose, a geometry (such as width, height, and depth), a classification (e.g., bicycle, large truck, pedestrian, road sign, etc.), and a location. As such, the state of an object includes discrete state information (e.g., classification) and continuous state information (e.g., pose and velocity).

The world model module 402 fuses sensor information, tracks objects, maintains lists of hypotheses for at least some of the dynamic objects (e.g., an object A might be going straight, turning right, or turning left), creates and maintains predicted trajectories for each hypothesis, and maintains likelihood estimates of each hypothesis (e.g., object A is going straight with probability 90% considering the object pose/velocity and the trajectory poses/velocities). In an example, the world model module 402 uses an instance of the trajectory planner, which generates a reference driveline for each object hypothesis for at least some of the dynamic objects. For example, one or more instances of the trajectory planner can be used to generate reference drivelines for vehicles, bicycles, and pedestrians. In another example, an instance of the trajectory planner can be used to generate reference drivelines for vehicles and bicycles, and a different method can be used to generate reference drivelines (e.g., references paths) for pedestrians.

The objects maintained by the world model module 402 can include static objects and/or dynamic objects, as described with respect to FIG. 3.

The route planning module 404 determines a road-level plan, such as illustrated with respect to a road-level plan 412. For example, given a starting location and a destination location, the route planning module 404 determines a route from the starting location to the destination location. For example, the route planning module 404 can determine the list of roads (i.e., the road-level plan) to be followed by the AV to navigate from the starting location to the destination location.

The road-level plan determined by the route planning module 404 and the objects (and corresponding state information) maintained by the world model module 402 can be used by the decision-making module 406 to determine discrete-level decisions along the road-level plan. An example of decisions included in the discrete-level decisions is illustrated with respect to discrete decisions 414. An example of discrete-level decisions may include: stop at the interaction between road A and road B, move forward slowly, accelerate to a certain speed limit, merge onto the rightmost lane, etc.

The trajectory planner 408 can receive the discrete-level decisions, the objects (and corresponding state information) maintained by the world model module 402, and the predicted trajectories and likelihoods of the external objects from the world model module 402. The trajectory planner 408 can use at least some of the received information to determine a detailed-planned trajectory for the autonomous vehicle.

For example, as illustrated with respect to a detailed-planned trajectory 416, the trajectory planner 408 determines a next-few-seconds trajectory. As such, and in an example where the next few seconds are the next 6 seconds (i.e., a look-ahead time of 6 seconds), the trajectory planner 408 determines a trajectory and locations for the autonomous vehicle in the next 6 seconds. For example, the trajectory planner 408 may determine (e.g., predict, calculate, etc.) the expected locations of the autonomous vehicle at several time intervals (e.g., every one-quarter of a second, or some other time intervals). The trajectory planner 408 can determine the detailed-planned trajectory based on predictable responses of other road users, as described, for example, with respect to FIG. 3.

The reactive trajectory control module 410 can handle situations that the autonomous vehicle may encounter but are unpredictable (e.g., cannot be handled) by the trajectory planner 408. Such situations include situations where the detailed-planned trajectory of the trajectory planner 408 was based on misclassification of objects and/or unanticipated situations that rarely occur. For example, the reactive trajectory control module 410 can modify the detailed-planned trajectory in response to determining that the static object to the left of the autonomous vehicle is misclassified. For example, the object may have been classified as a large truck; however, a new classification determines that it is a static road barrier wall. In another example, the reactive trajectory control module 410 can modify the detailed-planned trajectory in response to a sudden tire blowout of the autonomous vehicle. Other examples of unanticipated situations include other vehicles swerving suddenly (e.g., due to late decision to get to highway off-ramp or tire blowout) into the lane of the AV and pedestrians or other objects emerging suddenly from behind occlusions.

Figure 5:
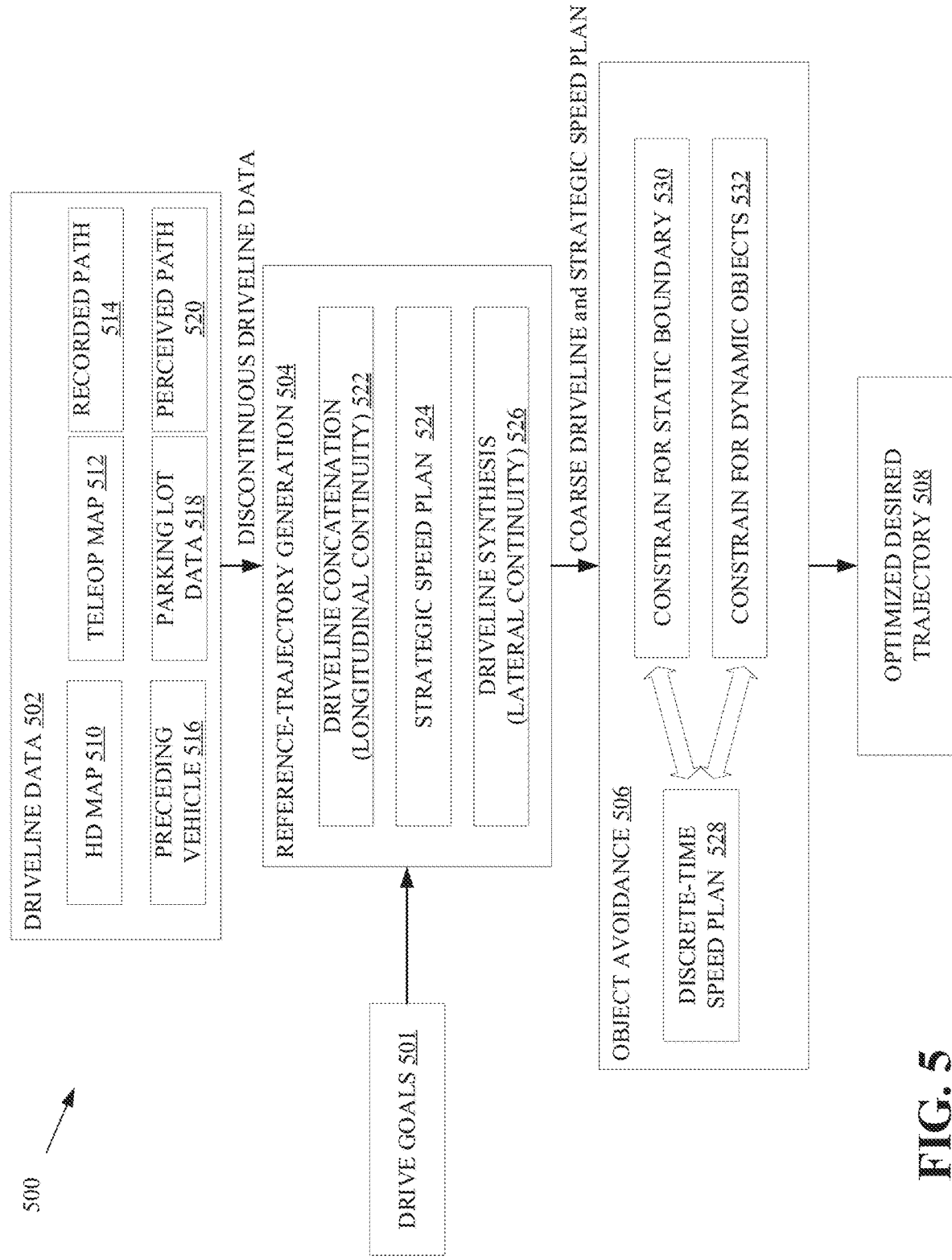
FIG. 5 is an example of layers of a trajectory planner for an autonomous vehicle according to implementations of this disclosure.

FIG. 5 is an example of layers of a trajectory planner 500 for an autonomous vehicle according to implementations of this disclosure. The trajectory planner 500 can be, or can be a part of, the trajectory planner 408 of FIG. 4. The trajectory planner 500 can receive drive goals 501. The trajectory planner 500 can receive a sequence of drive goals 501 that can represent, for example, a series of lane selections and speed limits that connect a first location to a second location. For example, a drive goal of the drive goals 501 can be "starting at location x, travel on a lane having a certain identifier (e.g., lane with an identifier that is equal to A123) while respecting speed limit y". The trajectory planner 500 can be used to generate a trajectory that accomplishes the sequence of the drive goals 501.

The trajectory planner 500 includes a driveline data layer 502, a reference-trajectory generation layer 504, an object avoidance layer 506, and a trajectory optimization layer 508. The trajectory planner 500 generates an optimized trajectory. Other examples of the trajectory planner 500 can include more, fewer, or other layers. In some examples, the layers can be combined; in other examples, a layer can be divided into one or more other layers.

The driveline data layer 502 includes the input data that can be used by the trajectory planner 500. The driveline data can be used (e.g., by the reference-trajectory generation layer 504) to determine (i.e., generate, calculate, select, or otherwise determine) a coarse driveline from a first location to a second location. The driveline can be thought of as the line in the road over which the longitudinal axis of the AV coincides as the AV moves along the road. As such, the driveline data is data that can be used to determine the driveline. The driveline is coarse, at this point, and may contain lateral discontinuities such as when directed to transition laterally between adjacent lanes. The driveline at this point is also not yet adjusted for objects encountered by the AV, as further described below.

In an example, the driveline data layer 502 can include one or more of High Definition (HD) map data 510, teleoperation map data 512, recorded paths data 514, preceding vehicle data 516, parking lot data 518, and perceived path data 520.

The HD map data 510 is data from a high-definition (i.e., high-precision) map, which can be used by an autonomous vehicle. The HD map data 510 can include accurate information regarding a vehicle transportation network to within a few centimeters. For example, the HD map data 510 can include details regarding road lanes, road dividers, traffic signals, traffic signs, speed limits, and the like.

The teleoperation map data 512 can include relatively short driveline data. For example, the teleoperation map data 512 can be driveline data that are 100 meters to 200 meters long. However, the teleoperation map data 512 is not necessarily so limited. The teleoperation map data 512 can be manually generated by a teleoperator in response to, or in anticipation of, exceptional situations that the AV is not capable of automatically handling.

The driveline may be created in real time. To illustrate creating the driveline in real time, an example is now provided. A teleoperator may be remotely observing the AV raw sensor data. For example, the teleoperator may see (such as on a remote monitor) construction-site pylons (e.g., captured by a camera of the AV) and draw a path for the AV through a construction zone. The teleoperator may then watch a flag person giving the go-ahead to the AV, at which point the teleoperator can cause the AV to proceed along the drawn path.

To reduce processing time of manually drawing the path when an AV reaches an exceptional situation that was previously encountered, the driveline data can also be stored remotely and sent to the AV as needed.

The recorded paths data 514 can include data regarding paths previously followed by the autonomous vehicle. In an example, an operator (e.g., a driver or a remote operator) of the autonomous vehicle may have recorded a path from the street into the garage of a home.

The preceding vehicle data 516 can be data received from one or more vehicles that precede the autonomous vehicle along a generally same trajectory as the autonomous vehicle. In an example, the autonomous vehicle and a preceding vehicle can communicate via a wireless communication link, such as described with respect to FIG. 2. As such, the autonomous vehicle can receive trajectory and/or other information from the preceding vehicle via the wireless communication link. The preceding vehicle data 516 can also be perceived (e.g., followed) without an explicit communication link. For example, the AV can track the preceding vehicle and can estimate a vehicle driveline of the preceding vehicle based on the tracking results.

The parking lot data 518 includes data regarding locations of parking lots and/or parking spaces. In an example, the parking lot data 518 can be used to predict trajectories of other vehicles. For example, if a parking lot entrance is proximate to another vehicle, one of the predicted trajectories of the other vehicle may be that the other vehicle will enter the parking lot.

In some situations map, (e.g., HD map) information may not be available for portions of the vehicle transportation network. As such, the perceived path data 520 can represent drivelines where there is no previously mapped information. Instead, the AV can detect drivelines in real time using fewer, more, or other than lane markings, curbs, and road limits. In an example, road limits can be detected based on transitions from one terrain type (e.g., pavement) to other terrain types (e.g., gravel or grass). Other ways can be used to detect drivelines in real time.

Figure 6:
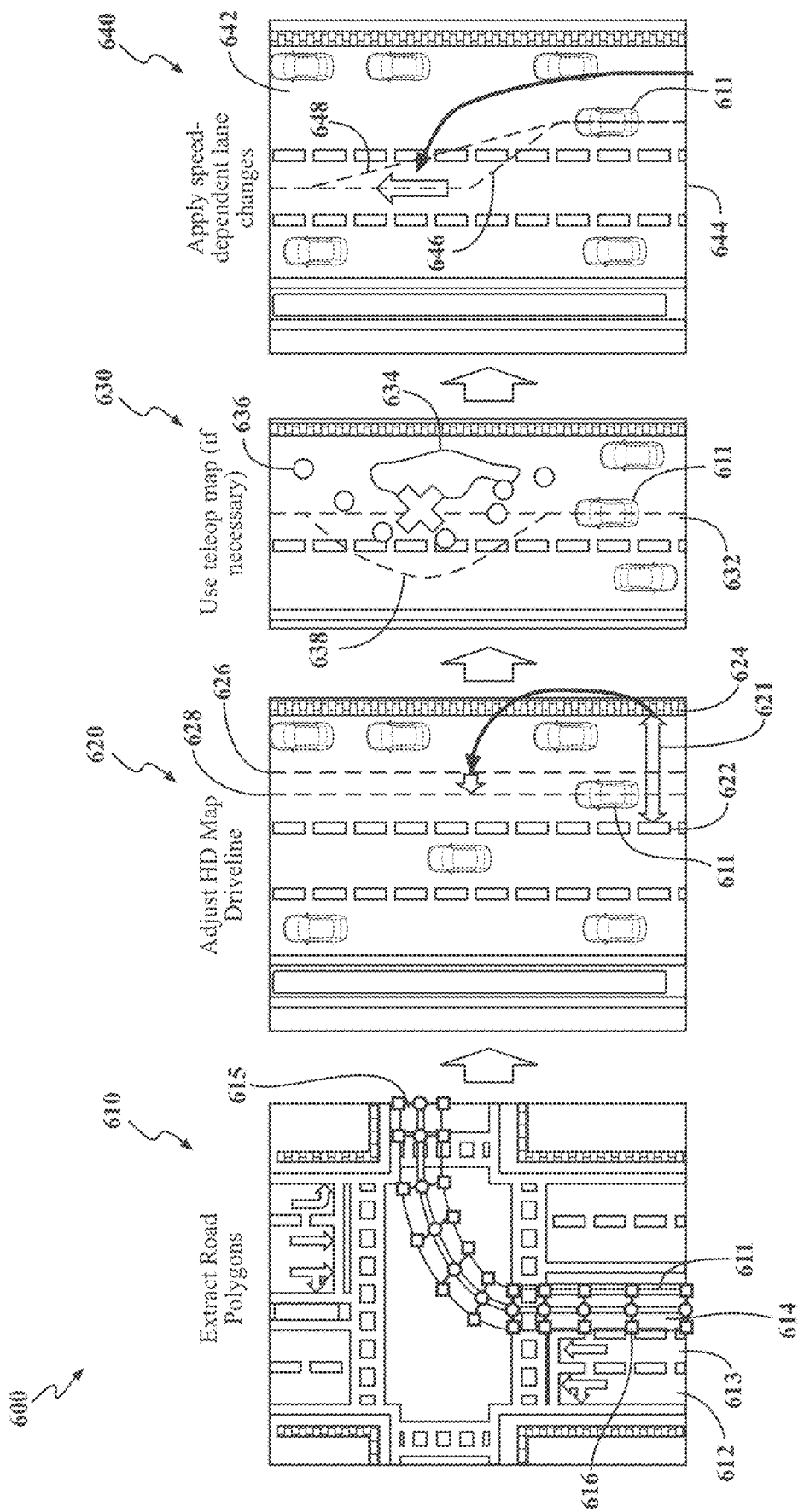
FIG. 6 is an illustration of examples of coarse-driveline concatenation according to implementations of this disclosure.

The reference-trajectory generation layer 504 can include a driveline concatenation module 522, a strategic speed plan module 524, and a driveline synthesis module 526. The reference-trajectory generation layer 504 provides the coarse driveline to a discrete-time speed plan module 528. FIG. 6 illustrates an example of the operation of the reference-trajectory generation layer 504.

It is noted that the route planning module 404 can generate a lane ID sequence, which is used to travel from a first location to a second location thereby corresponding to (e.g., providing) the drive goals 501. As such, the drive goals 501 can be, for example, 100's of meters apart, depending on the length of a lane. In the case of the HD map data 510, for example, the reference-trajectory generation layer 504 can use a combination of a location (e.g., GPS location, 3D Cartesian coordinates, etc.) and a lane (e.g., the identifier of the lane) in the sequence of the drive goals 501 to generate a high-resolution driveline (e.g., from the HD map 510) represented as series of poses for the AV. Each pose can be at a predetermined distance. For example, the poses can be one to two meters apart. A pose can be defined by more, fewer, or other quantities as coordinates (x, y, z), roll angle, pitch angle, and/or yaw angle.

As mentioned above, the driveline data can be used to determine (e.g., generate, calculate, etc.) a coarse driveline. The driveline concatenation module 522 splices (e.g., links, fuses, merges, connects, integrates, or otherwise splices) the input data of the driveline data layer 502 to determine the coarse driveline along the longitudinal direction (e.g., along the path of the autonomous vehicle). For example, to get from location A (e.g., work) to location D (e.g., home), to determine the coarse driveline, the driveline concatenation module 522 can use input data from the parking lot data 518 to determine a location of an exit from the work location parking lot to exit to the main road, can use data from the HD map data 510 to determine a path from the main road to the home, and can use data from the recorded paths data 514 to navigate into the garage at home.

The coarse driveline does not include speed information. However, in some examples, the coarse driveline can include speed limit information, which can be used (e.g., extracted) from the HD map data 510. The strategic speed plan module 524 determines specific speed(s) along the different portions of the coarse driveline. For example, the strategic speed plan module 524 can determine that, on a first straight section of the coarse driveline, the speed of the autonomous vehicle can be set to the speed limit of that first straight section; and on a subsequent second curved section of the coarse driveline, the speed of the autonomous vehicle is to be set to a slower speed. As such, the strategic speed plan module 524 computes a law-abiding (e.g., respecting speed limits and stop lines), comfortable (e.g., physically and emotionally), and physically realizable speed profile (e.g., speed versus distance along the driveline) for the coarse driveline considering the current state (e.g., speed and acceleration) of the AV but not considering other road users or static objects.

Once a strategic speed plan is determined by the strategic speed plan module 524, the driveline synthesis module 526 can adjust the coarse driveline laterally. Considering the strategic speed profile and the coarse driveline with lateral discontinuities, the driveline synthesis module 526 determines the start and end locations of the lane change and synthesizes a driveline connecting the two locations. The length of the lane change can be speed dependent.

The driveline synthesis module 526 can synthesize drivelines joining laterally-discontinuous locations in the coarse driveline. For example, assume that the HD map data 510 includes a first section of the coarse driveline that is on a first lane of a road but that a second section of the coarse driveline is on a second lane of the same road. As such there exists a lateral discontinuity in the coarse driveline. The driveline synthesis module 526 first determines a transition distance (or, equivalently start and end locations) over which the AV should transition from the first lane to the second lane. That is, the start position is the road position when the autonomous vehicle is to be controlled to start moving from the first lane to the second lane. The end position is the road position when the autonomous vehicle is to have completed the lane change. The lateral continuity module then generates new driveline data joining the start position in the first lane to the end position in the second lane.

The transition determined by the driveline synthesis module 526 can be speed dependent. For example, a shorter transition distance can be required for the AV to transition from the first lane to the second lane when the AV is moving at a slower speed than when the AV is moving at a higher speed. For example, in a heavy traffic situation where the autonomous vehicle is traveling at a slower speed (e.g., 15 MPH), 20 yards may be required for the transition; however, if the autonomous vehicle is traveling at a higher speed (e.g., 65 MPH), then the transition distance may be 100 yards. As such, the driveline synthesis module 526 can determine the transition position depending on the speed of the AV.

The output of the driveline synthesis module 526 is provided to the object avoidance layer 506. The output of the driveline synthesis module 526 includes the coarse driveline and the strategic speed plan. The object avoidance layer 506 generates a medium-term, discrete-time speed plan and lateral constraints on the coarse driveline. For discrete points in time the future (or, equivalently, at discrete locations along the path of the AV), the discrete-time speed plan module 528 determines (i.e., calculates) a respective desired speed for the AV.

At the object avoidance layer 506, and as further described below, using the coarse driveline, nearby static objects, and nearby dynamic objects and their predicted trajectories, the object avoidance layer 506 determines (e.g., extracts) a drivable area where the AV can be safely operated. Right and left boundaries of each bin (described below) are determined. Given a current speed of the AV, a real-time speed plan can be generated. The real-time speed plan can be used to estimate future locations of the AV. The future locations of the AV can be evaluated against future anticipated (e.g., predicted) locations of dynamic objects. The drivable area of the AV is adjusted to remove areas of the drivable area that correspond to (e.g., overlap) locations of the dynamic objects.

At the object avoidance layer 506, the coarse driveline is evaluated and/or adjusted for objects. The objects can be objects external to and proximal to the AV. As such, the objects can be the objects described with respect to the world model module 402 of FIG. 4. As such, given a current speed of the AV, the object avoidance layer 506 generates a real-time speed plan. Using the real-time speed plan, the object avoidance layer 506 can estimate future locations of the AV at discrete future time points. The future locations can be evaluated against the locations of the objects (i.e., the objects of the world model) to provide (e.g., generate) a smooth drive for the AV. Providing a smooth drive (i.e., a smooth trajectory) can be an iterative process, as further described below.

To summarize, a coarse driveline is first generated; a speed plan is then generated from the coarse driveline; and, given the coarse driveline and the speed plan, a trajectory is optimized in view of other objects that are maintained in the world model of the AV, to provide an optimized desired trajectory. The trajectory is optimized in an adjusted drivable area. Non-drivable areas (i.e., areas where the AV cannot be safely driven because of the other objects) are removed from a default drivable area to provide the adjusted drivable area.

FIG. 6 is an illustration of examples 600 of coarse-driveline concatenation according to implementations of this disclosure. The examples 600 are examples of the operation of the reference-trajectory generation layer 504 of FIG. 5.

In a view 610, an AV 611 is in a rightmost lane 614 of a three-lane road that includes lanes 612-614. Note that the view 610 is an example of a left-hand traffic system (i.e., the traffic in the lanes 612-614 moves from the bottom towards the top of FIG. 6). A route planner, such as the route planning module 404, may have determined, based on HD map data, such as the HD map data 510 of FIG. 5, that the AV 611 is to turn right onto lane 615 of a one-lane road. The HD map may provide the centerline (not shown) for each lane.

In some situations, the driveline of the AV may not coincide with the centerline of a lane or road. For example, the lane 615 may be extra-wide to accommodate parking spaces along the left side of the lane 615. In another example, it may be found that most drivers prefer to drive slightly left of the centerline. As such, the driveline of the AV 611 is to be set to the left of the centerline of the lane 615. As such, the driveline concatenation module 522 determines the geometry of the lanes in order to determine the driveline given the lane geometry (e.g., the lane width). For example, when there is a turn in the coarse driveline, the driveline concatenation module 522 determines where the driveline is to be moved (i.e., off the lane centerline) based on the width of the lane, the turning direction (e.g., right or left), the turning angle, and/or the turning speed. That is, the driveline concatenation module 522 sets the driveline of the AV based on the HD map centerline. In an example, the driveline can be set based on the lane width.

To set the driveline of the AV, the driveline concatenation module 522 determines the geometry of lanes along the coarse driveline. In an example, the driveline concatenation module 522 determines the geometry for a certain distance (e.g., 100 meters, 200 meters, 300 meters, etc.) along the coarse driveline. To determine the geometry, the driveline concatenation module 522 can determine polygons, such as a polygon 616 along the coarse driveline, which can be used to define lane boundaries.

A view 620 illustrates determining the driveline (i.e., a coarse driveline) based on a width 621 of a lane. A right edge 624, a left edge 622, and a centerline 626 of a lane along which the AV 611 is traveling can be obtained from the HD map. The driveline concatenation module 522 determines the driveline 628 (i.e., the coarse driveline) based on the width 621. As such, the driveline 628 is shifted from the centerline 626.

A view 630 illustrates using teleoperation data, such as described with respect to the teleoperation map data 512 of FIG. 5, in order to determine a driveline. As described above, whereas the HD map data are static data, teleoperation data can provide a real-time driveline based on road conditions and/or exceptional situations. For example, a construction zone exists along a driveline 632 of the AV 611. The construction zone is bounded by obstacles, such as a pylon 636, which surround a construction project 634. As such, the driveline concatenation module 522 adjusts, as further described below, the driveline 632 to be a driveline 638 (i.e., a coarse driveline) using a real-time driveline that is provided by the teleoperation data.

A view 640 illustrates a speed-dependent lane change. The speed-dependent lane change can be implemented, as described above, by the driveline synthesis module 526 of FIG. 5. In an example, the decision-making module 406 of FIG. 4 provides that the AV 611, traveling along a lane 642, is to be next in a lane 644, for example, because the lane 642 ends or because the AV 611 is to turn left. As such, the AV 611 is to move from the lane 642 to the lane 644 at some point. As the HD map may not provide lane transition information, the reference-trajectory generation layer 504 of the AV 611 determines the lane transition time. As mentioned above, the transition can be speed dependent.

In an example, the trajectory planner 500 (of which the reference-trajectory generation layer 504 is a layer) can determine that at a point X along the coarse driveline, the AV 611 will be moving at a speed Y (as determined by the strategic speed plan module 524). In a case where the AV 611 is moving at a low speed (e.g., 35 MPH), the driveline synthesis module 526 can determine that the transition can be slow. Accordingly, the path to move from the lane 642 to the lane 644 can be as shown by a path 646. On the other hand, if the AV 611 is traveling at a high speed (e.g., 65 MPH), the path to switch lanes requires a longer distance, as shown by a path 648.

The time required to follow the paths 646 and 648 can be the same. However, the distance is different. The distance required for the lane transition when the AV 611 is traveling at a first speed is longer than the distance required when the AV 611 is traveling at a second speed that is slower than the first speed.

A lane-change rate can be used to determine the speed-dependent lane change. That is, the lane-change rate can be used to create a connection between two adjacent lanes, such as the lane 642 and the lane 644 of the view 640. The lane-change rate can be defined in "meters per meter:" How many meters does the path move laterally per meter longitudinally? As mentioned above, the goal is to identify a lane change rate that leads to the completion of the lane change in a target amount of time: If the AV is travelling slowly (for example, during dense rush-hour traffic), the lane change rate is high and takes place over a short distance (e.g., on the order of tens of meters); if the AV is travelling quickly (e.g., at highway speeds), the lane change rate is slow and takes place over a long distance (e.g., on the order of hundreds meters).

Figure 7:
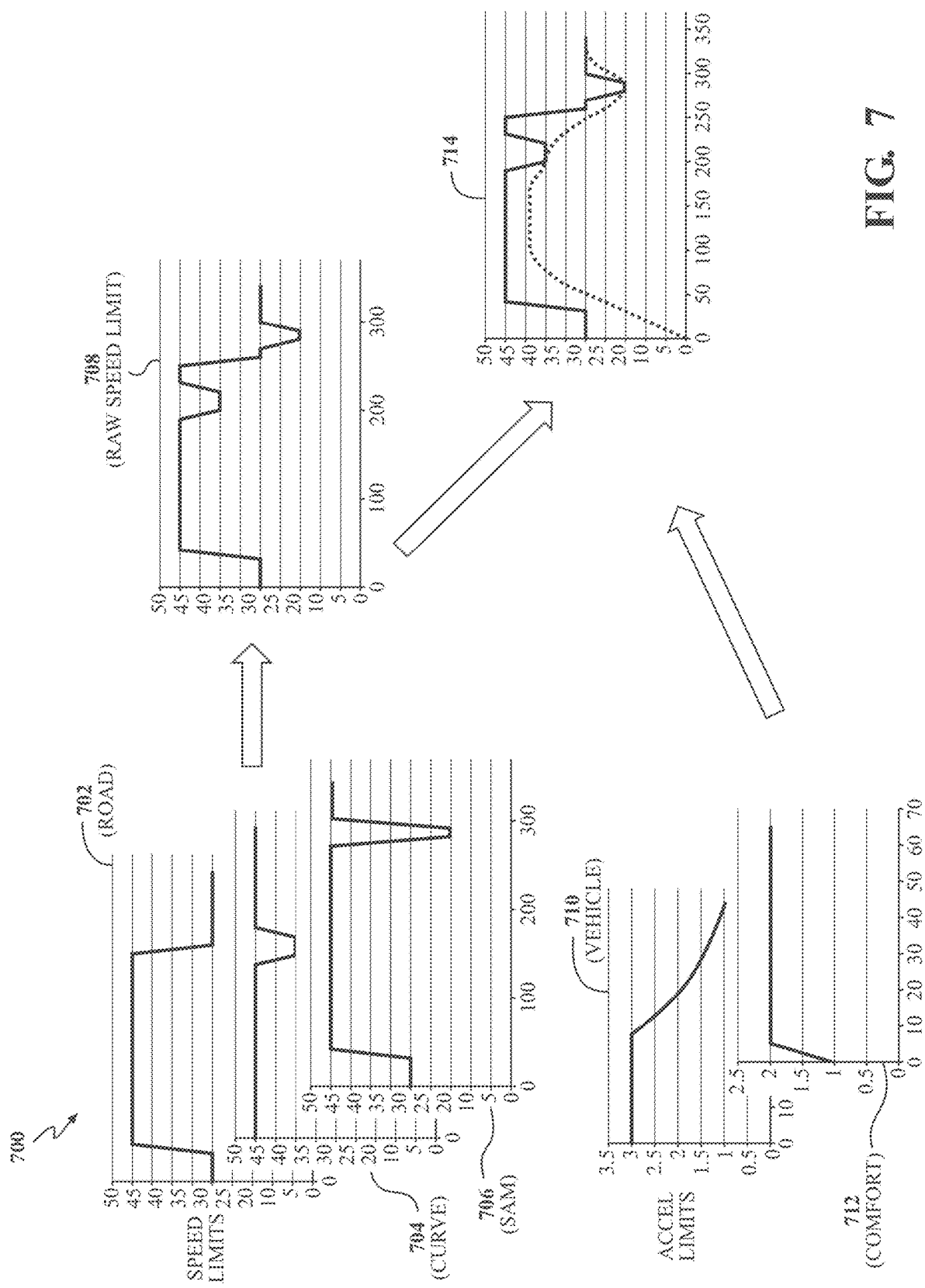
FIG. 7 is an example of determining a strategic speed plan according to implementations of this disclosure.

FIG. 7 is an example 700 of determining a strategic speed plan according to implementations of this disclosure. The example 700 illustrates examples of inputs that can be used by the strategic speed plan module 524 of FIG. 5 to determine a strategic speed plan 714. In some implementations, the strategic speed plan module 524 can use more, fewer, or other inputs to determine the strategic speed plan.

In the example 700, speed limits inputs and acceleration limits inputs can be used. The speed limits can include at least one of road speed limits 702, curvature speed limits 704, and seamless autonomous mobility (SAM) data 706. The acceleration limits can include vehicle acceleration limits 710 and comfort limits 712. The speed limits and/or the acceleration limits can include more, fewer, or other inputs.

The road speed limits 702 can be the road speed limits, such as those posted on speed limit signs (e.g., 20 MPH, 65 MPH, etc.). In an example, the road speed limits 702 can be obtained from an HD map. The curvature speed limits 704 can be data relating vehicle speed to a curvature of a turn, such as a turn along the coarse driveline of the AV. Alternatively, the curvature speed limits 704 can only provide road curvature information (e.g., the turning radius of a curve). The curvature speed limits 704 can be limits on the lateral acceleration of the AV. As such, the speed plan can include decreased AV speeds, consistent with the curvature speed limits 704, when the AV curves.

The SAM data 706 can be data gathered (such as in a cloud-based system) from vehicles (autonomous or otherwise). The data can enable vehicles (including AVs) to operate safely and smoothly on the road. In an example, the SAM data 706 can include vibration data collected from vehicles along a portion of a road. The vibration data can correlate vibration levels and speeds at different portions of the road. In an example, the vibration data may indicate, for a certain road location, an unacceptable level of vibration (for example, due to a speed bump at the portion of the road) when a vehicle is traveling above a certain speed. As such, to minimize the impact of the vibration, the AV is to be slowed down (below the certain speed) at the portion of the road. In an example, the SAM data 706 can be received by the AV from a central sever, such as the operations center 230, the server computing device 234, or some other network device. In an example, the SAM data 706 can be data accumulated from other vehicles within a certain time period (e.g., 1 minute, 10 minutes, 20 minutes, etc.) of the autonomous vehicle arriving at that location. In an example, the AV can pull the SAM data 706. In another example, the SAM data 706 can be pushed to the AV based on the AV reporting its location to a server that provides the SAM data 706.

The road speed limits 702, the curvature speed limits 704, and the SAM data 706 can be combined to provide raw speed limits 708. In an example, for each location of certain locations along the coarse driveline (e.g., every 5 meters, 10 meters, etc.), the minimum of the speed of the road speed limits 702 at that location, the speed of the curvature speed limits 704 at that location, and the speed of the SAM data 706 at that location is used as the speed of the raw speed limits 708 at that location.

The vehicle acceleration limits 710 can be AV acceleration limits that are due to the torque and power of the AV. The comfort limits 712 includes human comfort limits regarding acceleration, such as: How fast do the occupants of the AV want to the AV to accelerate?

The strategic speed plan module 524 of the reference-trajectory generation layer 504 can combine the raw speed limits 708, the vehicle acceleration limits 710, and the comfort limits 712 to provide the strategic speed plan 714, which is a smooth speed plan.

As mentioned above, at a location along the coarse driveline, the minimum of the road speed limits 702, the curvature speed limits 704, and the seamless autonomous mobility SAM data 706 can be used as the speed limit of the AV. The vehicle acceleration limits 710 and the comfort limits 712 relate acceleration to speed. As such, and in an example, the vehicle acceleration limits 710 and the comfort limits 712 can be combined by finding the minimum of the two maximum curves (comfort, speed). As such, at low speed, comfort can limit the maximum acceleration of the AV; whereas at high speed, the acceleration limits (e.g., the power) of the AV can limit the acceleration of the AV. A speed profile can be generated by solving for the fastest speed profile along the coarse driveline that satisfies the constraints on speed (speed limit at any given location along the driveline) and acceleration (acceleration limit at any given speed).

Inputs other than those described above can also be used to calculate the strategic speed plan 714. For example, one or more of road mu, minimum cruise times, neighborhood type, or other inputs can be used. Road mu relates to the road slipperiness, such as due to ice, rain, slope, etc.

A minimum cruise time relates to the minimum length of time that the speed of the AV can be set to a constant speed. For example, assume that a segment of a road is 500 meters long and that the speed limit on that segment is 45 MPH. Additionally, assume that, given a motion model of the AV, 250 meters are required for the AV to reach the speed limit of 45 MPH from a stopped position, and 250 meters are required for the AV to be stopped given a current speed of 45 MPH. If the AV were at a stopped position at the beginning of the road segment and the AV is to be stopped again at the end of the road segment, then as soon as the AV reaches the speed limit of 45 MPH, the AV would have to start decelerating. Such speed profile may not be desirable and/or natural for occupants of the AV. As such, a minimum cruise time can indicate, for example, that a speed must be maintained for the minimum cruise time (e.g., 3 seconds) before the AV can start decelerating (or accelerating). As such, a more natural speed profile can be provided.

The neighborhood type can be used to model normal human driving behaviors, which may depend on the type of neighborhood that the AV is traversing through. For example, a human driver may drive below the posted speed limit in a residential neighborhood (e.g., where kids may be observed playing on the streets) and may drive at least at the posted limit in an industrial neighborhood, even though both neighborhoods may have the same posted speed limit.

Figure 8:
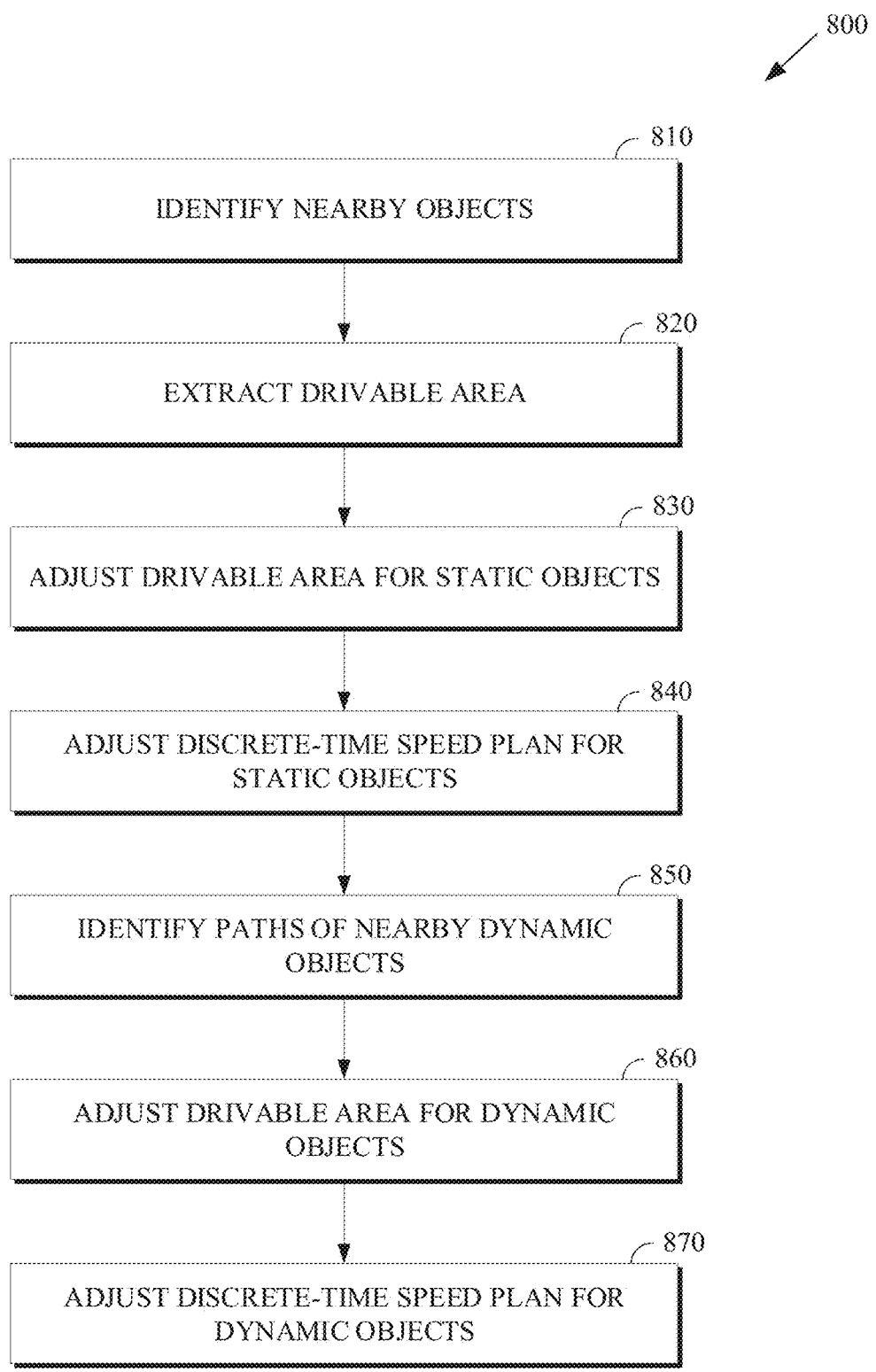
FIG. 8 is a flowchart diagram of a process for determining a drivable area and a discrete-time speed plan in accordance with an implementation of this disclosure.

FIG. 8 is a flowchart diagram of a process 800 for determining a drivable area and a discrete-time speed plan in accordance with an implementation of this disclosure. Some or all aspects of the process 800 can be implemented in a vehicle, including the vehicle 100 shown in FIG. 1 and the vehicle 202 shown in FIG. 2, or in a computing apparatus, including the controller apparatus 232 shown in FIG. 2. In an implementation, some or all aspects of the process 800 can be implemented in a system combining some or all of the features described in this disclosure. For example, the process 800 can be utilized by the object avoidance layer 506 of FIG. 5.

Figure 9:
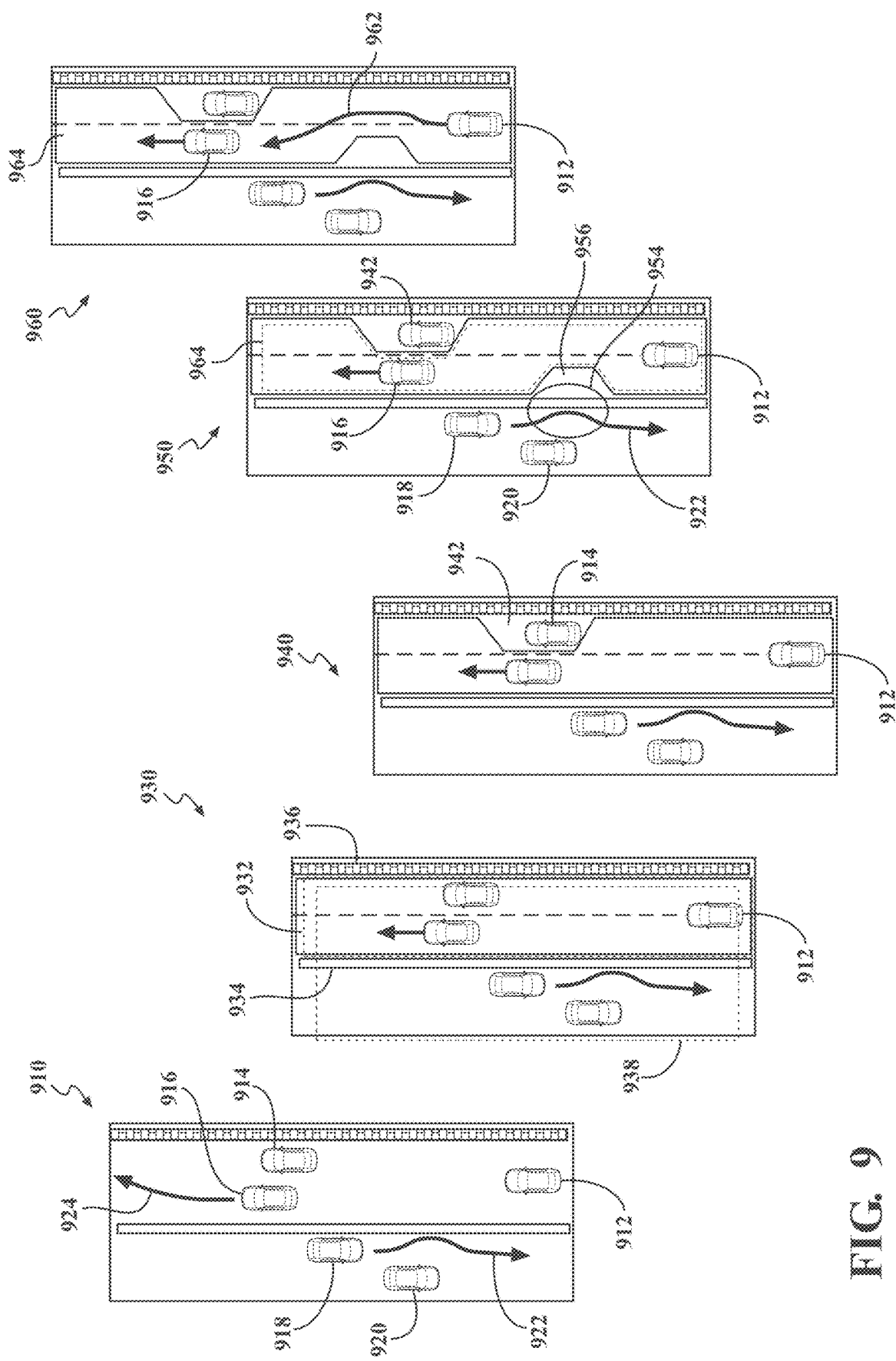
FIG. 9 is an illustration of determining a drivable area and a discrete-time speed plan according to implementations of this disclosure.

The process 800 is explained with reference to FIG. 9. FIG. 9 is an illustration of determining a drivable area and a discrete-time speed plan according to implementations of this disclosure. FIG. 9 illustrates generating a drivable area (lateral constraints) and a constrained speed profile, which can be represented in discrete-time. The drivable area can be, for example, the area of a vehicle transportation network where the autonomous vehicle can be driven. Initially (e.g., at the beginning of the process 800), the drivable area may include areas where the AV cannot be predicted to be safely driven. The process 800 adjusts (e.g., cuts out of) the drivable area those areas where the AV cannot be predicted to be safely driven. The process 800 results in an adjusted drivable area.

At operation 810, the process 800 identifies nearby objects to the AV. In an example, the nearby objects can be at least some of the external objects maintained by the world model module 402. In an example, the nearby objects can be all objects maintained by the world model module 402. In another example, the nearby objects can be a subset of the objects maintained by the world model module 402. For example, the nearby objects can be objects within a predetermined distance from the AV, objects within a predicted arrival time of the AV, or objects that meet other criteria for identifying a subset of the objects. For example, and referring to a view 910 of FIG. 9, for an AV 912, a static vehicle 920, a static vehicle 914, a dynamic oncoming vehicle 918, and a dynamic vehicle 916 are identified. In an implementation, the operation 810 identifies dots (i.e., boundary points) and/or groups of dots representing objects, as described with respect to FIGS. 10-12.

At operation 820, the process 800 extracts a drivable area. The drivable area can be the area where the AV 912 can be (e.g., legally and/or physically) driven. In an example, the drivable area can be extracted from the coarse driveline. For example, the drivable area can be a predefined distance from the AV along the coarse driveline (e.g., in the longitudinal direction). A drivable area 932 in a view 930 of FIG. 9 is an example of the drivable area. In an example, the drivable area 932 can be the area bounded (i.e., in the lateral direction) by a median 934 and a shoulder 936. In an example, the drivable area can be extracted from an HD map based on the current location of the AV 912. The drivable area can be bounded by the left and right boundaries of a lane (or a road, or some other region) in which the AV 912 is located. In an example, the drivable area can span the centerline of the road. That is, the opposite-direction traffic lane can be included in the drivable area. As such, in the view 930, if the median 934 were not present, then the drivable area could be a drivable area 938.

The process 800 proceeds to remove from the drivable area portions where the AV cannot be (e.g., safely) driven. The term "adjusted drivable area" is used herein to refer to the drivable area after areas have been removed from the drivable area to account for static and/or dynamic objects as described herein. If no static and/or dynamic objects interfere with the trajectory of the AV, then the adjusted drivable area is the same as the drivable area.

At operation 830, the process 800 adjusts the drivable area for static objects. That is, the process 800 removes (e.g., cuts out, etc.) from the drivable area those portions of the drivable area where static objects are located. This is so because the AV is to be controlled to navigate (e.g., drive) around the static objects. A view 940 of FIG. 9 illustrates cutting out a portion of the drivable area. To avoid the static vehicle 914, the process 800 cuts out a cutout 942 of the drivable area 932. The size of the cut-out area can be determined based on an estimate of the size of the static object. The size of the cut-out area can include a clearance area so that the AV does not drive too close to the static object.

Examples of adjusting the drivable area for static objects are further described below with respect to FIGS. 10-12. An example of a process for adjusting the drivable area for static objects is described below with respect to FIG. 13.

At operation 840, the process 800 adjusts the discrete-time speed plan for static objects. For example, in the absence of obstacles or other road users, the discrete-time speed plan follows the strategic speed profile. For example, when the adjusted drivable area contains a narrow pass, accounting for static objects, instead of following (i.e., using the speed of) the strategic profile verbatim (i.e., as set in the strategic profile), the process 800 adjusts the discrete-time speed plan to reduce the speed of the AV to a comfortable speed. For example, when the adjusted drivable area, accounting for static objects, contains a static blockage, the process 800 adjusts the discrete-time speed plan such that the AV comes to a stop a prescribed distance before the static blockage.

At operation 850, the process 800 identifies (e.g., predicts, calculates, generates, receives, or otherwise identifies) a respective path for each of the nearby dynamic objects. In an example, the predictions of the respective paths (i.e., trajectories) of at least some of the dynamic objects can be maintained in a world model, such as the world model module 402 of FIG. 4. As such, the process 800 can receive (e.g., request, read, or otherwise receive) the respective paths from the world model.

For example, the process 800 predicts (e.g., receives a prediction, or otherwise predicts) that the dynamic oncoming vehicle 918 is to follow a path 922 to get around the static vehicle 920, and that the dynamic vehicle 916 is to follow a path 924 after passing the static vehicle 914. In an implementation, the operation 820 uses an instance (i.e., an execution) of the process 800 to identify the path of a dynamic object. In an example, when predicting a path for a dynamic object, the process 800 excludes the AV from the list of nearby objects of the dynamic object.

In an example, predicting a path for a dynamic object can be based on respective speeds of other dynamic objects and an estimation of the right of way amongst the dynamic objects. In an example of the estimation of the right of way, if a second vehicle is following (i.e., is behind) a first vehicle in a lane, then the first vehicle is simulated (i.e., a path is predicted for the first vehicle) in the presence of the second vehicle; but the second vehicle is simulated without the presence of the first vehicle.

As such, an instance of the trajectory planner 500 can be dedicated to the autonomous vehicle that includes the trajectory planner 500, and one or more other instances of the trajectory planner 500 can be used by the autonomous vehicle to predict the trajectories of dynamic objects that are visible to the autonomous vehicle (e.g., the dynamic objects that are maintained by the world model module 402).

At operation 860, the process 800 adjusts the drivable area for dynamic objects. That is, the process 800 cuts out portions of the drivable area based on the respective predicted trajectories of each of the dynamic objects. The process 800 uses timing information regarding locations of each of the dynamic objects to cut out additional portions of the drivable area. The cutouts in the drivable area for dynamic objects are generated by comparing the timing of the predictions for the dynamic objects compared to the timing generated by the discrete-time speed plan, which now accounts for static objects (as described with respect to the operation 840). That is, the process 800 can predict for a dynamic object, and, based on the predicted trajectory of the dynamic object, where the dynamic object will be located at different discrete points in time relative to the locations of the AV at the same discrete points in time. Examples of adjusting the drivable area for dynamic objects are further described below with respect to FIGS. 14-16. An example of a process for adjusting the drivable area for dynamic objects is described below with respect to FIG. 18.

The locations of a dynamic object are matched to the predicted locations of the AV to determine cutout portions. As mentioned above, the predicted locations of the AV are based on the discrete-time speed plan as adjusted at the operation 840 (i.e., to account for static objects). A cutout may not correspond to a current location of a dynamic object. Rather, the cutout can be based on locations where the AV and the dynamic object are predicted to meet. If the predicted trajectory of a dynamic object does not interfere with the drivable area, then no portions of the drivable area are cut out for the dynamic object. If the predicted trajectory of a dynamic object does interfere with the drivable area, then one or more portions of the drivable area are cut out to avoid a potential collision with the dynamic object.

A view 950 of FIG. 9 illustrates adjusting (i.e., the operation 860) the drivable area for dynamic objects. The process 800 predicts that the dynamic oncoming vehicle 918 will follow the path 922 in order to get around (e.g., avoid) the static vehicle 920. The process 800 further predicts that if the AV 912 continues along its current trajectory, then the AV 912 and the dynamic oncoming vehicle 918 would meet around a location 954. As such, the process 800 cuts out a cutout 956 from the drivable area 932.

At operation 870, the process 800 adjusts the discrete-time speed plan for dynamic objects. When the adjusted drivable area (accounting for both static and dynamic objects at this point) contains a dynamic object travelling in the same direction as the AV, the dynamic object is labelled as a longitudinal constraint and the discrete-time speed plan is adjusted such that the AV follows the blocking object at a comfortable speed and distance.

A view 960 of FIG. 9 illustrates adjusting (i.e., the operation 870) the discrete-time speed plan for dynamic objects. The process 800 determines that dynamic vehicle 916 is in the adjusted drivable area of the AV 912 and that it is not safe for the AV 912 to pass the dynamic vehicle 916, because, for example, no safe gap exists between the edge of the dynamic vehicle 916 and the boundaries of the adjusted drivable area. As such the AV 912 is to follow behind the dynamic vehicle 916. If the dynamic vehicle 916 is moving slower than the strategic speed plan, then the discrete-time speed plan is adjusted such that the AV follows the dynamic vehicle 916 at a comfortable speed and distance. The view 960 also illustrates that a trajectory 962 for the AV 912 based, for example, on the cutout 956.

In another example, assume that the dynamic vehicle 916 itself is determined to have a longitudinal constraint. For example, a second vehicle (not shown) may be in front of the dynamic vehicle 916. As such, the second vehicle can itself also be considered another longitudinal constraint for the AV 912. As such, a first discrete-time speed plan (e.g., a first deceleration plan) can be determined for the AV 912 based on the dynamic vehicle 916, and a second discrete-time speed plan (e.g., a second deceleration plan) can be determined for the AV 912. The one of the first discrete-time speed plan and the second discrete-time speed plan corresponding to the higher deceleration can be selected as the discrete-time speed plan for the AV. More generally, objects that are determined to be constraints for constraints of the AV can themselves be treated as constraints for the AV.

An adjusted drivable area 964 illustrates the adjusted drivable area that results from the operations of the process 800.

Figure 10:
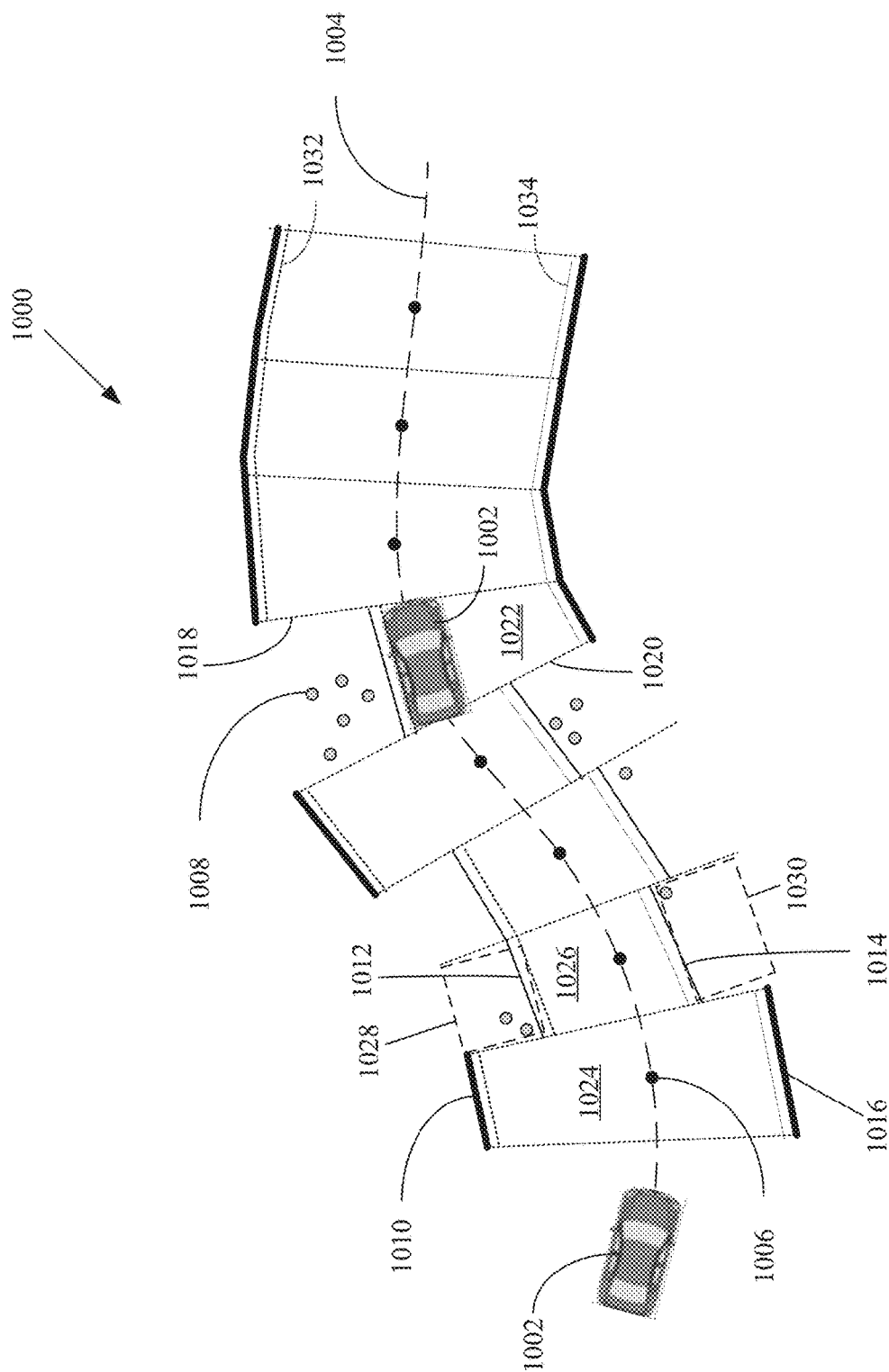

FIGS. 10-12 are examples 1000, 1100, 1200 of adjusting a drivable area for static objects according to implementations of this disclosure. The examples 1000, 1100, 1200 illustrate determining static boundaries for a drivable area. That is, FIGS. 10-12 are examples of adjusting a drivable area for static objects as described with respect to the operation 830 of FIG. 8. That is, the examples 1000, 1100, and 1200 illustrate determining, along the coarse driveline of an AV, where the AV can be driven with reference to static objects.

In the example 1000 of FIG. 10, the coarse driveline of an AV 1002 is represented by a coarse driveline 1004. The coarse driveline 1004 is also referred to herein as a coarse driveline. The coarse driveline 1004 can be determined (e.g., calculated, generated, etc.) as described with respect to the reference-trajectory generation layer 504 of FIG. 5. The example 1000 illustrates an example of the operation 830 for determining the lateral boundaries of the drivable area of the AV 1002. That is, the example 1000 illustrates determining, for example, left and right boundaries of the drivable area of the AV 1002 to account for static objects.

As mentioned above, a drivable area (i.e., a non-adjusted, non-cutout drivable area, such as the drivable area 932 of FIG. 9) is determined. In an example, the drivable area can have a default width. The default width can be based on the current lane or the current road of the AV. The default width can be defined by the predefined width (e.g., 8 meters). As such, the drivable area can cross a centerline of the road. It is noted that the default drivable area can be limited by barriers (e.g., concrete barriers) that may be in the median. Such barriers are static objects and limit the drivable area.

The drivable area of the AV 1002 is divided into bins. Each bin has a center point, such as a center point 1006. The center points can be equally spaced. For example, the center points can be approximately two meters apart. The left and right boundary of each bin can be related to the heading of the coarse driveline 1004. A right boundary 1018 and a left boundary 1020 illustrate the boundaries of a bin 1022.

Boundary points, such as a boundary point 1008, originate from static objects. For example, the boundary points can be derived from data from a LiDAR sensor, a laser pointer, a radar, or any other sensor, such as the sensor 126 of FIG. 1. The boundary points can represent (x, y) coordinates that are occupied or are otherwise off-limits to the AV. Each of the boundary points corresponding to static objects is assigned to the bin that contains the boundary point. For example, the boundary point 1008 is assigned to the bin 1022. Neighboring boundary points (such as within a bin or across bin boundaries) may correspond to one or more static objects.

The right and left boundaries of each bin can be defined (i.e., set) based on the boundary points assigned to the bin. For example, as a bin 1024 includes no boundary points, a right boundary 1016 and a left boundary 1010 of the bin 1024 are aligned with the (non-adjusted) drivable area. On the other hand, a left boundary 1012 of a bin 1026 is not aligned with the drivable area because a cutout 1028 is excluded from the drivable area; and a right boundary 1014 of the bin 1026 is not aligned with the drivable area because a cutout 1030 is excluded from the drivable area.

The boundaries of the adjusted drivable area are represented by a segmented line 1032, which forms the left boundary of the adjusted drivable area, and a segmented line 1034, which forms the right boundary of the adjusted drivable area. For clarity of illustration, the segmented lines 1032, 1034 are shown as being offset from the real boundaries. That is, for example, whereas the segmented line 1032 overlaps the boundary 1010 and the boundary 1012, for clarity, the segmented line 1032 is shown as being slightly offset from the boundary 1010 and the boundary 1012. The segmented line 1032 is the computed left boundary of the adjusted drivable area. The segmented line 1034 is the computed right boundary of the adjusted drivable area.

The computed right and left boundaries are used to determine whether the AV 1002 can continue along the coarse driveline 1004. The AV 1002 can be advanced (virtually or computationally, not physically) to the center of each bin to determine whether the width of the bin (given the computer boundaries) is such that the AV 1002 can safely fit through the bin. For example, with respect to the bin 1022, the AV 1002 cannot safely clear the left boundary (i.e., the left calculated boundary) of the bin. As such, and as further described below, the trajectory of the AV 1002 is to be altered. For example, the trajectory of the AV 1002 may not need to be adjusted, as the AV 1002 may need to be stopped, or the trajectory of the AV 1002 can be altered in other ways.

FIG. 11 illustrates an example 1100 of determining static boundaries and identifying a blockage that is accounted for when adjusting the discrete-time speed plan in accordance with implementations of this disclosure. In the example 1100, a coarse driveline 1103 is the coarse driveline of an AV 1102. The default drivable area of the AV 1102 is defined by a left boundary 1104 and a right boundary 1106. In the example 1100, a left lane boundary 1108 and a right lane boundary 1110 of the lane that includes the AV 1102 are shown. In the example 1100, the drivable area is limited to the lane (i.e., the lane bounded by the left lane boundary 1108 and the right lane boundary 1110) of the AV 1102. As such, the left and right boundaries of the lane are adjusted for static objects.

The left boundary 1104 and the right boundary 1106 can define the maximum possible drivable area (i.e., maximum boundaries). However, as it may be preferable to keep the AV 1102 within its lane, the left lane boundary 1108 and the right lane boundary 1110 define the boundaries of the drivable area. In an example, if the AV 1102 cannot be safely driven within its own lane (e.g., between the left lane boundary 1108 and the right lane boundary 1110), then it can be evaluated whether the AV 1102 can be driven outside the lane boundaries but within the maximum boundaries. Extending the drivable area can be referred to as "extended drivable area checking."

The right lane boundary 1110 includes a portion 1112. The portion 1112 is shown as a dashed line because, as further described below, this portion of the drivable area is to be adjusted.

As described with respect to FIG. 10, the drivable area of the AV 1102 is divided into bins, and boundary points corresponding to static objects are assigned to respective bins, such as bins 1116, 1118. As the boundary points of the bins 1116, 1118 appear to correspond to a large, rectangular object, the object may be classified (for example, by the world model module 402 of FIG. 4) as a "truck."

Boundaries corresponding to (i.e., defined based on) objects (static or dynamic objects) can be referred to as hard boundaries. A hard boundary is such that, if the planned trajectory were to cross the hard boundary, a collision with another object may be likely. On the other hand, lane and/or road markings can be referred to as soft boundaries and represent lawful or logical boundaries. A soft boundary is such that, if the planned trajectory were to cross the soft boundary that is not also a hard boundary, the motion of the AV may be unlawful and/or not socially acceptable, but the AV may be safe. As shown in FIG. 11, for example, the left boundary 1104 (i.e., the left drivable area boundary) defines the left hard boundary and the left lane boundary 1108 defines the left soft boundary. The right hard boundary is comprised of the right boundary 1106 (i.e., the right drivable area boundary) and the boundary 1114; the right soft boundary is defined by the right lane boundary 1110 and the boundary 1114.

A detailed check can be performed to determine whether a path exists given a distance between the right and left hard boundaries of a bin. A distance 1120 between the boundary 1114 and the left lane boundary 1108 is determined to be too narrow for the AV 1102 to drive (i.e., fit) through. As such, a location 1122 corresponding to the bin 1116 is marked as a static blockage. As such, the AV 1102 cannot pass the object(s) represented by the boundary points of the bins 1116, 1118. Accordingly, the AV 1102 is to be stopped before the static blockage corresponding to the location 1122. Accordingly, the module 530 can adjust the discrete-time speed plan such that the AV comes to a stop before the static blockage.

In another example, instead of stopping due to the static blockage, the trajectory planner determines a trajectory through a gap 1124, such that the drivable area is extended, at least for the bins 1116 and 1118 across the left lane boundary 1108. For example, if the left lane boundary 1108 is the center of the road, the trajectory planner may determine that there are no oncoming dynamic objects and, therefore, it is safe to cross the lane boundary.

In another example, in a case that there is insufficient distance for the AV to stop before the static blockage, the discrete-time speed plan would only be capable of slowing the AV down and as such a trajectory can be determined such that the AV can cross the left soft boundary in order to avoid crossing the right hard boundary and hitting the static object. Thus, by maintaining an awareness of both the hard boundaries and soft boundaries, the trajectory planner can generate a trajectory that is lawful and socially acceptable driving under most conditions with a seamless transition to object avoidance maneuvers under emergency conditions.

In an example, the boundaries of a bin can be adjusted based on the status of the objects (e.g., groups of boundary points) within the bin. For example, the boundary points within a bin can be tracked over time. If it is determined that the group of boundary points within a bin is moving slightly (i.e., less than a threshold level of movement), then a greater level of clearance can be required. That is, the AV 1102 can be driven further away from the boundary points if the boundary points are moving. On the other hand, if the boundary points are stable (i.e., not moving), then the AV 1102 can be driven closer to the boundary points. As such, a boundary of the bin (e.g., the boundary 1114) can be adjusted over time depending on the level of movement of the boundary points within the bin.

In an example, if movement of the boundary points is detected at time t, then the boundary points are considered to be moving thereafter (i.e., at later times t+x), whether the boundary points continue to move or not.

Adjusting the bin boundary over time, based on the movement of boundary points within the bin, can be referred to as filtered lateral limits. "Filtered" in this context means that the lateral limits (e.g., the bin boundaries) can be changed over time.

FIG. 12 is another example, an example 1200, of determining static boundaries in accordance with implementations of this disclosure. In the example 1200, a coarse driveline 1203 is the coarse driveline of an AV 1202. The default drivable area of the AV 1202 is defined by a left lane boundary 1204 and a right lane boundary 1206. A cutout 1208 and a cutout 1210 are cut out of the drivable area. In this example, the cutout 1210 is in the middle of the drivable area.

Whether a boundary of a cut-out area extends to the boundary of the default drivable area can depend on the distance between the cut-out area and the boundary of the default drivable area. For example, if a distance corresponding to the gap 1216 between the right edge of the cutout 1210 and the right lane boundary 1206 is below a threshold distance, then the cutout 1210 can be defined by the area extending from a left boundary 1217 of the cutout 1210 to the right lane boundary 1206. In an example, the threshold distance can relate to a width of the AV 1202. For example, the threshold distance can be 1.5, 2.0, etc., times the width of the AV 1202. Similarly, a gap (e.g., a gap 1207) between a cluster (e.g., a cluster 1209) of boundary points of a bin and lane boundary (e.g., the right lane boundary 1206) is also determined. In the case of the gap 1207, since the gap 1207 is determined to be smaller than the threshold distance (such that the AV 1202 cannot pass through the gap), the cutout 1208 is extended to the right lane boundary 1206.

The trajectory planner of the AV 1202 may determine that a distance 1212 is such that the AV 1202 can pass through the gap corresponding to the distance 1212. As the cutout 1210 overlaps the coarse driveline 1203, the trajectory planner of the AV 1202 performs a detailed check to determine (e.g., find) a gap to the left or to the right of the cutout 1210 such that the AV 1202 can pass through the gap. If a gap is not found as a result of the detailed check, then the AV 1202 can be considered blocked and must be stopped.

In the example 1200, a gap 1214 and a gap 1216 are both such that the AV 1202 can pass through either of the gaps 1214, 1216. In an example, one of the gaps 1214, 1216 is selected randomly. In another example, the trajectory planner selects the gap 1214 (i.e., the gap to the left of the cutout 1210) since the trajectory planner already selected a leftward direction to pass the cutout 1208.

Given two possible paths with respect to a second object (e.g., a left path and a right path about the object), and given a first path (e.g., to the right or to the left) with respect to a first object, "multi-hypothesis tracking" refers to determining a second path (e.g., trajectory) with respect to the second object.

Figure 13:
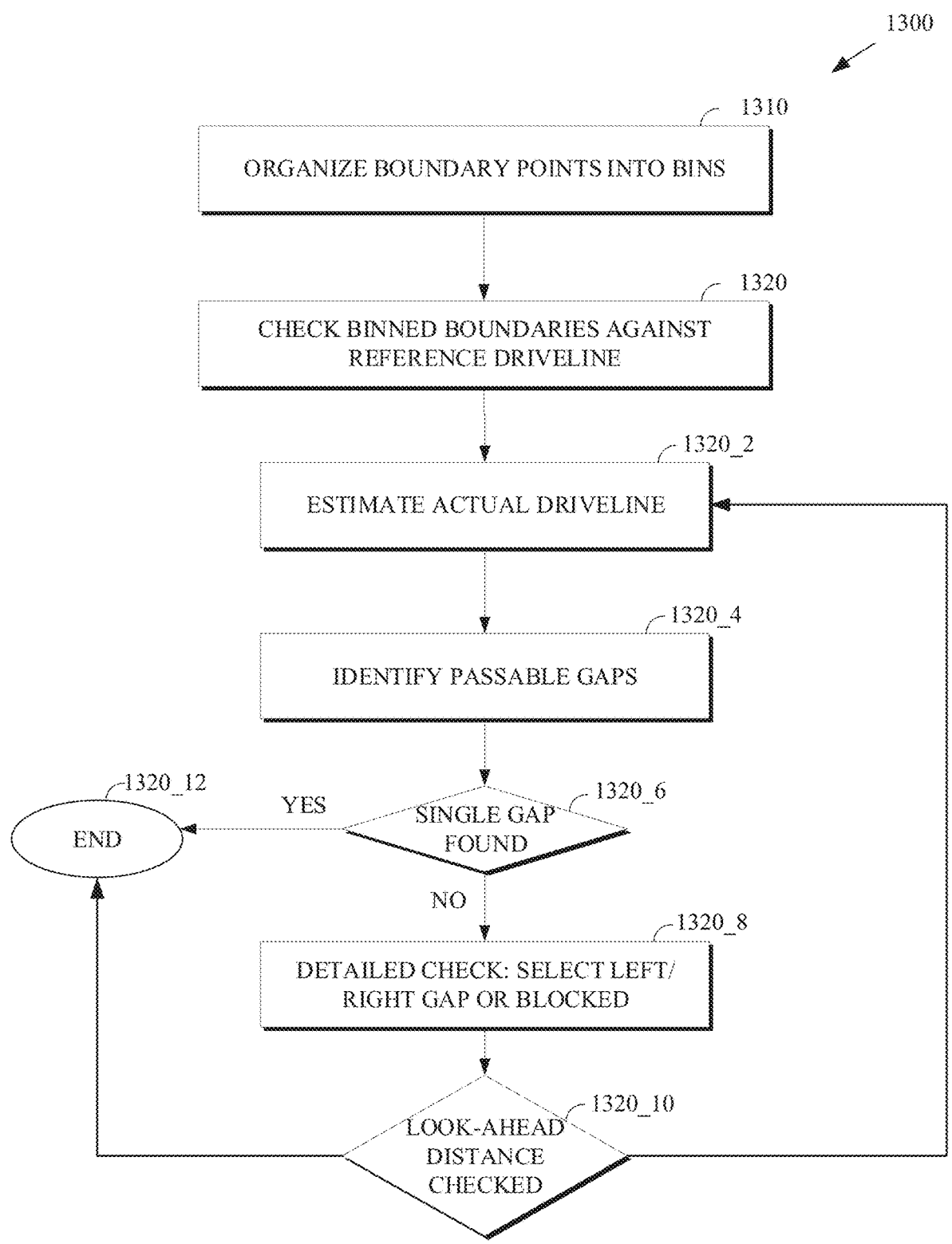
FIG. 13 is a flowchart diagram of a process for determining static boundaries in accordance with the present disclosure.

FIG. 13 is a flowchart diagram of a process 1300 for determining static boundaries in accordance with the present disclosure. Some or all of the operations of the process 1300 can be performed at the operation 830 of the process 800.

At operation 1310, the process 1300 organizes boundary points in bins along a coarse driveline. The boundary points are organized into bins along a coarse driveline as described with respect to FIGS. 10-12.

At operation 1320, the process 1300 checks the boundaries of the bins against the coarse driveline. The boundaries of the bins are checked against the coarse driveline to determine whether gaps exist such that the AV can pass through at least one of the gaps. In an example, the operation 1320 can be performed by operations 1320_2-1320_12. The operation 1320 adjusts the right and left boundaries of the bins of the drivable area based on the binned boundary points, such as described, for example, with respect to the left boundary 1012 and the right boundary 1014 of the bin 1026 of FIG. 10.

At operation 1320_2, the process 1300 estimates an actual driveline. For example, as described with respect to the cutout 1208, the process 1300 determines an actual driveline that is to the left of the cutout 1208.

At operation 1320_4, the process 1300 identifies the passable gaps. That is the process 1300 identifies the number of passable gaps. For example, given the right and left boundaries of the bin 1116 of FIG. 11, the process 1300 determines whether the AV 1102 can pass though the gap defined by the distance 1120. If so, then one gap is identified. Similarly, the process 1300 determines whether the AV 1202 can pass through the gap defined by the distance 1212 of FIG. 12.

At operation 1320_6, if a single (i.e., one) gap is identified, the process 1300 terminates at 1320_12. That is, a trajectory is allowed through the gap. If more than one gap are identified at operation 1320_4, the process 1300 proceeds to operation 1320_8. For example, with respect to the AV 1202 and the cutout 1210, the process 1300 identifies two gaps, namely a gap to the right and a gap to the left of the cutout 1210.

At operation 1320_8, the process 1300 performs a detailed check to determine whether other gaps are available, such as described with respect to the gaps 1214, 1216 of FIG. 12. For example, if the gap 1214 is determined to be too small for the AV 1202 to pass to the left of the cutout 1210, then the process 1300 can test whether the AV 1202 can pass through the gap 1216. At operation 1320_8, the process 1300 selects either to pass left or right, and, if neither is possible, the process 1300 determines that a static blockage exists.

At operation 1320_10, if a look-ahead distance is completely checked, the process 1300 terminates at the operation 1320_12; otherwise the process 1300 returns to the operation 1320_2 to check for additional obstacles.

The look-ahead distance can vary with the speed of the AV. For example, depending on the speed of the AV, the look-ahead distance can be varied in order to reduce computation time while still guaranteeing that, if either a blockage or a lateral constraint ahead are detected, sufficient time is available to either stop or comfortably (e.g., safely) steer the AV. For example, if four seconds of look-ahead time are required, then if the AV is travelling at 12 meters per second, the appropriate look-ahead distance would be 48 meters. If the AV were travelling at 30 meters per second (e.g., when traveling on a highway), the appropriate distance would be 120 meters.

Referring again to FIG. 5, the discrete-time speed plan module 528 can generate a target speed and acceleration from the strategic speed plan determined by the reference-trajectory generation layer 504 (and more specifically, by the strategic speed plan module 524). The discrete-time speed plan module 528 can generate the target speed and acceleration from (e.g., based on) longitudinal constraints. In an example, the longitudinal constraints can include stoplines (described below), virtual stoplines (described below), static obstacles (i.e., static objects), and/or dynamic obstacles (i.e., dynamic objects). The discrete-time speed plan module 528 iteratively computes the target speed and acceleration. The target speed and acceleration are calculated for a look-ahead time (i.e., a future time horizon). In an example, the look-ahead time can be 6 seconds.

A stopline represents a line where the AV is required by law to stop before proceeding. In an example, a stopline may be marked by paint on the road. In another example, a stopline may be inferred based on intersection structures and stop sign locations. A virtual stopline can be used by the AV to represent a critical location where the AV is expected, but is not required by law, to stop to check crossing information. For example, on left turns, virtual stoplines can be used in the middle of intersections to cause the AV to stop and yield to crossing traffic.

The discrete-time speed plan module 528 computes a respective target speed for longitudinal constraints (i.e., static or dynamic objects that are in the longitudinal direction of the AV) and/or a respective target distance for longitudinal constraints.

The discrete-time speed plan module 528 can set (i.e., select, determine, or otherwise set) a tracking mode for at least some of the static and/or dynamic objects. For example, the tracking mode can be one of "close gap," "maintain gap," "open gap," "brake," or "follow." For example, with respect to the dynamic vehicle 916 of FIG. 9, the discrete-time speed plan module 528 may determine a tracking mode of "close gap." For example, with respect to the objects of the bin 1116 of FIG. 11, the tracking mode can be determined to be "brake." The available tracking modes can include fewer, more, or other tracking modes. The tracking mode can be used to select sets of tuning parameters used by the discrete-time speed plan module 528. The tuning parameters can include target acceleration, hysteresis parameters, and other tuning parameters.

An example is now provided to illustrate the operation of the discrete-time speed plan module 528. If no longitudinal constraints are found, then the discrete-time speed plan module 528 can determine that the AV can be operated based on the strategic speed plan (as determined by the reference-trajectory generation layer 504). On the other hand, if a longitudinal constraint is found (such as with respect to the objects of the bin 1116 of FIG. 11), where the tracking mode is determined to be "brake," the discrete-time speed plan module 528 calculates a speed profile to stop the AV. That is, a deceleration speed profile is calculated to bring the AV to a stop.

In an example, the speed profile uses the current speed of the AV and the distance to the longitudinal constraint to calculate a deceleration speed profile to stop the AV before the longitudinal constraint.

Figure 14:
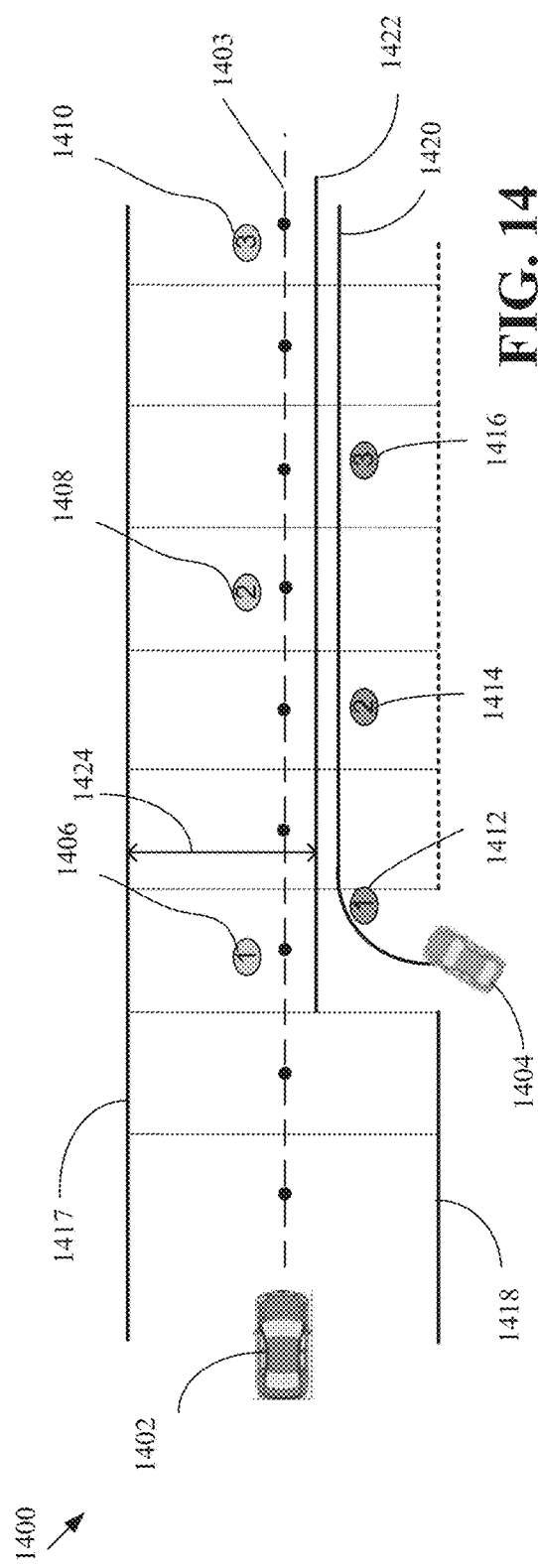
FIGS. 14-16 are examples of determining dynamic boundaries according to implementations of this disclosure.
Figure 15:
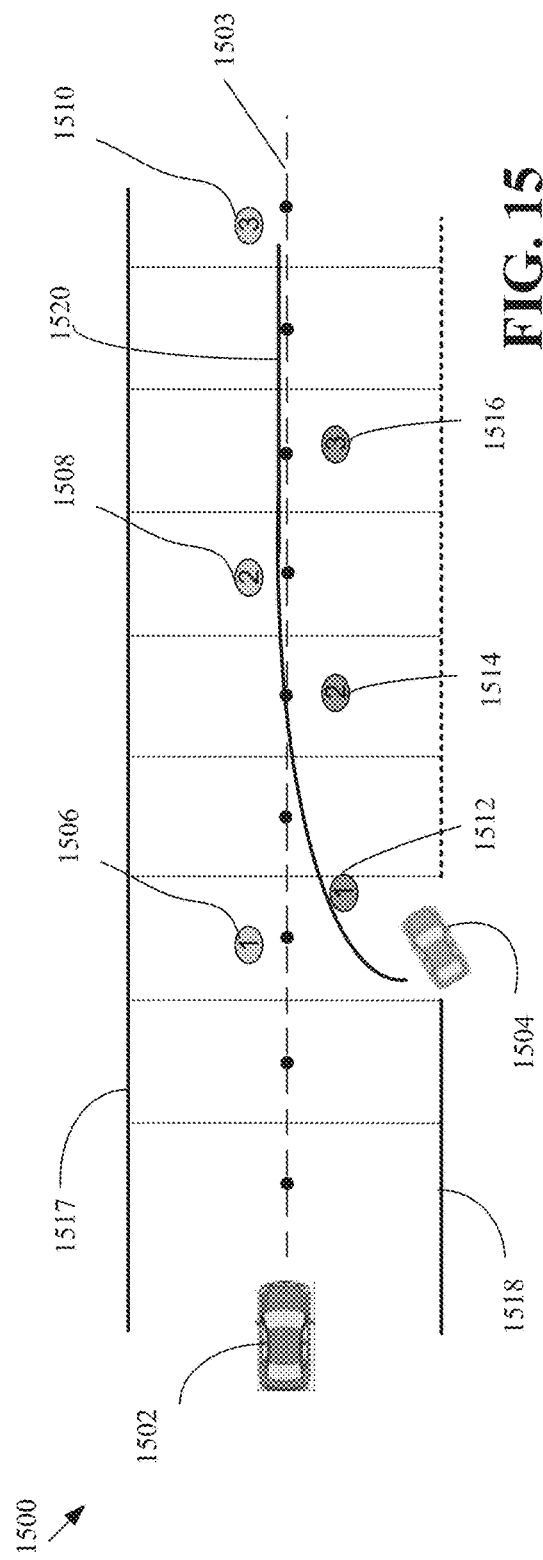
Figure 16:
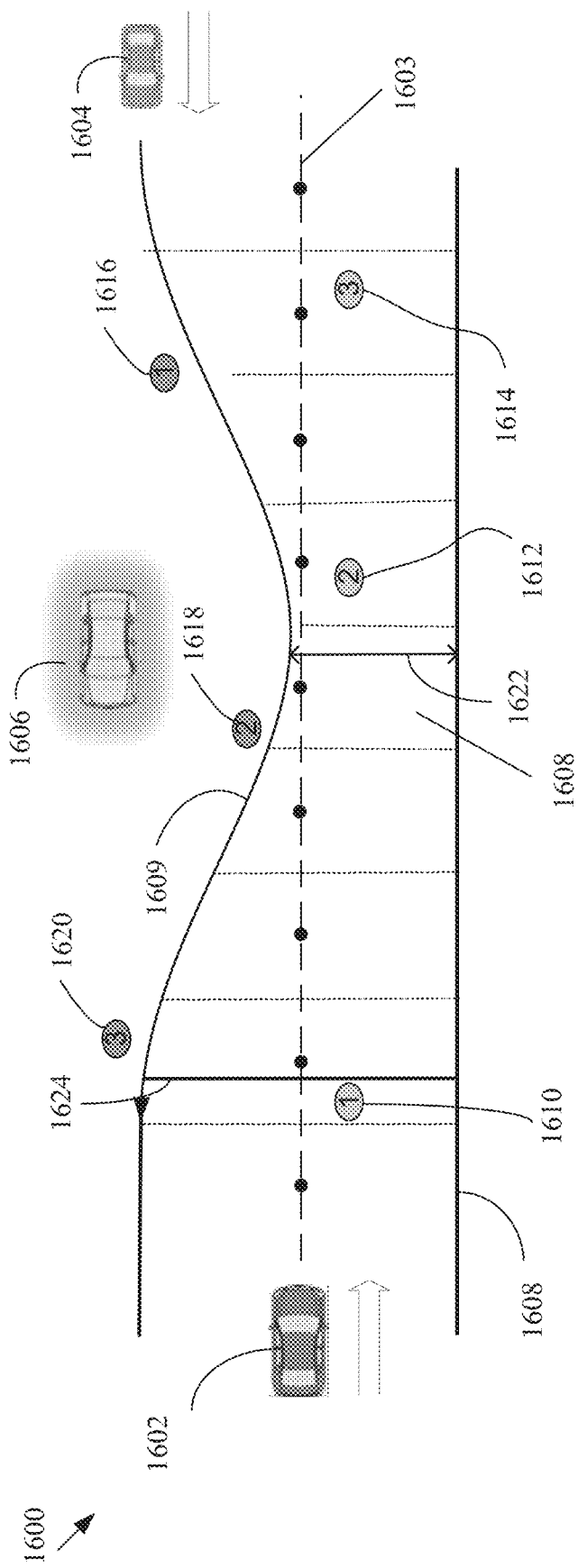

FIGS. 14-16 are examples 1400, 1500, and 1600 of determining dynamic boundaries according to implementations of this disclosure. That is, FIGS. 14-16 are examples of adjusting a drivable area for dynamic objects as described with respect to the operation 850 of FIG. 8. That is, the examples 1400, 1500, and 1600 illustrate determining, along the coarse driveline of an AV, where the AV can be driven with reference to dynamic objects.

Each dynamic object can be classified into at least one of several available classes. In an example, the available classes include "lateral constraint," "longitudinal constraint," "oncoming, lateral constraint," and "oncoming, longitudinal constraint." Other classes can be available.

A dynamic object that is classified as a "lateral constraint" affects the AV's path but not speed. For example, the dynamic object may be moving in a direction generally orthogonal to that of the AV. That is, the dynamic object may be moving, from either the left or the right side of the AV, without impeding (i.e., obstructing) the path of the AV. As such, a trajectory planner, such as the trajectory planner 500 of FIG. 5, may need to adjust the trajectory of the AV to avoid the dynamic object. That is, the AV may need to move over (left or right) to avoid a collision with the dynamic object.

A dynamic object that is classified as a "longitudinal constraint" affects the speed but not the path of the AV. For example, the dynamic object may be moving generally in the same direction as the AV and may be in the path of the AV. That is, the longitudinal constraint object impedes (i.e., obstructs) the path of the AV at the current speed of the AV. As such, the trajectory planner of the AV may not need to adjust the trajectory of the AV but may need to adjust (such as, by the discrete-time speed plan module 528 of the trajectory planner) the speed of the AV to avoid a collision with the dynamic object. An example of a longitudinal constraint is the dynamic vehicle 916 of FIG. 9. That is, a longitudinal constraint object can be a vehicle that is in front of the AV and that is moving slower than the AV. As such, the AV is to be slowed down to avoid rear-ending the dynamic object.

An oncoming, lateral constraint object is similar to a lateral constraint object, with the difference being that the oncoming, lateral constraint object moves in the direction opposite that of the AV. The dynamic oncoming vehicle 918 of FIG. 9 is an example of an oncoming, lateral constraint object. In such a case, the AV may be moved (such as described with respect to the trajectory 962 of FIG. 9) without having to slow down.

An oncoming, longitudinal constraint object is similar to a longitudinal constraint object, with the difference being that the oncoming, longitudinal constraint object moves in the direction opposite that of the AV. In such a case, and as further described with respect to FIG. 16, the AV is stopped.

As such, a module 532 of the object avoidance layer 506 of FIG. 5 constrains (i.e., applies constraints to) the discrete speed plan of the AV based on the classifications of the dynamic object. For example, an oncoming dynamic object that blocks the trajectory of the AV can be treated as an in-lane (i.e., in the same lane as the AV) static object. For example, a lead dynamic object (i.e., a dynamic object that is in front of and moving in the same direction as the AV) can be treated as a longitudinal constraint in the discrete-time speed plan. For example, a dynamic object that is near the planned driveline of the AV can be treated as a lateral constraint.

In the example 1400 of FIG. 14, an AV 1402 is moving along a coarse driveline 1403. No static objects are found. Accordingly, a left boundary 1417 and a right boundary 1418, which are the computed boundaries of the drivable area adjusting for static objects as described with respect to FIGS. 10-12, coincide with the boundaries of the drivable area.

A vehicle 1404 is predicted to be moving from the right shoulder of the road (or from the lane to the right of the lane that includes the AV 1402) into the path of the AV along a path 1420. As such, the vehicle 1404 is initially classified as a lateral constraint. The predicted path of the vehicle 1404 is a path 1420, which is near (e.g., adjacent to) the coarse driveline 1403. As such, the module 532 continues to classify the vehicle 1404 as a lateral constraint.

The module 532 can determine (e.g., predict) the locations of the AV 1402 at different discrete points in time. That is, the module 532 determines locations of arrivals, along the coarse driveline 1403, at different time points. For example, at time t (e.g., in one second), the AV 1402 is predicted to be at a location 1406; at time t+1 (e.g., in two seconds), the AV 1402 is predicted to be at a location 1408; and at time t+2 (e.g., in three seconds), the AV 1402 is predicted to be at a location 1410.

While the locations at 3 seconds into the future (i.e., a time window of 3 seconds) are shown with respect to the examples 1400, 1500, and 1600, more or fewer locations can be determined (e.g., predicted, calculated, etc.) given a predefined time window. In an example, the time window is six seconds. The frequency of predicted locations can also vary. In an example, the time window can be six seconds, and a location can be determined at every half a second. As such, 12 locations are predicted.

As described above, a second instance of the trajectory planner may be tracking (e.g., predicting the trajectory of) the vehicle 1404. As such, a module 532 of the second trajectory planner can determine (e.g., predict) the locations of the vehicle 1404. For example, at time t (e.g., in one second), the vehicle 1404 is determined to be at a location 1412; at time t+1 (e.g., in two seconds), the vehicle 1404 is determined to be at a location 1414; and at time t+2 (e.g., in three seconds), the vehicle 1404 is determined to be at a location 1416. In an example, the same time window and frequency of predictions can be the same for all instantiated trajectory planners of the AV. However, that need not be the case. The time window and frequency can depend on the type (e.g., bicycle, pedestrian, sports car, sedan, large truck, etc.) of the dynamic object. The drivable area of the AV 1402 is adjusted to remove those areas that correspond to locations of the vehicle 1404.

In the example 1400 of FIG. 14, it is determined that the vehicle 1404 and the AV 1402 are roughly at the same locations at the same times. As such, portions corresponding to the path 1422 are cut out of the drivable area of the AV 1402, such as by setting (in this example, right) boundaries of bins corresponding to the path 1422. As described with respect to the distance 1212 of FIG. 12, if a distance 1424 is such that the AV 1402 can fit through the gap defined by the distance 1424, then the driveline of the AV 1402 is adjusted through the gap (i.e., the AV 1402 is pushed to the left).

In the example 1500 of FIG. 15, an AV 1502 is moving along a coarse driveline 1503. No static objects are found. Accordingly, a left boundary 1517 and a right boundary 1518 of the drivable area are not adjusted for static objects. However, a vehicle 1504 is predicted to be moving from the right shoulder of the road (or from the lane to the right of the lane that includes the AV 1502) into the path of the AV 1502 along a path 1520.

Initially, for example, when the vehicle 1504 is first detected it may be classified as a lateral constraint. As such, the lateral constraint can be applied with respect to the vehicle 1504, as described with respect to the vehicle 1404 of FIG. 14.

As described with respect to FIG. 15, the locations of the AV 1502 at times t, t+1, and t+2 are predicted to be, respectively, locations 1506, 1508, and 1510; and the locations of the vehicle 1504 at time t, t+1, and t+2 are predicted to be, respectively, 1512, 1514, and 1516. As such, the trajectory (i.e., the path 1520) of the vehicle 1504 is predicted to overlap the coarse driveline 1503 of the AV 1502. Accordingly, the vehicle 1504 is then classified as a longitudinal constraint. As such, the classification of the vehicle 1504 is changed from "lateral constraint" to "longitudinal constraint." As such, the trajectory planner need not change the trajectory of the AV 1502 such that the AV 1502 is moved to the left (as described above with respect to FIG. 14); rather, the discrete-time speed plan module 528 can apply a longitudinal constraint to the coarse driveline 1503 of the AV 1502. That is, the discrete-time speed plan module 528 computes a discrete-time speed plan using the vehicle 1504 as a lead vehicle. A tracking mode of "follow" can be set by the discrete-time speed plan module 528 such that the AV 1502 follows behind the vehicle 1504. The discrete-time speed plan module 528 can also determine a discrete-time speed plan to, for example, decelerate the AV 1502 such that the AV 1502 does not arrive at the location 1506 before the vehicle 1504.

In the example 1600 of FIG. 16, an AV 1602 is moving eastward along a coarse driveline 1603, and a vehicle 1604 is moving westward. The vehicle 1604 is predicted to follow a path 1609 in order to avoid a parked vehicle 1606. The locations of the AV 1602, along the coarse driveline 1603, at times t, t+1, and t+2 are predicted to be, respectively, locations 1610, 1612, and 1614. The locations of the vehicle 1604, along the path 1609, at times t, t+1, and t+2 are predicted to be, respectively, 1616, 1618, and 1620.

The trajectory planner determines that the AV 1602 and the vehicle 1604 are predicted to be at roughly the same location (i.e., the location of intersection corresponding to the locations 1612, 1618) at the same time (i.e., at time t+2). As such, should the AV 1602 continue along the coarse driveline 1603, it is most likely to collide with the vehicle 1604.

Although not shown in FIG. 16, the drivable area of the example 1600 is adjusted (i.e., cut out) as described with respect to the cutout 956 of the view 950 of FIG. 9. That is, the drivable area of the AV 1602 is adjusted to remove those areas that correspond to locations of the vehicle 1604, such as by setting (in this example, left) boundaries of bins corresponding to (i.e., overlapping) the path 1609.

At the location of intersection (i.e., the locations 1612, 1618), the trajectory planner can evaluate a width of the drivable area between the point of intersection and the edge of the drivable area. That is, the trajectory planner evaluates a distance 1622 to determine whether a gap defined by the distance 1622 is large enough such that the AV 1602 can pass through. As described above, the distance 1622 is the distance between the calculated boundaries of a bin 1608 that includes the point of intersection.

In a case where the distance 1622 is determined to not be large enough (i.e., the gap is too small), the trajectory planner determines the location at which the AV 1602 can clear the vehicle 1604. In an example, for at least some of the predicted locations of the AV 1602, starting from the intersection point (e.g., the location at time t+X, where X is a positive integer number) and going backward in time (e.g., at least some of the locations at times t+X−1, t+X−2, ..., t−1, t), the trajectory planner determines whether, at that location, the AV 1602 can clear the vehicle 1604. In the example 1600, the trajectory planner determines that the AV 1602 can clear the vehicle 1604 at the location 1610.

In another example, for at least some of the predicted locations of the vehicle 1604, starting from the intersection point (e.g., the location at time t+X, where X is a positive integer number) and going forward in time (e.g., at least some of the locations at times t+X+1, t+X+2, t+X+n), the trajectory planner determines whether, at that location, the AV 1602 can clear the vehicle 1604.

The trajectory planner determines that the AV 1602 can clear the vehicle 1604 when the vehicle 1604 is at the location 1620. As such, the trajectory planner (and more specifically, the module 530) sets a static blockage at location 1624. The trajectory planner (and more specifically, the discrete-time speed plan module 528) then determines a speed and/or a deceleration profile to bring the AV 1602 to a stop at the location 1624. As such, the AV 1602 is brought to a stop at the location 1624 until the vehicle 1604 arrives at the location 1624, at which time the AV 1602 can proceed along the coarse driveline 1603.

In a case where the distance 1622 is determined to be large enough, then the trajectory planner can adjust the coarse driveline 1603 such that the AV 1602 moves to the left to avoid the vehicle 1604 at the intersection location, such as shown with respect to the trajectory 962 of view 960 of FIG. 9.

As such, in an example, the object avoidance layer 506 processes the objects systematically. If an object is not a constraint, then it can be ignored by the object avoidance layer 506.

If an object is a static object and the adjusted drivable area is passable (e.g., the AV can pass through one or more gaps in the drivable area or the adjusted drivable area, as the case may be), then the module 530 can apply the static constraint (e.g., lateral constraint) to determine an adjusted drivable area, as described, for example, with respect to the distance 1212 of FIG. 12.

If an object is a static object and the drivable area (or adjusted drivable area) is not passable, then the discrete-time speed plan module 528 can adjust the discrete-time speed profile, as described, for example, with respect to the location 1122 of FIG. 11.

If an object is a dynamic object and the object is a lateral constraint, then the module 532 can adjust the drivable area (or adjusted drivable area), as described, for example, with respect to FIG. 15.

If an object is a dynamic object and the object is a longitudinal constraint, then the discrete-time speed plan module 528 can adjust the discrete-time speed profile, as described, for example, with respect to FIG. 16. The discrete-time speed plan module 528 can generate a discrete-time speed plan for a future window (e.g., a speed plan for the next 6 seconds) given the constraints.

Returning to FIG. 5, the trajectory optimization layer 508 performs an optimization operation(s), such as a constrained operation, to determine an optimal trajectory for the AV based on the constraints. The trajectory optimization layer 508 can use (i.e., as inputs to the optimization operation) the motion model (e.g., the kinematic motion model) of the AV, the coarse driveline (e.g., the coarse driveline 1004 of FIG. 10, the coarse driveline 1103 of FIG. 11, the coarse driveline 1403 of FIG. 14, etc.) and/or the center points (e.g., the center point 1006) of the bins along the coarse driveline, and the adjusted drivable area (e.g., the left and the right boundaries of the adjusted drivable area) to calculate (e.g., determine, generate, etc.) an optimal trajectory for the AV. As such, the optimal trajectory takes into account the coarse driveline and the left and right boundaries, given static and dynamic objects, along the coarse driveline.

Figure 17:
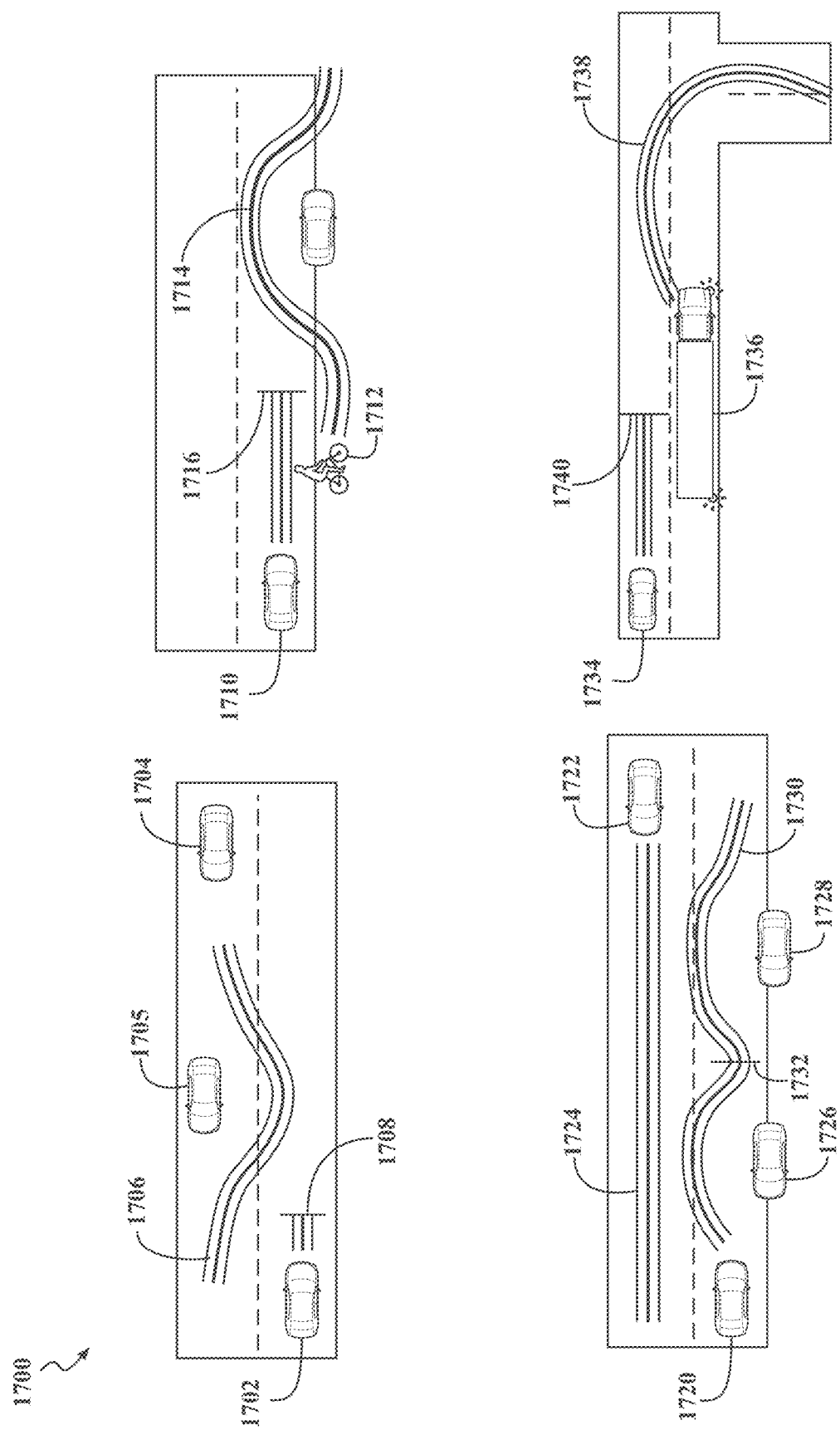
FIG. 17 illustrates additional examples of trajectory planning according to implementations of this disclosure.

FIG. 17 illustrates additional examples 1700 of trajectory planning according to implementations of this disclosure. In each of the examples below, one or more trajectory planners, such as the trajectory planner 500 of FIG. 5, can be executed within an autonomous vehicle. A first instance of the trajectory planner determines a trajectory for the autonomous vehicle itself. A second trajectory planner instance predicts a respective reference driveline of at least one external dynamic object. For simplicity of explanation, "the trajectory planner" is used herein to refer to the first instance and/or the second instance.

In a first example, a trajectory planner of an AV 1702 predicts that an oncoming vehicle 1704 will follow a trajectory 1706 to avoid a static object 1705. The trajectory planner further determines, as described with respect to FIG. 16, that the AV 1702 cannot pass in a gap between the trajectory of the oncoming vehicle 1704 and a right boundary of the drivable area. As such, the trajectory planner determines a speed plan that brings the AV 1702 to a stop at a static blockage 1708 until the oncoming vehicle 1704 is past the static blockage 1708.

In a second example, an AV 1710 determines (i.e., by the trajectory planner of the AV) that a dynamic object 1712 will follow a path 1714. The trajectory planner determines that the AV 1710 cannot pass the dynamic object 1712 without crossing the centerline of the road, which may be a left hard boundary of the drivable area (as described with respect to the drivable area 932 of FIG. 9). As such, the trajectory planner of the AV 1710 determines a speed plan that brings the AV 1710 to a stop at a static blockage 1716. In another example, the AV 1710 is not stopped at the static blockage 1716; rather, the AV 1710 is slowed sufficiently to allow the dynamic object 1712 to pass.

In a third example, an AV 1720 determines that an oncoming dynamic object 1722 will follow a trajectory 1724. The AV 1720 further determines a trajectory 1730 of the AV 1720 such that the AV 1720 is navigated, along a trajectory 1730, to between a first static object 1726 and a second static object 1728, where the AV 1720 is to wait at a static blockage 1732 for a calculated number of seconds and then proceed. The calculated number of seconds is the time sufficient for the oncoming dynamic object 1722 to pass the location of the static blockage 1732, such as described with respect to the location 1624 of FIG. 16.

In a fourth example, an AV 1734 determines that a large dynamic object 1736 is turning right. The trajectory planner of the AV 1734, using a motion model of the large dynamic object 1736, determines that the large dynamic object 1736 requires a large turning radius and, as such, that the large dynamic object 1736 will follow a trajectory 1738. Accordingly, a speed plan is determined (e.g., calculated, generated, etc.) for the AV 1734 such that the AV 1734 is brought to a stop at a static blockage 1740 until the path of the AV 1734 is clear of the large dynamic object 1736.

To summarize, a trajectory planner (e.g., a driveline data layer of the trajectory planner) according to this disclosure can determine (e.g., generate, calculate, select, etc.) a reference (i.e., coarse) driveline. The trajectory planner can fuse several input data together to determine the coarse driveline. As such, the coarse driveline can be referred to as multi-sourced (i.e., from multiple types of input data). The input data can include HD map data, teleoperation data, recorded paths data, preceding vehicle data, parking lot data, and local perception data. The trajectory planner can use fewer, more, or other inputs.

The trajectory planner (e.g., a coarse-driveline concatenation layer of the trajectory planner) can generate (e.g., determine, calculate, etc.) a strategic speed plan that includes specific speed values along the coarse driveline. The trajectory planner can use at least one of road curvature, road mu, vehicle speed and/or acceleration limits, minimum cruise times, neighborhood types, as well as more, fewer, or other inputs to generate the strategic speed plan.

The trajectory planner (e.g., the coarse-driveline concatenation layer of the trajectory planner) determines an adjusted drivable area for the AV based on at least one or more of hard boundaries (which are set based on static and/or dynamic objects), soft boundaries (e.g., lane markings), filtered lateral limits, multi-hypothesis tracking, extendable drivable area checking, and dynamic object classification (e.g., classifying an object as an oncoming vehicle, a lead vehicle, or a lateral constraint).

The trajectory planner (e.g., a discrete-time speed plan module of the trajectory planner) determines (e.g., calculates) a discrete-time speed plan using, for example, natural acceleration profiles (e.g., a motion model of the AV), lead vehicle acceleration profiles, and determinations of limiting longitudinal constraints.

The trajectory planner (e.g., an optimized desired trajectory layer of the trajectory planner) generates (e.g., calculates, determines, etc.) an optimized trajectory of the AV using, for example, a constrained optimization operation. In an example, the optimization operation can be based on, or can include, a quadratic penalty function. In an example, the optimization operation can be based on, or can include, a logarithmic barrier function. For example, the quadratic penalty function can be used with soft constraints. For example, the logarithmic barrier function can be used with hard constraints.

Figure 18:
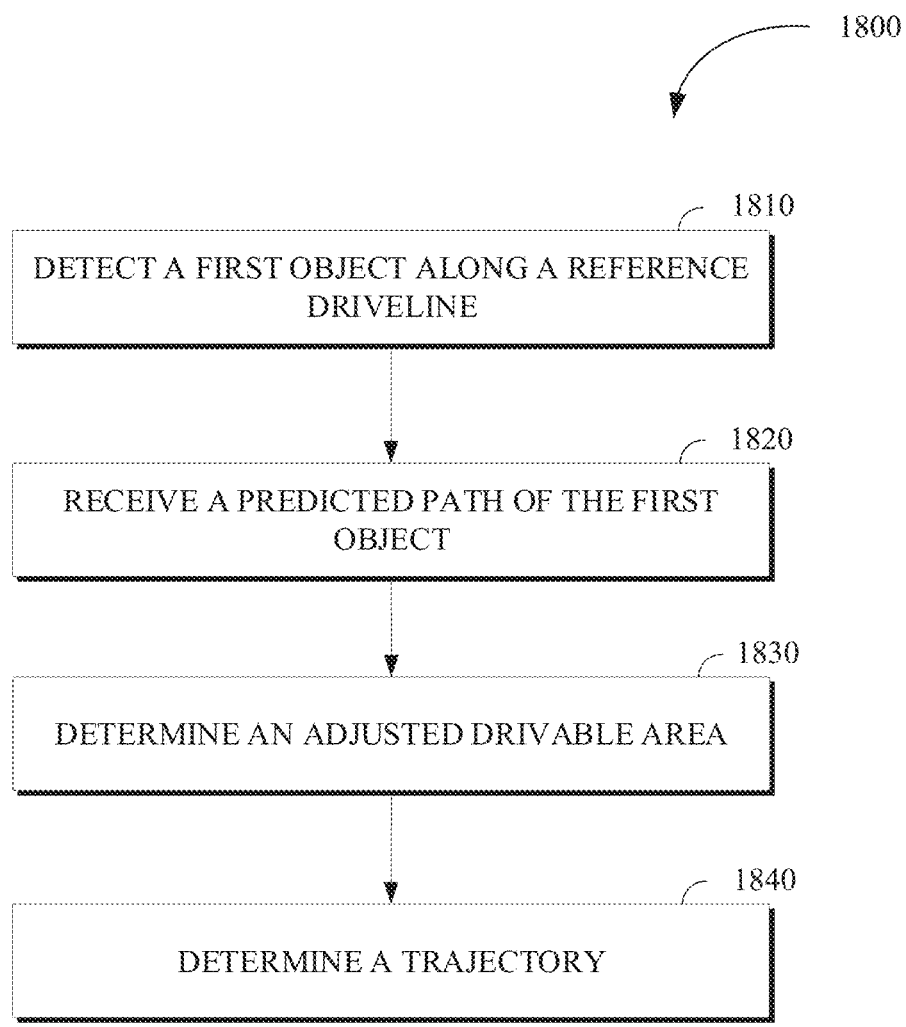
FIG. 18 is a flowchart diagram of a process for object avoidance in accordance with the present disclosure.

FIG. 18 is a flowchart diagram of a process 1800 for object avoidance in accordance with the present disclosure. The process 1800 can be executed by a trajectory planner, such as the trajectory planner 500 of FIG. 5.

At operation 1810, the process 1800 detects a first object along a coarse driveline of a drivable area of the AV. In an example, detecting the first object can mean detecting boundary points, such as the boundary point 1008 of FIG. 10, corresponding to an object. In an example, detecting an object can mean receiving (for example, by interrogating) the object from a world model, such as described with respect to the world model module 402 of FIG. 4. The coarse driveline can be as described, for example, with respect to the coarse driveline 1004 of FIG. 10, the coarse driveline 1103 of FIG. 11, the coarse driveline 1203 of FIG. 12, and so on. The drivable area can be as described with respect to the drivable area 932 of FIG. 9.

At operation 1820, the process 1800 receives a predicted path of the first object. In an example, the process 1800 determines the predicted path of the first object based on a classification of the first object and a motion model of the first object. In another example, the process 1800 receives the predicted path of the first object from a trajectory planner that predicts a path for the first object. The predicted path can be as described with respect to the trajectory 336, the trajectory 346, the trajectory 354, and the trajectory 364 of FIG. 3; the path 1420 of FIG. 14; the path 1520 of FIG. 15; and the path 1609 of FIG. 16.

At operation 1830, the process 1800 determines, based on the predicted path of the first object, an adjusted drivable area. In an example, and as described above, portions can be cut out of the drivable area to generate the adjusted drivable area. In another example, such as in a case where the first object is neither a lateral nor a longitudinal constraint, as described above, the adjusted drivable area can be the same as the drivable area.

At operation 1840, the process 1800 determines a trajectory of the AV through the adjusted drivable area. The trajectory can be determined as described with respect to the trajectory optimization layer 508 of FIG. 5.

In an example, determining, based on the predicted path of the first object, the adjusted drivable area can include dividing at least a portion of the coarse driveline into bins, assigning the first object to one bin of the bins, and determining the adjusted drivable area based on the one bin. The bins can be, for example, as described with respect to FIG. 10. Determining the adjusted drivable area based on the one bin can include determining (e.g., calculating) boundaries for at least the one bin, such as described above.

In an example, determining, based on the predicted path of the first object, the adjusted drivable area can include determining respective object locations of the first object at discrete time intervals, determining respective AV locations of the AV at the discrete time intervals, and determining the adjusted drivable area based on the respective object locations and the respective AV locations. The respective object locations of the first object, the AV locations, and the determining the adjusted drivable area can be as described with respect to FIGS. 14-16.

In an example, the process 1800 can include classifying the first object. In another example, the process 1800 can receive the classifying of the first object, such as from the world model module 402. In a case where the first object is classified as an oncoming longitudinal constraint, determining the trajectory of the AV through the adjusted drivable area can include stopping the AV until a second time subsequent to a first time that an object location of the first object meets an AV location of the AV, such as described with respect to FIG. 16.

In a case where the first object is classified as a longitudinal constraint, determining the trajectory of the AV through the adjusted drivable area can include slowing the AV to drive behind the first object, such as described with respect to FIG. 15.

In an example, the process 1800 can also include classifying the first object as a lateral constraint, a longitudinal constraint, an oncoming lateral constraint, or an oncoming longitudinal constraint.

In an example, determining the trajectory of the AV through the adjusted drivable area can include determining that the first object is a static blockage and stopping the AV, such as described with respect to FIG. 16.

Figure 19:
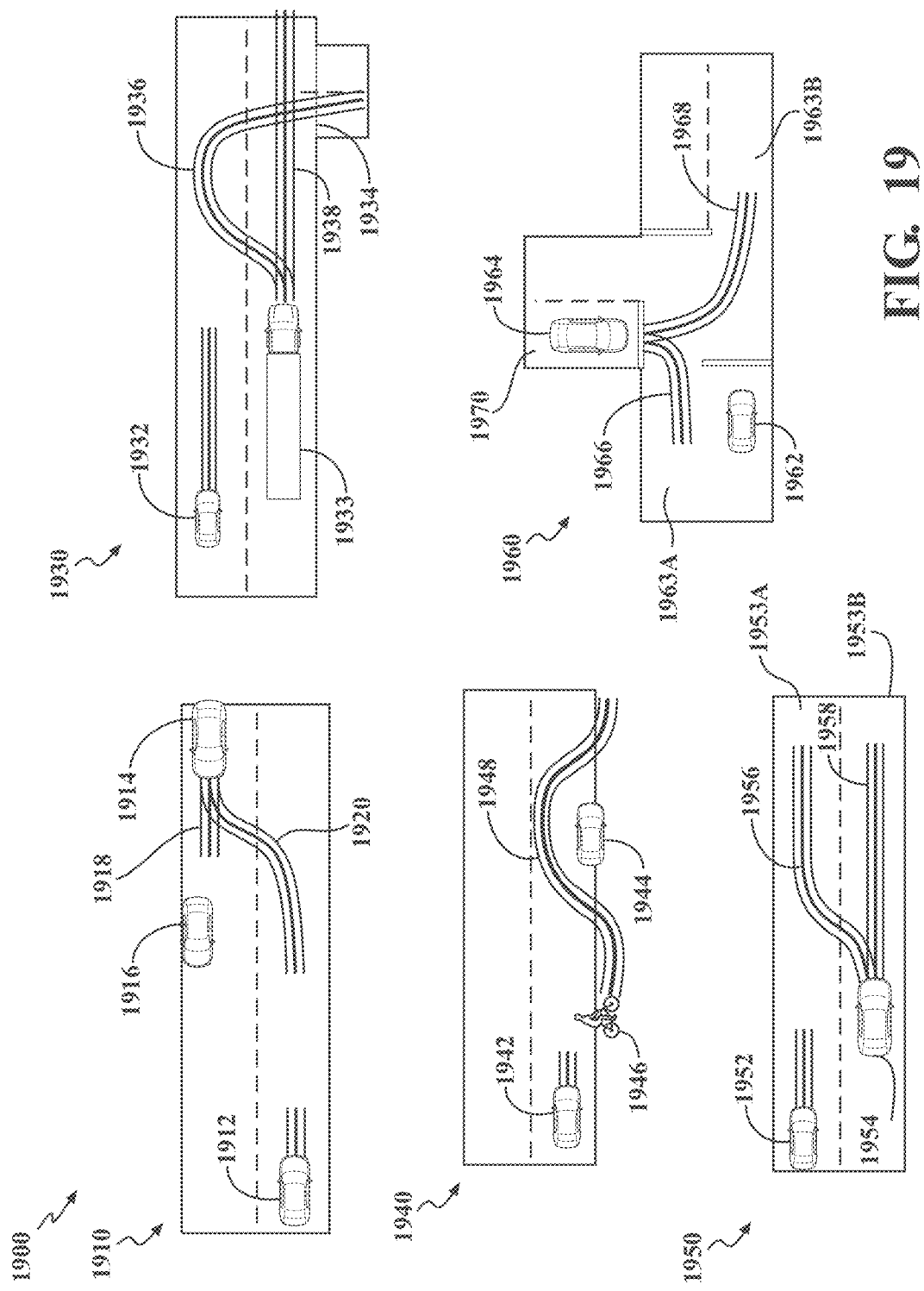
FIG. 19 is a diagram of examples of hypotheses for real-world objects according to implementations of this disclosure.

FIG. 19 is a diagram of examples 1900 of hypotheses for real-world objects according to implementations of this disclosure. The examples 1900 include examples 1910, 1930, 1940, 1950, and 1960 in which hypotheses (i.e., intentions) of an observed real-world object are predicted.

The example 1910 illustrates an AV 1912. The AV 1912 (and more specifically, a world model module of the AV 1912) detects an oncoming dynamic object 1914. The AV 1912 predicts that that the oncoming dynamic object 1914 can either follow a path 1918, or a path 1920 such that the oncoming dynamic object 1914 can avoid a parked vehicle 1916. As such, the AV 1912 can associate a first hypothesis (e.g., "stop" corresponding to the path 1918) and a second hypothesis (e.g., "go around on the left" corresponding to the path 1920) with the oncoming dynamic object 1914. The first hypothesis indicates that the oncoming dynamic object 1914 is to stop behind the parked vehicle 1916. The second hypothesis indicates that the oncoming dynamic object 1914 impedes the trajectory of the AV 1912. As such, if a trajectory planner, as described above, receives the path 1920 as the predicted path of the oncoming dynamic object 1914, then the trajectory planner classifies the oncoming dynamic object 1914 as an oncoming longitudinal constraint.

The AV 1912 can associate a likelihood with each of the paths 1918, 1920. In an example, a likelihood of 0.2 can be assigned to the path 1918 and a likelihood of 0.8 can be assigned to the path 1920. As such, there is a 20% chance that the oncoming dynamic object 1914 will continue straight forward and stop and/or slow down before reaching the parked vehicle 1916; and an 80% chance that the oncoming dynamic object 1914 will go around the parked vehicle 1916.

The example 1930 illustrates an AV 1932. The AV 1932 (and more specifically, a world model module of the AV 1932) detects an adjacent object 1933. The adjacent object 1933 may be classified as a large truck. Using map data (as further described below), the AV 1932 determines that a road intersection exists at a location 1934. As such, the AV 1932 can associate a first hypothesis (e.g., "go straight" corresponding to a path 1938) and a second hypothesis (e.g., "turn right" corresponding to a path 1936) with the adjacent object 1933. As further described below, the trajectory of the path 1936 can be predicted using a process model (e.g., a motion model) of a large truck that is turning right.

The AV 1932 can associate a likelihood with each of the first and the second hypotheses. In an example, a likelihood of 0.6 can be assigned to the first hypothesis and a likelihood of 0.4 can be assigned to the second hypothesis. As such, there is a 60% chance that the truck continues moving forward at the intersection and a 40% chance that the truck will turn right at the intersection. As further explained below, the likelihood of each hypothesis can be determined based on state information. In a simple example, if the adjacent object 1933 does not seem to be slowing down over time, then the likelihood of the second hypothesis (i.e., "turn right") is reduced.

The example 1940 illustrates an AV 1942. The AV 1942 detects a bicycle 1946. That is, the AV 1942 detects an object that is classified as "bicycle." The AV 1942 also detects a parked vehicle 1944. As such, the AV 1932 can associate a first hypothesis (e.g., "go around" corresponding to a path 1948) with the bicycle 1946. As such, the bicycle 1946 may be classified, by a trajectory planner, as described above, as either a lateral constraint or a longitudinal constraint. As only one hypothesis is associated with the bicycle 1946, a likelihood of one (e.g., 100%) can be assigned to the one hypothesis.

The example 1950 illustrates an AV 1952. The AV 1952 detects a vehicle 1954. That is, the AV 1952 detects an object that is classified as "vehicle." The AV 1952 can determine (for example, based on map data) that the road includes two lanes (i.e., a lane 1953A and a lane 1953B). As such, the AV 1932 can associate a first hypothesis (e.g., "go straight" corresponding to a path 1958 such that the vehicle 1954 stays in the lane 1953B) and a second hypothesis (e.g., "change to left lane" corresponding to a path 1956 such that the vehicle 1954 moves to the lane 1953A).

The AV 1952 can associate a likelihood with each of the first and the second hypotheses. In an example, a likelihood of 0.3 can be assigned to the first hypothesis and a likelihood of 0.7 can be assigned to the second hypothesis. As such, there is a 30% chance that the vehicle 1954 stays in the lane 1953B and a 70% chance that the vehicle will move to the lane 1953A. As further explained below, the likelihood of each hypothesis can be determined based on state information.

The example 1960 illustrates an AV 1962. The AV 1962 detects a vehicle 1964. That is, the AV 1962 detects an object that is classified as "vehicle." The AV 1962 can associate (for example, using map data) with the vehicle 1964 a first hypothesis (e.g., "turn right" corresponding to the vehicle 1964 turning right onto a lane 1963A to follow a path 1966) and a second hypothesis (e.g., "turn left" corresponding to the vehicle 1964 turning left onto a lane 1963B to follow a path 1968). In an example, the first hypothesis may be assigned a likelihood of 0.2 and the second hypothesis may be assigned a likelihood of 0.8. As such, there is a 20% chance that the vehicle 1964 will turn right and an 80% change that the vehicle 1964 will turn left.

Figure 20:
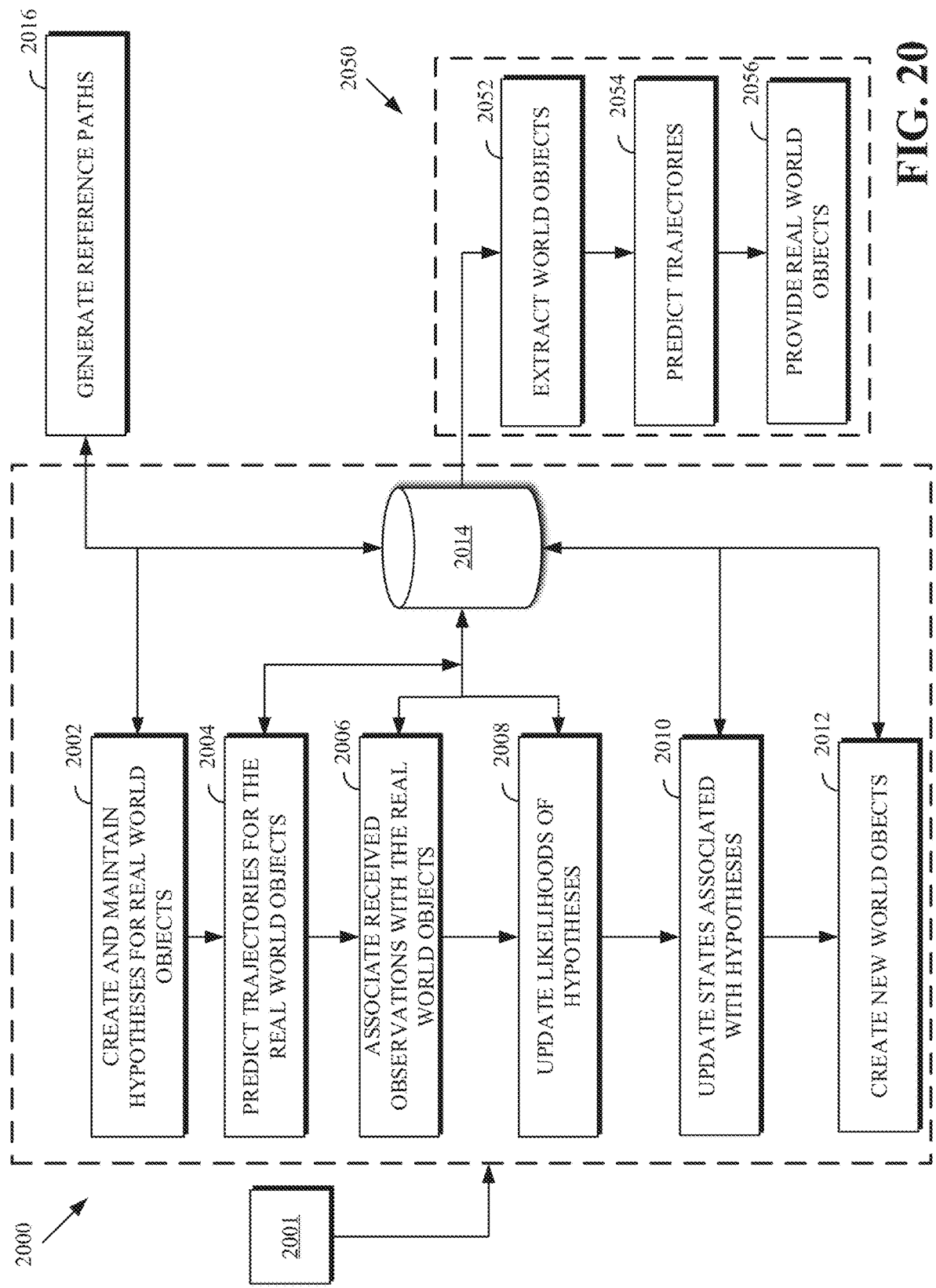
FIG. 20 includes a flowchart diagram of a process for world modeling and a flowchart diagram of a process of using the world model in accordance with the present disclosure.

FIG. 20 includes a flowchart diagram of a process 2000 for world modeling in accordance with the present disclosure. The process 2000 includes operations 2002-2012, which are described below. The process 2000 can be implemented by a world model module, such as the world model module 402 of FIG. 4. The process 2000 can be stored in a memory (such as the memory 122 of FIG. 1) as instructions that can be executed by a processor (such as the processor 120 of FIG. 1) of an AV (such as the vehicle 100 of FIG. 1).

The process 2000 maintains one or more hypotheses for real-world objects, such as the dynamic objects described above. The process 2000 can maintain (e.g., associate with) at least some of the hypotheses of at least some of the real-world objects a respective state. Given prior measurements (e.g., received sensor observations), for each hypothesis, the process 2000 estimates the state of the associated real-world object and predicts future object states. The process 2000 maintains (e.g., calculates, determines, or otherwise maintain) a likelihood for each of the hypotheses and updates the likelihood as new sensor observations are received. The process 2000 can maintain the one or more hypotheses, detected objects, and associated states in a data store, such as a data store 2014. The data store 2014 can be stored in a memory, such as the memory 122 of FIG. 1. The data store 2014 can be, for example, a database, such as a relational database, a file store, or any appropriate data store. The process 2000 can be executed when new sensor measurements are available, on a schedule (such as every several milliseconds), a combination thereof, or under other conditions.

At least some of the steps of the process 2000 can be implemented using, as, or as a step of a particle filtering-based algorithm. Particle filtering is a technique for tracking (e.g., predicting) an object state based on observations of the object state. In an example, the Rao-Blackwellized Particle Filter (RBPF) methodology can be used.

The process 2000 can use particles to represent the hypotheses. The RBPF uses weights that are assigned to particles. As such, the likelihood of a hypothesis can be used as the weight of the particle that represents the hypothesis. As such, as multiple hypotheses can be associated with a real-world object, the real-world object can consist of a set of weighted particles (each corresponding to a hypothesis of the real-world object).

The process 2000 can receive inputs 2001. The inputs 2001 can include sensor data (i.e., sensor observations), such as the measurements from one or more of the sensor 126. The sensor data can be used to detect real-world objects. That is, for example, the sensor data can be used to determine that a real-world object exists within the view of the AV.

In an example, the process 2000 uses the sensor data to determine a pose and a velocity of a detected object. The process 2000 can use the sensor data to determine (e.g., assign) a classification to the detected object. The process 2000 can use the sensor data to determine (e.g., calculate, estimate) a geometry for the detected object.

In an example, data from one or more cameras can be used to determine the class of a detected object. Non-limiting examples of classes include "car," "sports car," "sedan," "large truck," "pedestrian," and "bicycle." In another example, a classification can be assigned based on the motion, over time, of LiDAR data (e.g., LiDAR point cloud) over time. In an example, a neural network (such as a convolutional neutral network) can be used for object recognition (e.g., classification) of the detected object. Other methods can be available to determine a classification of the sensor data associated with an object.

It is noted that different sensor data may provide different object classifications. For example, a first classification of "bicycle" may be determined based on the LiDAR data whereas a second classification of "jogger" may be determined based on camera data. Accordingly, the classification of an object may be determined probabilistically (e.g., which of the first and second classifications is more likely). As such, different sensor data are fused together to determine the classification. As the classification is probabilistic, the classification of an object can change over time. In some implementations, the process 2000 can maintain hypothesis for at least some of the possible classifications.

In an implementation, the process 2000 receives, as inputs, the pose and the velocity for a detected object. In an implementation, the process 2000 receives, as additional inputs, one of more of the geometry and the classification for a detected object. As such, the classification can be received as an input, rather than being determined by the process 2000.

The inputs 2001 can also include map information. The map information can be HD map data (such as described with respect to the HD map data 510 of FIG. 5), perceived path data (such as described with respect to the perceived path data 520 of FIG. 5), other map information, or a combination thereof.

The map information can include map lane structures (also referred to herein as road structures). The map lane structure of a given lane can include successor lane information, predecessor lane information, and sibling lane information. FIG. 19 is now used to provide illustrative examples. The lane 1953A and the lane 1953B are sibling lanes. The lane 1963A and the lane 1963B are possible successor lanes of a lane 1970. As such, the map lane structures include information regarding how lanes of a road connect. The map lane structure can be used to determine the possible lane combinations that a detected object can take (e.g., follow). That is, the map lane structure can be used to determine the possible paths of the detected object.

The inputs 2001 can also include environment information. Environment information can include information regarding unnavigable areas of the vehicle transportation network upon which the AV is traveling. For example, the environment information can include locations of parking lots, such as described with respect to parking lot data 518 of FIG. 5. The environment information can be used to add (e.g., create) one or more hypotheses for a detected object. For example, if a parking lot is within a predetermined distance of a detected object, then a "enter parking lot" hypothesis can be added for the detected object.

As mentioned above, the process 2000 maintains respective state information for hypotheses. That is, for example, for each observed (e.g., detected) object (e.g., a vehicle, a bicycle), the process 2000 maintains one or more hypotheses for the object state. For each hypothesis, the process 2000 can maintain an object state (i.e., a current state that is based on historical measurements) and a prediction of the future object states.

As mentioned above, the object state can include discrete object state information and continuous object state information. The discrete object state information can include a classification (e.g., "car," "bicycle," "pedestrian," etc.) and an intention (e.g., "go right," "turn left," etc.). The discrete object state information can include more, fewer, or additional information. The continuous object state information provides estimates of continuous states given prior measurements. The continuous object state information can include estimates relating to more, fewer, or other continuous states as a dynamic (e.g., velocity, acceleration), a kinematic (e.g., pose, position, orientation), a geometric (e.g., length, width, and/or height of a bounding box of the object), or an appearance state. Appearance can include a color of the object. In an example, if a current color is determined to be black and a later-received sensor observation indicates a red color, such information can be used to in determining whether the sensor observation is associated with the object. The color can be tracked as a label, such as "red." The color can be tracked as a set of color values, such as red, green, and blue (RGB) values. In an example, a current appearance state may indicate a color value of (255, 0, 0), which is updated to (254.37, 0, 0) based on a received sensor observation. As such, the appearance is a continuous variable.

The prediction of the future object states can be provided for a specified end time. For example, the process 2000 can, for each hypothesis, predict a respective trajectory for the object associated with the hypothesis and predict states of the object at discrete time points along the trajectory up to the specified end time. A predicted state includes predicted locations, predicted velocities, predicted headings, etc. However, for ease of explanation, predicted locations are described. For example, the specified end time may be 6 seconds and the process 2000 can predict locations of the object at 0.5 seconds increments up to 6 seconds. As such, twelve locations of the object are predicted. In an example, a location can be defined by the (x, y) coordinates of the object. The location can be relative to the current location of the AV.

As mentioned above, the process 2000 can assign (e.g., calculate, determine, or otherwise assign) a likelihood to each hypothesis.

To illustrate the above, an example of hypotheses maintained by the process 2000 for a car (i.e., a detected object that is classified as a "car") is now given. The hypotheses include a Hypothesis 1 and a Hypothesis 2.

The Hypothesis 1 includes the discrete object state information: Classification="Car" and Intention="Go Straight at the next intersection." The continuous object state information includes Position=(10, 25) (i.e., 10 meters ahead and 25 meters to the right of the AV) and Velocity=65 MPH. The Hypothesis 1 can also include predictions of locations of the car for the next N seconds (i.e., the specified end time). As such, the Hypothesis 1 includes object states from t=T (i.e., a current time) to t=T+N. Additionally, there is a 60% likelihood that the car will follow the intention (i.e., "Go Straight at the next intersection") of the Hypothesis 1.

The Hypothesis 2 includes the discrete object state information: Classification="Car" and Intention="Turn right at the next intersection." The continuous object state information includes Position=(10, 25) and Velocity=45 MPH. The Hypothesis 2 can also include predictions of locations of the car for the next N seconds (i.e., the specified end time). As such, the Hypothesis 2 includes object states from t=T (i.e., a current time) to t=T+N. Additionally, there is a 40% likelihood that the car will follow the intention (i.e., "Turn right at the next intersection") of the Hypothesis 2. It is noted that when an object is first created, any hypotheses created for the object can have the same initial position and velocity. However, as the object is tracked (e.g., the states of the hypotheses associated with the object are updated), the positions and/or velocities associated with the different hypotheses can differ.

At the operation 2002, the process 2000 creates and maintains hypotheses for at least some of the detected real-world objects. The hypotheses can be maintained in the data store 2014. As the location of a real-world object changes (e.g., as further described below with respect to received sensor observations), one or more hypotheses associated with the real-world object can change. For example, some of the hypotheses may become invalid (e.g., impossible or have very low likelihoods). For example, if the real-world object turns left (or is almost certain to turn left), a hypothesis associated with the intention "turn right at the next intersection" becomes invalid. Some additional hypotheses may need to be created based on the real-world object turning left. As mentioned above, map information (e.g., HD map data, perceived map data, etc.), environment information data, and/or other map information be used to create and maintain hypotheses.

Figure 21:
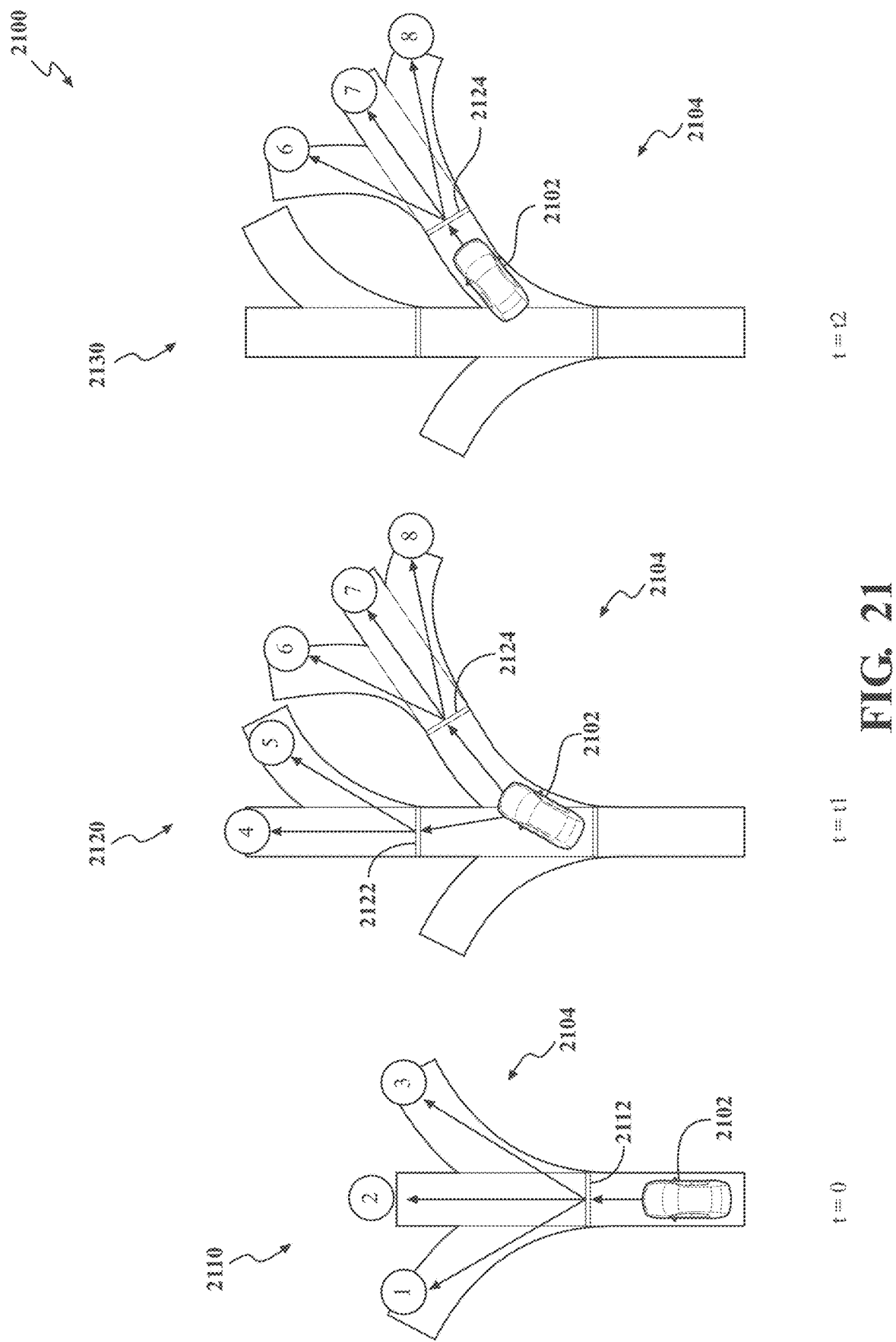
FIG. 21 is an example of creating and maintaining hypotheses according to implementations of this disclosure.

FIG. 21 is an example 2100 of creating and maintaining hypotheses according to implementations of this disclosure. The example 2100 depicts a vehicle 2102 (i.e., a real-world object that is detected by an AV executing the process 2000) traversing a portion of a vehicle transportation network, namely a roadway 2104.

A view 2110 illustrates a position of the vehicle 2102 at a time, t=0. At t=0, the vehicle 2102 is before a fork 2112 in the roadway 2104. As such, using a map lane structure obtained from the map information, the process 2000 can determine that, once the vehicle 2102 arrives at the fork 2112, the vehicle 2102 can "go left" (corresponding to a path labeled "1"), "go straight" (corresponding to a path labeled "2"), or "go right" (corresponding to a path labeled "3"). As such, the process 2000 can create (such as in the data store 2014) three hypotheses for the vehicle 2102; namely a Hypothesis 1, Hypothesis 2, and Hypothesis 3 corresponding, respectively, to the paths labeled 1, 2, and 3. As described above, state information is determined (e.g., calculated, set, or otherwise determined) for each of hypotheses.

A view 2120 illustrates a position of the vehicle 2102 at a time, t=1. At t=1, as the vehicle 2102 can no longer "go left," the Hypothesis 1 is removed (such as from the data store 2014). If the AV follows the "go straight" intention (i.e., the Hypothesis 2), then using map information, the process 2000 can determine that the vehicle 2102 can "go straight" (corresponding to a path labeled "4") or "go right" (corresponding to a path labeled "5"). As such, the process 2000 replaces the Hypothesis 2 with a Hypothesis 4 and a Hypothesis 5, corresponding, respectively, to the paths labeled "4" and "5" after the vehicle 2102 arrives at a fork 2122.

If the AV follows the "go right" intention (i.e., the Hypothesis 3), then using map information, the process 2000 can determine that the vehicle 2102 can, after reaching a fork 2124, "go left" (corresponding to a path labeled "6"), "go straight" (corresponding to a path labeled "7"), or "go right" (corresponding to a path labeled "8"). As such, the process 2000 replaces the Hypothesis 3 with a Hypothesis 6, a Hypothesis 7, and a Hypothesis 8, corresponding, respectively, to the paths labeled "6," "7," and "8."

In an example, the process 2000 can determine that a hypothesis for the vehicle 2102 is no longer feasible (or feasible with a negligible likelihood) based on factors including a pose, a velocity, and a location of the vehicle 2102. A negligible likelihood can be a likelihood that is below a threshold likelihood. More, fewer, or other factors can be used to determine feasibility of a hypothesis. In an example, the threshold likelihood can be a threshold that is less than 10%. For example, at t=t1, as the orientation of the vehicle 2102 is estimated to be generally northeast and may be traveling at an estimates speed of 45 MPH, there is a negligible likelihood that the vehicle 2102 can still follow the intention of the Hypothesis 1.

A view 2130 illustrates a position of the vehicle 2102 at a time, t=2. At t=2, as the vehicle 2102 can no longer follow the intentions of the Hypotheses 4 and 5, the Hypotheses 4 and 5 are removed (such as from the data store 2014). Removing a hypothesis can mean deleting the hypothesis from the data store 2014. Removing a hypothesis can mean setting the hypothesis to an inactive state such that the hypothesis is no longer used by the operations of the process 2000. The Hypotheses 6, 7, and 8 are maintained. Maintaining a hypothesis can include updating the likelihood of the hypothesis. In a simple example, if the Hypotheses 4, 5, 6, 7, and 8 were equally likely, then each of the Hypotheses 4, 5, 6, 7, and 8 would have had a likelihood of 20%. Assuming the Hypotheses 6, 7, and 8 remain equally likely after the Hypotheses 4 and 5 are removed, then each of the Hypotheses 6, 7, and 8 would have an associated likelihood of 33%.

Referring again to FIG. 20, at operation 2004, the process 2000 predicts trajectories for the real-world objects. That is, the process 2000 predicts, for each hypothesis of the real-world objects, an associated trajectory. At the operation 2004, the process 2000 can determine (e.g., read or extract from the data store 2014) the hypotheses for a real-world object, generate (or use) a reference driveline for each hypothesis, and generate a predicted trajectory for each reference driveline. One or more instances of a trajectory planner, such as the trajectory planner 500 of FIG. 5, can be used to generate a reference driveline. The operation 2004 is further described with respect to FIG. 22.

As mentioned above, a hypothesis associated with a real-world object includes an intention and state information, including a classification. In an example, a motion model that is based on the classification of the object can be used to predict the trajectory for the intention.

Figure 22:
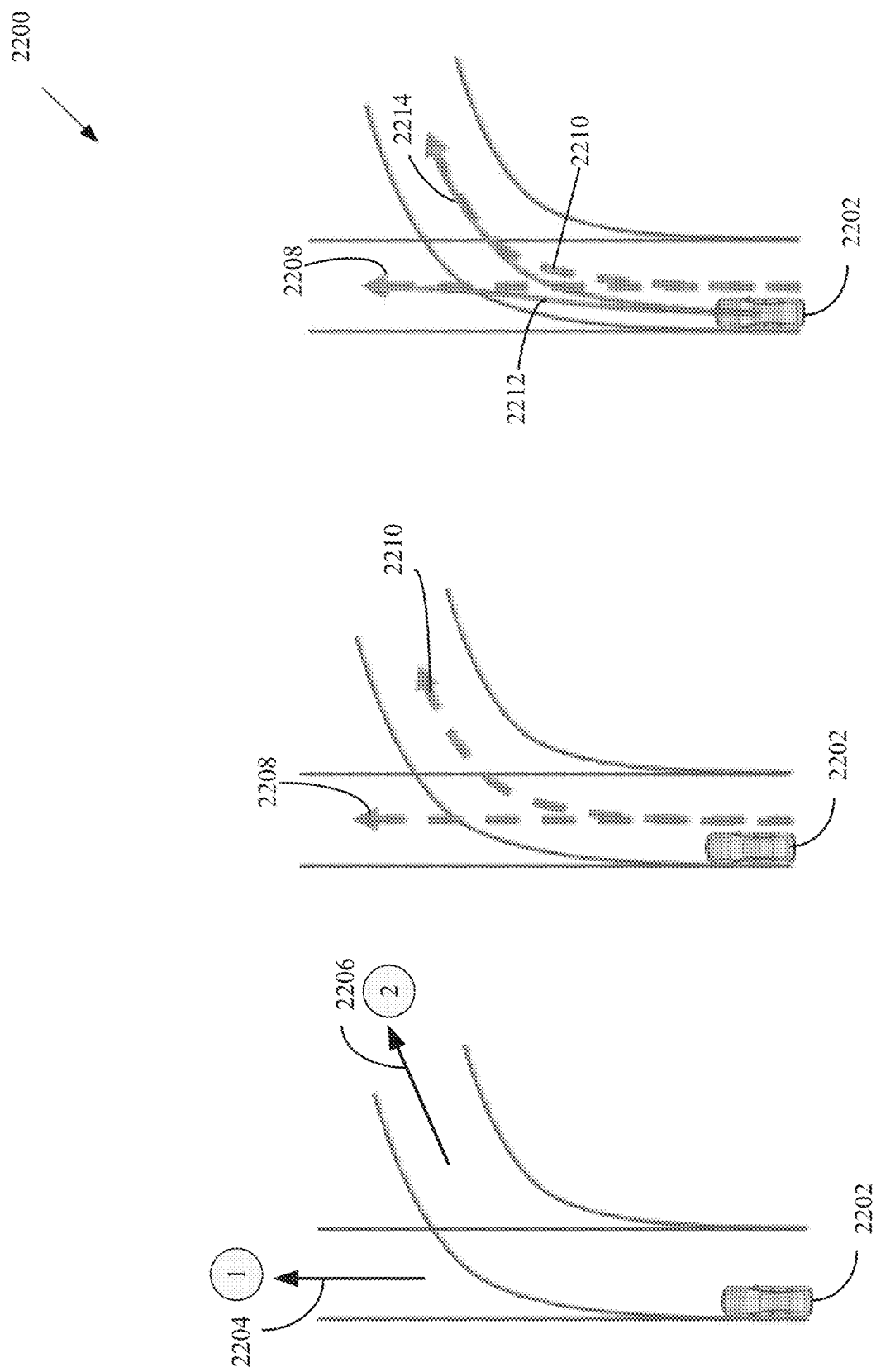
FIG. 22 is an example of trajectory prediction according to implementations of this disclosure.

FIG. 22 is an example 2200 of trajectory prediction according to implementations of this disclosure. The example 2200 illustrates the operation 2004. The example 2200 illustrates a vehicle 2202 (i.e., a real-world object). The process 2000 maintains (such as in data store 2014) two hypotheses for the vehicle 2202; namely a Hypothesis 1 (i.e., a hypothesis 2204 corresponding to a "go straight" intention) and a Hypothesis 2 (i.e., a hypothesis 2206 corresponding to a "turn right" intention).

For at least some of the hypotheses, the process 2000 (at the operation 22004) can first determine a reference driveline. For example, a reference driveline may not be determined for a hypothesis in a case where a trajectory can be predicted without a reference driveline. For example, a reference driveline may not be determined for a reference driveline in a case where a reference driveline generator (e.g., a trajectory planner or some other reference driveline generator) is not available. The reference driveline for each hypothesis can be, for example, the center of the lane corresponding to the intention of the hypothesis. As such, a reference driveline 2208 is predicted for the Hypothesis 1 of the vehicle 2202 and a reference driveline 2210 is predicted for the Hypothesis 2 of the vehicle 2202.

For each of the reference drivelines, the process 2000 determines (e.g., calculates, predicts) a trajectory (e.g., a smooth trajectory such as described with respect to the trajectory planner 500 of FIG. 5). The state associated with the hypothesis can be used to determine the trajectory for that hypothesis. As such, a trajectory 2212 is predicted such that the vehicle 2202 is expected to navigate from its current location onto (e.g., merges with) the reference driveline 2208 so that the vehicle 2202 follows the reference driveline 2208; and a trajectory 2214 is predicted such that the vehicle 2202 is expected to navigate from its current location onto the reference driveline 2210 so that the vehicle 2202 follows the reference driveline 2210.

In another example, the operation 2004 can use reference drivelines generated by an operation 2016. In such a case, the operation 2004 uses the reference drivelines generated by the operation 2016 to determine the trajectories. The operation 2016 can be an asynchronous process that executes separately from the process 2000.

Referring again to FIG. 20, at operation 2004, the process 2000 associates received sensor observations with the real-world objects. The process 2000 receives new sensor observations. The sensor observations may, for example, correspond to data fused from multiple sensor readings. A sensor observation can indicate a position of an observed object. The process 2000 determines which, if any, real-world object maintained (such as in the data store 2014) the sensor observation corresponds to. If the sensor observation is determined not to correspond to any of the maintained real-world objects, then the process 2000 can create (e.g., in the data store 2014) a new real-world object corresponding to the sensor observation, as further described below with respect to operation 2012.

The process 2000 can associates received sensor observations with the real-world objects by steps including defining gating areas around each observation, computing a measurement likelihood matrix, and determining object state to measurement associations (or, equivalently, hypothesis to measurement association). The operation 2004 is further described with respect to FIG. 23.

Figure 23:
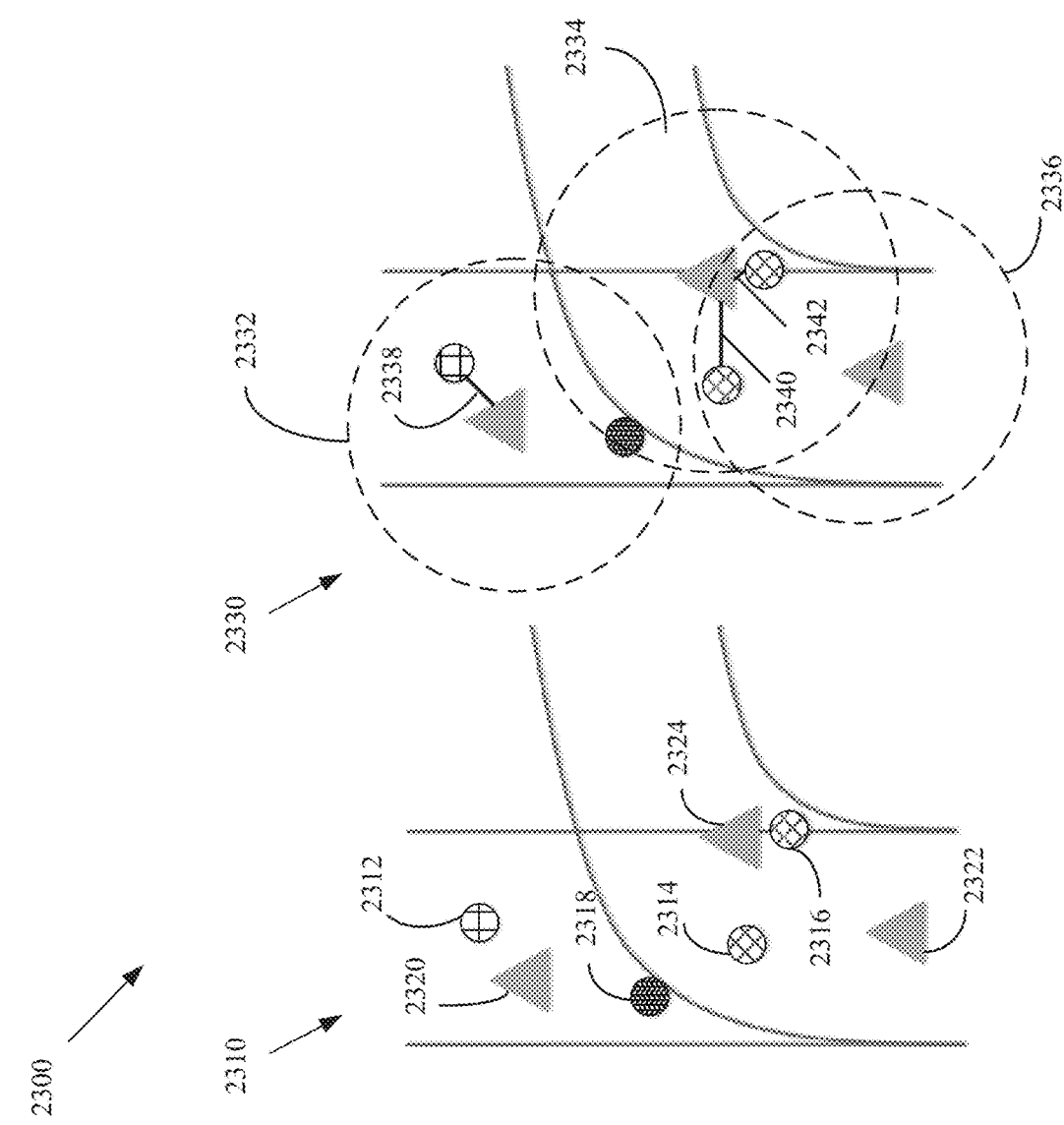
FIG. 23 is an example of associating sensor observations with real-world objects according to implementations of this disclosure.

FIG. 23 is an example 2300 of associating sensor observations with real-world objects according to implementations of this disclosure. A view 2310 illustrates that at a time t=T, the process 2000 receives sensor observations 2320, 2322, and 2324. An observation is a new measurement of the physical world. The process 2000, at the operation 2004, attempts to, for each of the observations, answer the question: Which real-world object does the observation correspond to (i.e., is associated with)? As described above, the process 2000 predicts future states (including locations) for each hypothesis. When the process 2000 receives sensor observations, the process 2000 updates the predictions based on the received observations from the physical world. The predictions can be updated by computing (e.g., calculating) the updated states from the predicted states and the sensor observations.

Table I below illustrates hypotheses corresponding to the view 2310 and maintained by the process 2000 at the time t=T (i.e., the time that the process 2000 receives the sensor data). At time t=T, the process 2000 has maintained four hypotheses, namely Hypotheses 1, 2, 3, and 4. For ease of reference, the hypotheses of Table I are numbered sequentially. However, it may be more accurate to read, for example, Hypothesis 2 as being "the first hypothesis associated with the Object 2" and Hypothesis 3 as being "the second hypothesis associated with the Object 2."

TABLE I

| Real World Object | Hypothesis | Intention | Predicted location |
| --- | --- | --- | --- |
| Object 1 | Hypothesis 1 | "go straight" | 2312 |
| Object 2 | Hypothesis 2 | "go straight" | 2314 |
| Object 2 | Hypothesis 3 | "turn right" | 2316 |
| Object 3 | Hypothesis 4 | "go straight" | 2318 |

Hypothesis 1 corresponds to an "Object 1" (e.g., a car) intention of "go straight" with a prediction that the Object 1 is at a location 2312 at time t=T. Hypotheses 2 and 3 are two hypotheses maintained for the same object, "Object 2" (e.g., a motorcycle). Hypothesis 2 corresponds to the "Object 2" intention of "go straight" with a prediction that the Object 2 is at a location 2314 at time t=T. Hypothesis 3 corresponds to the "Object 2" intention of "turn right" with a prediction that the Object 2 is at a location 2318 at time t=T. Hypothesis 4 corresponds to an "Object 3" (e.g., a truck) intention of "go straight" with a prediction that the Object 3 is at a location 2318 at time t=T.

A view 2330 of the example 2300 illustrates defining gating areas. To reduce clutter in FIG. 23, numerals of co-located graphical entities (i.e., locations and sensor observations) of the views 2310 and 2330 are omitted in the view 2330.

In an example, the gating areas are gating areas around each received observation. A gating area around an observation defines a search area for real-world objects near (i.e., proximal to) the sensor observation. More specifically, a gating area around an observation defines an area of search that includes predicted locations of real-world objects. That is, a gating area around an observation defines an area that can include real-world objects (e.g., objects maintained in the data store 2014), based on their predicted locations, and that may be associated with the observation. The gating areas are used as a first pass to filter out (i.e., exclude) objects (or, more specifically, hypotheses) that are unlikely to be associated with a sensor observation because they are too distant from the sensor observation.

For an object to be associated with a sensor observation, the object (i.e., the predicted location of the object) is expected to be proximal to the sensor observation. In an example, the gating area around an observation can be a circle. As such, the view illustrates a gating area 2332 that is centered at the sensor observation 2320, a gating area 2334 that is centered at the sensor observation 2324, and a gating area 2336 that is centered at the sensor observation 2322. In an example, the radius of the gating circle can be 10 meters.

The view 2330 illustrates that the Object 1 and the Object 3 are likely to be associated with the sensor observation 2320 since the predicted locations of the Object 1 and the Object 3, at time t=T, are encompassed by the gating area 2332; Object 3 and the Hypotheses 2 and 3 of Object 2 are likely associated with the sensor observation 2324 since the predicted locations of Object 2 under the Hypotheses 2 and 3 are encompassed by the gating area 2334; and the Object 2 (i.e., Hypotheses 2 and 3) is also likely associated with the sensor observation 2322 since the predicted locations of Object 2 (under Hypotheses 2 and 3) are encompassed by the gating area 2336.

In another example, the gating area can be drawn (not shown) around the predicted locations of the real-world objects instead of around the observations. The size (e.g., radius) of a gating area around a predicted location can depend on the state of the real-world object. For example, the velocity and location (e.g., continuous state information) of an object state under a hypothesis can be used to determine the radius. For example, the radius can be set based on maximum possible travel distance from time t=T−1 (e.g., the time that previous sensor observations were received) to t=T (e.g., the current time).

The operation 2006 can now calculate the likelihoods of associations between sensor observations and the real-world objects. The operation 2006 can determine a likelihood value for the possible association. Dynamics of the real-world objects can be used in calculating the likelihoods. For example, more, fewer, or other dynamics (e.g., object state information) than velocity, location, pose, direction of travel, and geometry can be used. For example, if an object is classified as "car" under a hypothesis, and the sensor observation indicates that the associated object is a large object (e.g., indicative of a truck), then the observation is unlikely to be associated with the object. For example, if an object state, for a given hypothesis, includes that the object is "go[ing] straight" at a speed of 65 MPH, a sensor observation that is 20 meters behind the predicted location of the object is unlikely to be associated with the given hypothesis.

In an example, the operation 2006 calculates a measurement likelihood matrix. Table II illustrates an example of a measurement likelihood matrix. The values in Table II are weighted sums of likelihoods between the hypotheses of an object and a sensor observation. For example, assuming that the weight the Hypothesis 2 (of the Object 2) is 0.75 and the weight of the Hypothesis 3 (of the Object 2) is 0.25, and assuming further that the measurement likelihood (calculated as described below) between the Hypothesis 2 and the sensor observation 2322 is 0.1 and the measurement likelihood between the Hypothesis 3 and the sensor observation 2322 is 0.3, then the measurement likelihood between the Object 2 and the sensor observation 2322 can be calculated as (0.1×0.25)+(0.3×0.75)=0.25. That is, the measurement likelihood between the Object 2 and the sensor observation 2322 is equal to ((the measurement likelihood between the Hypothesis 2 and the sensor observation 2322)×(the weight of the Hypothesis 2)+(the measurement likelihood between the Hypothesis 3 and the sensor observation 2322)×(the weight of the Hypothesis 3)).

TABLE II

|  | Sensor Observation 2320 | Sensor Observation 2322 | Sensor Observation 2324 |
| --- | --- | --- | --- |
| Object 1 | 0.6 | | |
| Object 2 | | 0.25 | 0.7 |
| Object 3 | 0.3 | | 0.15 |

As described above, using the gating areas, five possible (likely) associations were determined. As such, the table II includes a corresponding likelihood for each of the likely associations. However, as also indicated above, based on the predicted or estimated dynamics of the real-world objects, some of the likelihoods may not be calculated or may be set to zero.

Table II illustrates that there is a 0.6 likelihood that the Object 1 is associated with the sensor observation 2320; a 0.25 likelihood that the Object 2 is associated with the sensor observation 2322; a 0.7 likelihood that the Object 2 is associated with the sensor observation 2324; a 0.3 likelihood that the Object 3 is associated with the sensor observation 2320; and a 0.15 likelihood that the Object 3 is associated with the sensor observation 2324.

As further explained below, the sensor observations and the predicted states (e.g., predicted locations) may not be accurate due to noise. As mentioned above, a predicted state includes predicted locations, predicted velocities, predicted headings, etc. However, for ease of explanation, predicted locations are described. As such, a location of a sensor observation, ($x_o$, $y_o$), and a predicted location, ($x_p$, $y_p$), can each be drawn as a Gaussian distribution. The sensor observation can be modeled as a Gaussian distribution (i.e., an observed distribution) having an uncertainly and a mean at ($x_o$, $y_o$). The uncertainly associated with the sensor measurement can be given as (e.g., defined by) a measurement model. A measurement model of a sensor models the characteristics (e.g., noise) of the measurements received from the sensor. The sensor observation can be modeled as a Gaussian distribution (i.e., a predicted distribution) having an uncertainly and a mean at ($x_p$, $y_p$). The two Gaussian distributions can be combined to determine how likely is the predicted location to be the observed location.

In an example, associations can be determined based on the highest likelihoods. As such, the Object 1 is determined to be associated with the sensor observation 2320 (as illustrated by an association 2338); and the Object 2 is determined to be associated with the sensor observation 2324 (as illustrated by an association 2340 and an association 2342 with respect to Hypothesis 2 and Hypothesis 3, respectively). As such, the Object 3 is not associated with any sensor observation and the sensor observation 2322 is not associated with any of the real objects that are maintained by the process 2000.

A measurement likelihood can be calculated using equation (1):

$$\text{measurement likelihood} = \frac{1}{\sqrt{2\pi(\sigma_x^2 + \sigma_m^2)}} * e^{\frac{-(\mu_x - \mu_m)^2}{2(\sigma_x^2 + \sigma_m^2)}} \quad (1)$$

In the equation (1), $\mu_x$ is the mean of the prediction distribution, $\sigma_x$ is the standard deviation of the prediction distribution, $\mu_m$ is the mean of the observed distribution, and $\sigma_m$ is the standard deviation of the observed distribution.

Referring again to FIG. 20, at operation 2008, the process 2000 updates the likelihoods of some of the hypotheses. The process 2000 updates the likelihoods of those hypotheses (or, equivalently, those objects) which were found at the operation 2006 to be associated with the received sensor observations. That is, the process 2000 determines, based on a new sensor observation associated with an object, whether the object is more, or less, likely to follow the intention of a hypothesis.

The measurement likelihoods, as described with respect to Table II, can be used to update the likelihoods of the hypotheses at the operation 2008. That is, the measurement likelihoods can be used to update the weights of the particles. As mentioned a weight of a particle corresponds to the likelihood of the hypothesis represented by the particle. The weight of a particle can be computed using equation (2):

$$P(p, t=T+dt) = \text{(measurement likelihood at } t=T+dt) * P(p, t=T) \quad (2)$$

That is, the probability (i.e., likelihood) of the particle p (i.e., the hypothesis) at a time T+dt (i.e., a time when a new sensor observation is received) is given by the multiplication of the measurement likelihood at the time T+dt (i.e., the likelihood that the sensor observation is associated with the particle/hypothesis at the time T+dt) and the last calculated probability of the hypothesis (i.e., the likelihood of the hypothesis at the previous time t=T).

The calculated probabilities of the hypotheses of each object at time t=T+dt can then be normalized so that they add up to 1. For example, assume that 2 particles are associated with a real-world object and that the 2 particles, at time t=T, have respective probabilities 0.5 and 0.5. Assume further that the probabilities are calculated at t=T+dt, using the equation (2), to be 0.4 and 0.3, respectively. After the probabilities at time t=T+dt are calculated, the probabilities are normalized to (0.4/(0.4+0.3)) and (0.3/(0.4+0.3)), or 0.57 and 0.43, respectively.

At operation 2010, the process 2000 updates the states associated with those hypotheses which were found at the operation 2006 to be associated with the received sensor observations.

Whereas, the RBPF can be used as a general framework for the steps of the process 2000 to maintain particles, the RBPF does not specify how a particle, for example, moves (e.g., at the operation 2004) or how the state of the particle is updated (e.g., at the operation 2010). The Extended Kalman Filter (EKF) can be used for the predicting (i.e., at the operation 2004) and the updating (i.e., at the operation 2010).

As mentioned above, a motion model of an object, given an intention, can be used for predicting the future state of the object. That is, for example, the motion model can be used to predict how the particle (i.e., the hypothesis) evolves from time t to time t+1. The motion model models the dynamics of the object depending on the classification and other state parameters (e.g., velocity, pose). When a new sensor measurement is received (i.e., at the operation 2006) indicating a location of the object, EKF can be used (i.e., at the operation 2010) to fuse (e.g., combine, reconcile, merge, or otherwise fuse) the predicted state generated used the motion model with the new measurement to generate (e.g., calculate, determine, or otherwise generate) an updated state.

The equation (3) can be used to update an object state.

$$\begin{cases} K_t = P'_t J_h^T(x'_t)(J_h(x'_t) P'_t J_h^T(x'_t) + R_t)^{-1} \\ x_t^u = x'_t + K_t(y_t - h(x'_t)) \\ P_t^u = (I - K_t J_h(x'_t)) P'_t \end{cases} \quad (3)$$

In the equation (3), $x'_t$ is the predicted state at a time t, $y_t$ is the sensor observation state at the time t, $x_t^u$ is the updated state at the time t, $P'_t$ is the covariance of the predicted state at the time t, $J_h$ is the Jacobian of the measurement model, $R_t$ is the measurement noise covariance of the measurement model, and $P_t^u$ is the covariance of the updated state at the time t.

To reiterate, the process 2000 can initiate an RBPF to track an object (e.g., a real-world object). The process 2000 tracks and predicts trajectories for at least some of the objects in the data store 2014. As such, the process 2000 can run a collection of RBPFs to track and predict the objects. An RBPF is used to predict a continuous state of the respective object, to update the continuous state of the respective object, and to update the weight of a respective particle.

Figure 24:
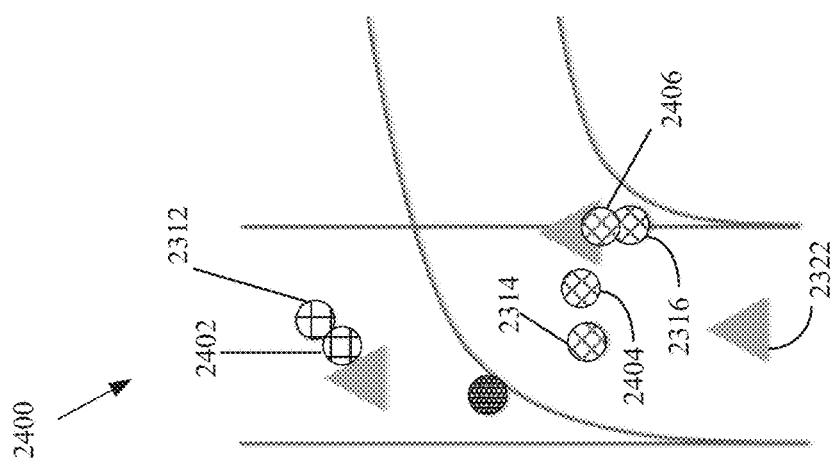
FIG. 24 is an example of updating states of hypotheses according to implementations of this disclosure.

FIG. 24 is an example 2400 of updating states of hypotheses according to implementations of this disclosure. The example 2400 illustrates the operations 2008 and 2010. As mentioned above, the locations of an object according to a hypothesis associated with the object are part of the state of the hypothesis (or, equivalently, the object). The location 2312 of the Object 1 according to the Hypothesis 1 is updated to be a location 2402, the location 2314 of the Object 2 according to the Hypothesis 2 is updated to be a location 2404; and the location 2316 of the Object 2 according to the Hypothesis 3 is updated to be a location 2406.

In an example, the locations are updated to coincide with the locations of the observations. That is, for example, the state location of Hypothesis 1 of the Object 1 is updated for time t=T to be the location of the sensor observations 2320 instead of the location 2312; the state location of Hypothesis 2 of the Object 2 is updated for time t=T to be the location of the sensor observations 2324 instead of the location 2314; and the state location of Hypothesis 3 of the Object 3 is updated for time t=T to be the location of the sensor observations 2324 instead of the location 2316.

In an example, the locations are updated considering noise (e.g., uncertainty) in the predicted locations and noise associated with the sensor measurements.

The predicted locations (e.g., the locations 2312-2318) are calculated (e.g., generated, predicted, estimated, or otherwise calculated) based on predicted paths. The predicted paths are generated using motion models associated with the object classifications. As such, some noise (e.g., uncertainly) may be associated with the predicted paths. Similarly, noise (e.g., uncertainty) may be associated with the sensor observations. For example, a sensor observation may indicate that an object is at a certain location, whereas, in reality, the object is 2 meters to the left.

As such, the process 2000 can merge the noisy predictions with the noisy sensor observation to generate the updated locations. In an example, the updated locations can be midpoints between the sensor observations and the associated predicted location. As such the location 2402 is midway between the sensor observations 2320 and the location 2312; the location 2404 is midway between the sensor observation 2324 and the location 2314; and the location 2406 is midway between the sensor observation 2324 and the location 2316.

Using the measurement likelihoods (see above with respect to Table II), pose, velocity, position, fewer, more, or other state information, the process 2000 can update the likelihoods of the hypotheses. For example, as the Hypothesis 1 is the only hypothesis associated with the Object 1, the likelihood of the Hypothesis 1, can remain the same (e.g., 1.0). For example, as the sensor observation 2324 is closer to the predicted state of the Hypothesis 3 (i.e., the location 2316) than the predicted state of the Hypothesis 2 (i.e., the location 2314), the likelihood of the Hypothesis 3 is increased (for example, from 0.5 to 0.8) and the likelihood of the Hypothesis 2 is decreased (for example, from 0.5 to 0.2).

Referring again to FIG. 20, at operation 2012, the process 2000 creates new objects. For example, as mentioned above, no hypothesis (or, equivalently, object) is associated with the sensor observations 2322. As such, the sensor observations 2322 may correspond to a new object that was not previously maintained by the process 2000. As such, the process 2000 can create a new object to correspond to the sensor observations 2322. The process 2000 can also assign (e.g., create) one or more hypotheses to the new object as described above.

In an example, a new sensor observation must meet certain criteria before a new object is created based on the sensor observation. If the sensor observation does not meet the criteria, the process 2000 can ignore the sensor observation and no object is created. In an example, the criteria can relate to a size (e.g., a bounding box, a geometry, etc.) of the sensor observation. For example, if the sensor observation is determined to correspond to an object that is 0.25 meters in each dimension, the object is deemed to be too small and the sensor observation is ignored. The sensor observation, in such a case, may be due to noise in the sensor measurement.

The operation 2002 modifies (i.e., by creating and maintaining) the particles. The operation 2002 can add and/or remove particles. For example, at a time t=0, the operation 2002 can create three particles corresponding to the "go left", "go straight," and "go right" hypotheses of the view 2110 of FIG. 21.

As mentioned above, the state of an object (denoted X) can be divided into discrete state information (denoted $X_d$) and continuous state information (denoted $X_c$). As such, $X=\{X_c, X_d\}$. As mentioned above, each of the discrete state information, $X_d$, and the continuous state information, $X_c$, can include one or more quantities.

The discrete state information, $X_d$, can be used to determine (e.g., select, use, or otherwise determine) a motion model for the object. The motion model can also be referred to as a state transition model or a process model. A motion model describes (e.g., as a mathematical, an algorithmic, or otherwise model) how an object moves, maneuvers, behaves, or the like given certain criteria. For example, given an intention of "turn right," a motion model of an object classified as "car" can indicate that the car slows down prior to turning and a motion model of an object classified as "truck" can indicate that the truck slows down and makes a wide right turn. As another example, given an intention of "go straight," a motion model of an object classified as "car" can indicate that the car maintains its current velocity (as indicated in the continuous state information $X_c$). Motion models can be available by object classification. The object classification can include a driving style. For example, a classification can be "aggressively driven car" and "a leisurely driven car." In an example, the driving style can be separate from the classification. That is, the driving style can be maintained as a state variable that is separate from the classification. As such, the motion model can be based on multiple state variables.

For each combination of discrete state values, one particle can be generated to estimate, using a motion model associated with the combination of the discrete state values, the continuous states. That is, the motion model defines (and can be used to determine) how a current state of an object, for a given hypothesis, changes to a future state. The future state is predicted, using the motion model, for discrete future points in time (e.g., every 0.5 seconds for the next 6 seconds).

The operation 2004 corresponds to answering the question: Where is a particle going? More specifically, the operation 2004 answers the question: Based on the intention of a hypothesis, and the current known and/or predicted state associated with the hypothesis, where is the real-world object of the hypothesis predicted to be? The operation 2004 answers the question by predicting the trajectory of the particle, as described above. For each of at least some of the maintained hypotheses, the operation 2004 predicts a trajectory.

The particles (i.e., representing the hypotheses) can also be used at the operation 2006 in determining the likelihoods of associations between sensor observations and hypotheses.

The particles can also be used at the operations 2008 to update the likelihoods of the hypotheses. That is, new sensor observations are used to update the likelihoods of the particles (i.e., the hypotheses). At the operation 2010, the process 2000 estimates (e.g., calculates) the state (e.g., locations) of the particles at the time of the received sensor observation.

Associations between sensor observations and real-world objects maintained in the data store 2014 are not known a priori. The associations between sensor observations and real-world objects are derived as described above with respect to the FIGS. 23-24.

FIG. 20 also includes a flowchart diagram of a process 2050 of using the world model in accordance with the present disclosure. As shown in the system 400 of FIG. 4, the decision-making module 406 and the trajectory planner 408 use data and/or decisions from the world model module 402 as inputs. As such, the process 2050 can be executed in response to a query from, for example, the decision-making module 406, the trajectory planner 408, other modules of the system 400, or other modules the vehicle 100 that use the real-world model.

In response to the query, at operation 2052, the process 2050 extracts (e.g., fetches, retrieves, reads, or otherwise extracts) the real-world objects from the data store 2014. At operation 2054, the process 2000 predicts (or updates) the trajectories of the extracted objects up to certain future time horizon (e.g., 6 seconds). At operation 2056, the process 2050 provides the real-world objects and the predicted trajectories to the requesting module.

Figure 25:
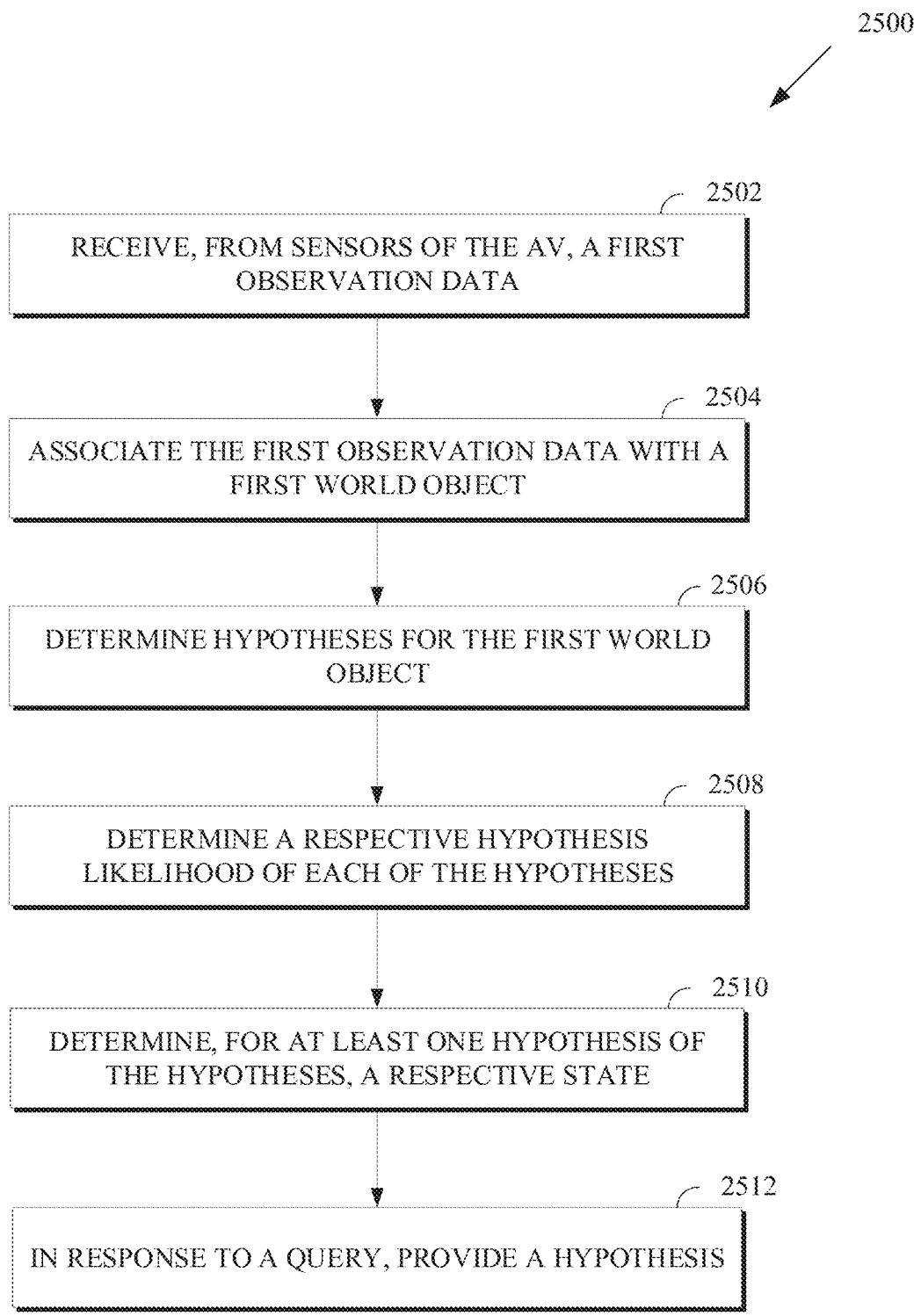
FIG. 25 is a flowchart diagram of a process for world objects tracking and prediction by an autonomous vehicle (AV) in accordance with the present disclosure.

FIG. 25 is a flowchart diagram of a process 2500 for world objects tracking and prediction by an autonomous vehicle in accordance with the present disclosure. A world object is as described with respect to real-world objects above. Some or all aspects of the process 2500 can be implemented in a vehicle, including the vehicle 100 shown in FIG. 1 and the vehicle 202 shown in FIG. 2, or in a computing apparatus, including the controller apparatus 232 shown in FIG. 2. In an implementation, some or all aspects of the process 2500 can be implemented in a system combining some, or all, of the features described in this disclosure. For example, the process 2500 can be utilized by world model module 402 of FIG. 4.

At operation 2502, the process 2500 receives, from sensors of the AV, a first observation data (i.e., first sensor observation). The first observation data can be received as described with respect to the operation 2006 of FIG. 20. At operation 2504, the process 2500 associates the first observation data with a first world object. The first observation data can be associated with the first world object as described with respect to the operation 2006 of FIG. 20. At operation 2506, the process 2500 determines hypotheses for the first world object. A hypothesis corresponds to an intention of the first world object. In an example, the hypothesis can additionally or instead correspond to a classification of the first world object. An intention can correspond to a possible path of the first world object. The hypotheses can be determined, for example, as described with respect to the operation 2002 of FIG. 20.

At operation 2508, the process 2500 determines a respective hypothesis likelihood of each of the hypotheses. A hypothesis likelihood indicates a likelihood that the first world object follows (e.g., proceeds in accordance with) the intention. A hypothesis likelihood can be determined as described, for example, with respect to the operation 2008 of FIG. 20. At operation 2510, the process 2500 determines, for at least one hypothesis of the hypotheses, a respective state. The state includes predicted positions of the first world object. The state can be determined, for example, as described with respect to the operation 2010 of FIG. 20.

In an example, the state can include more, fewer, and other information than the estimated current position, velocity, and geometry and associated uncertainties (e.g., likelihoods). The term "current" in this context means "last updated." For example, if a first object is last updated (e.g., when a sensor observation is received) at a time t=T0, then the most current state (e.g., position) of the first object is the state determined at the time t=T0 and the predicted states of the first object start a time t=T0+dt; if a second object is last updated at a time t=T1, then the most current state of the second object is the state determined at the time t=T1 and the predicted states of the second object start a time t=T1+dt. The state is determined (e.g., updated, predicted, or otherwise determined) based on the sensor observation and a sequence of predicted states. A predicted state can include predicted positions, predicted velocities, predicted geometries and their associated predicted uncertainties (e.g., likelihoods).

At operation 2512, the process 2500, in response to a query, provides a hypothesis of the hypotheses based on the respective hypothesis likelihood of each of the hypotheses. The process 2500 can provide the hypothesis as described with respect to the process 2050 of FIG. 20.

In an example, a hypothesis of the hypotheses can be determined using map information, such as HD map data, perceived map data, or other types of map data.

In an example, the process 2500 can include receiving, from the sensors of the AV, a second observation data, associating the second observation data with the first world object, and updating the state based on the second observation data. In an example, updating the state can be performed using Extended Kalman Filtering.

In an example, the process 2500 can include predicting, based on a motion model of the first world object, a respective trajectory for at least some of the hypotheses. In an example, predicting the respective trajectory for a hypothesis can further be based on one more, fewer, or other factors than the classification, the intention, and the reference driveline of the hypothesis. The respective trajectory can be predicted as described above with respect to the operation 2004 of FIG. 20. In an example, predicting a respective trajectory can include determining a reference driveline for the first world object, and predicting the respective trajectory, based on the motion model, such that a current predicted path of the first world object coincides with the reference driveline, as described, for example, with respect to FIG. 22.

In an example, the process 2500 can include receiving, from the sensors of the AV, a second observation data and associating the second observation data with one of the first world object and a second world object. The associating the second observation data with one of the first world object and the second world object can be as described with respect to the FIG. 23. As such, associating the second observation data with one of the first world object and the second world object can include determining, using a gating area about the second observation data, world objects within the gating area; and in a case that the first world object is within the gating area, determining an association likelihood that the second observation data corresponds to the first world object.

In an example, the process 2500 further includes updating the respective hypothesis likelihood of each of the hypotheses based on the association likelihood (for example, as described with respect to the equation (2)) and updating the state of the first world object (for example, as described with respect to the EKF).

In an example, the process 2500 further includes receiving, from the sensors of the AV, second observation data; on a condition that the second observation data meeting a criterion, associating the second observation data with a second world object; and on a condition that the second observation data not meeting the criterion, ignoring the second observation data.

Figures 26, 27:
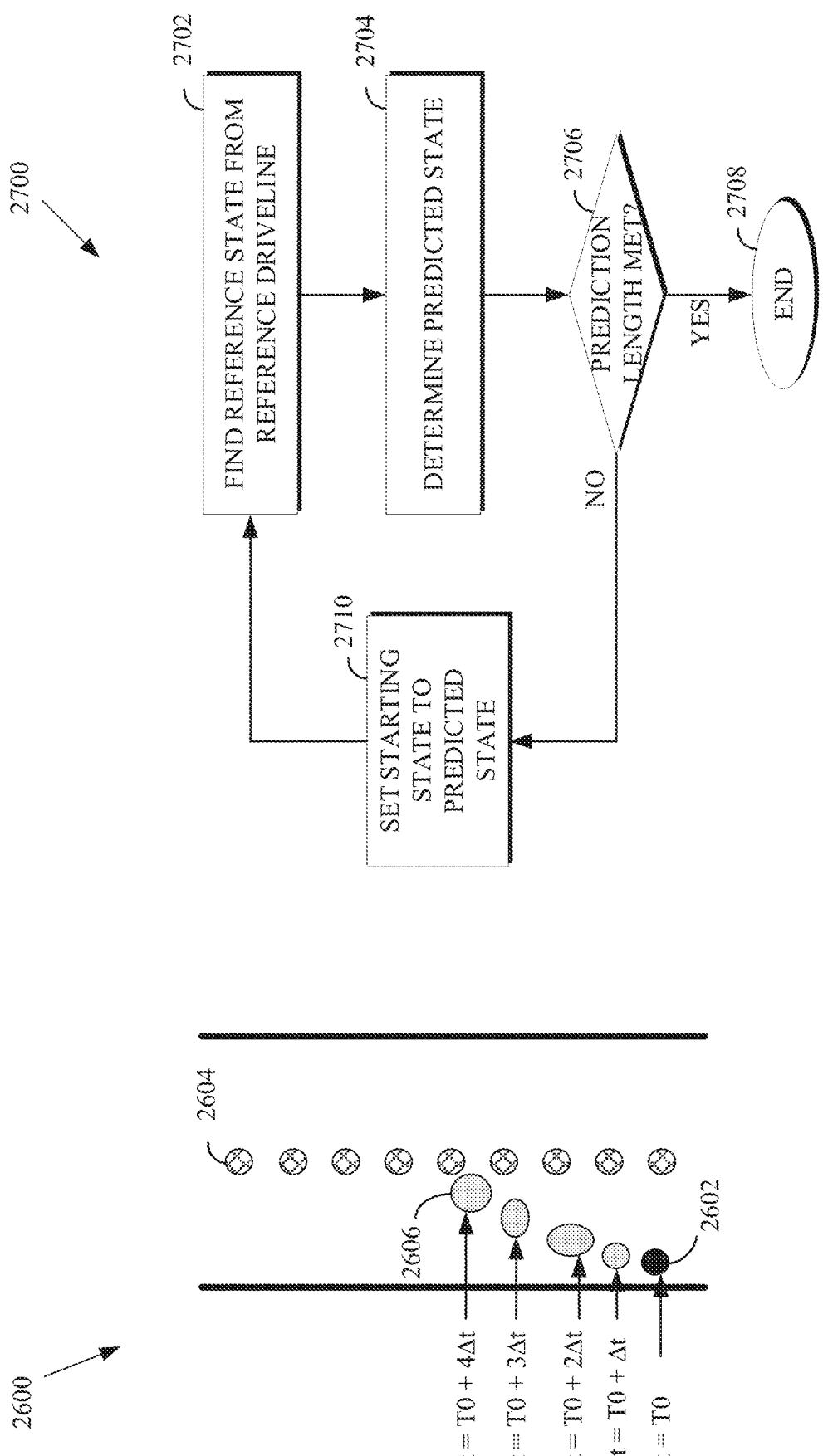
FIG. 26 is an example of predicting a trajectory according to implementations of this disclosure.
FIG. 27 is a flowchart diagram of a process for predicting a trajectory in accordance with the present disclosure.

FIG. 26 is an example 2600 of predicting a trajectory according to implementations of this disclosure. The example 2600 illustrates an example of the operation 2004 of FIG. 20. The example 2600 includes a real-world object 2602. The real-world object 2602 can be the vehicle 2202 of FIG. 22. The real-world object 2602 illustrates a position of the vehicle 2202 at a time t=T0 (e.g., the time at which the trajectory is to be determined).

The example 2600 also includes reference positions, such as a reference position 2604, along a reference driveline, such as the reference driveline 2208 of FIG. 22. The example 2600 also includes positions, such as a predicted position 2606, along the predicted trajectory, such as the trajectory 2212 of FIG. 22. The predicted trajectory consists of a sequence of predicted object states and covariances at future time points (e.g., timestamps). The predicted states include respective predicted positions at the future time points. The example 2600 illustrates four predicted states (including positions) at times: a predicted state at a time t=T0+$\Delta$t, a predicted state at a time t=T0+2$\Delta$t, a predicted state at a time t=T0+3$\Delta$t, and a predicted state at a time t=T0+4$\Delta$t (i.e., the predicted position 2606). At represents a time step (e.g., one half of a second, one second, etc.). The predicted positions along the predicted trajectory are illustrated as having differences sizes and shapes. The sizes and shapes illustrate the positions (e.g., (x, y) coordinates) covariance of the predicted states. As mentioned above, the predicted states can include velocity and geometry, which are not illustrated in the example 2600.

FIG. 27 is a flowchart diagram of a process 2700 for predicting a trajectory in accordance with the present disclosure. The process 2700 can be implemented by the operation 2004 of FIG. 20. Using a starting state (i.e., a state of the real-world object 2602 at a time t=T0) and a reference driveline (i.e., reference positions, such as the reference position 2604) along the reference driveline), the process 2700 determines (e.g., calculates, computes, or otherwise determines) a predicted trajectory, such as the trajectory 2212 of FIG. 22, that converges to the reference driveline.

The process 2700 receives (e.g., uses) the reference driveline as an input. The reference driveline consists of reference states for an object (i.e., a real-world object), which indicate the desired states of the object at specified timestamps (i.e., future time points). The process 2700 can use (e.g., receive as input, use a default, or otherwise use) a time length for the predicting. As mentioned above, the predicted trajectory consists of predicted states at specific timestamps (i.e., future time points). The process 2700 iterates until all predicted states, each at a respective timestamp, are calculated. At the first iteration of the process 2700, a starting state is set to the state at time t=T0.

At operation 2702, the process 2700 finds (e.g., computes, calculates, or otherwise finds) a reference state from the reference driveline given the starting state.

At operation 2704, the process 2700 determines (e.g., computes, calculated, etc.) a predicted state using the starting state and a reference state. The operation 2704 can use equation (4) to determine the predicted state.

$$\begin{cases} x'_{t+\Delta t} = f(x_t^{start}, x_t^{ref}, \Delta t) \\ P'_{t+\Delta t} = J_f(x_t^{start}, x_t^{ref}, \Delta t) P_t^{start} J_f^T(x_t^{start}, x_t^{ref}, \Delta t) + Q_t \end{cases} \quad (4)$$

In the equation (4), $x_t^{start}$ is the start state at time t, $x_t^{ref}$ is the reference state at time t, $\Delta t$ is the prediction step size, $x_{t+\Delta t}'$ is the predicted state at time t+$\Delta t$, $P_t^{start}$ is the covariance of the starting state at time t, $J_f$ is the Jacobian of the motion model of the object whose trajectory is being predicted, $Q_t$ is the motion model noise covariance, and $P_{t+\Delta t}'$ is the covariance of the predicted state at t+$\Delta t$.

At operation 2706, the process 2700 determines whether the prediction length is met. That is, the process 2700 determines whether a respective predicted state for all desired future time points have been calculated. If so, the process 2700 terminates at 2708; otherwise proceeds to operation 2710. At the operation 2710, the process 2700 set the starting state to the predicted state at the operation 2704. The process 2700 then proceeds to the operation 2702 to predict the next state.

Figure 28:
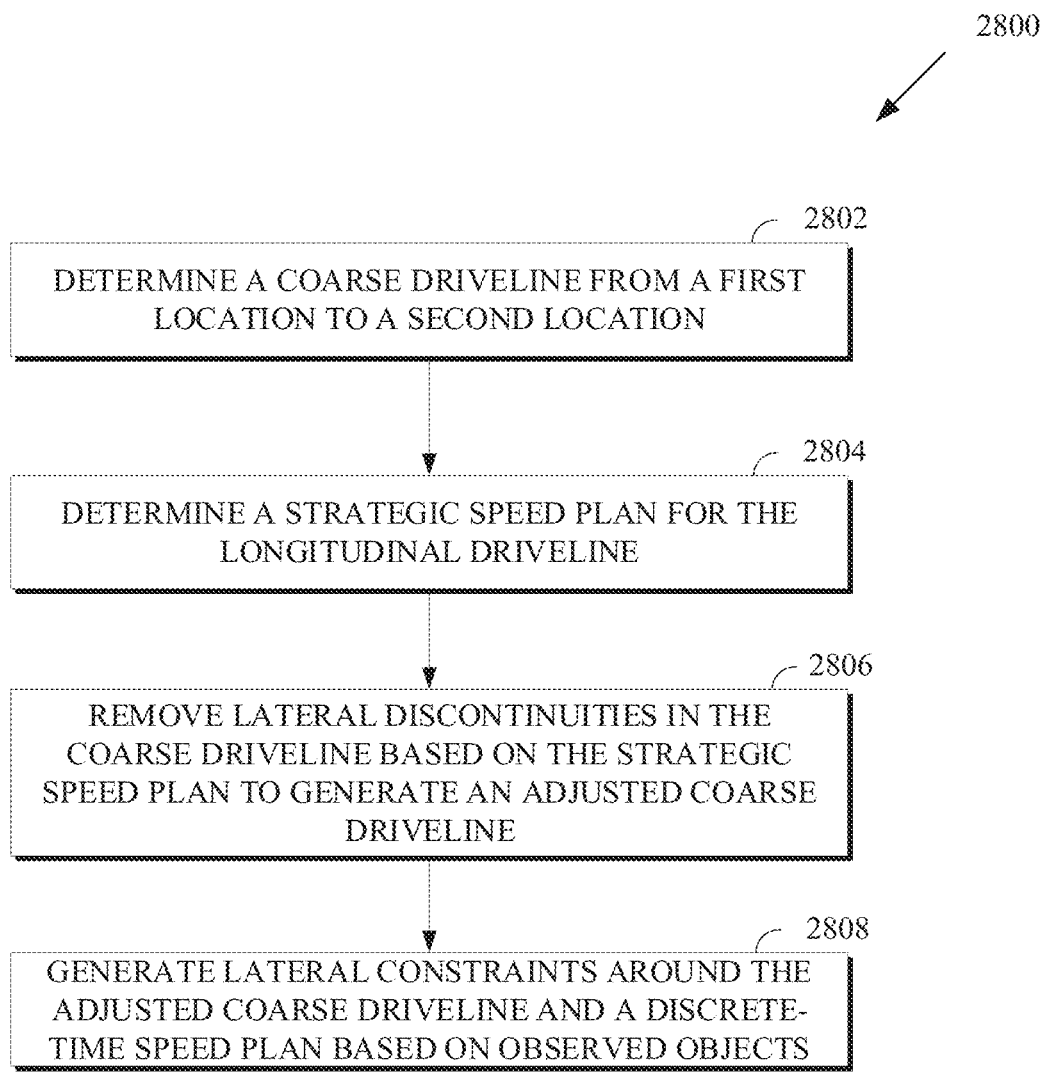
FIG. 28 is a flowchart diagram of a process for planning a trajectory for an autonomous in accordance with the present disclosure.

FIG. 28 is a flowchart diagram of a process 2800 for planning a trajectory for an autonomous in accordance with the present disclosure. The process 2800 can be implemented in or by an autonomous vehicle (AV), such as the vehicle 100 shown in FIG. 1 or the vehicle 202 shown in FIG. 2. The AV may be a semi-autonomous vehicle, or any other vehicle implementing autonomous driving. The AV is configured to traverse a portion of a vehicle transportation network. The process 2800 can be implemented by a trajectory planner, such as the trajectory planner 500 of FIG. 5. The process 2800 determines a coarse driveline from a first location to a second location, determines a strategic speed plan for the coarse driveline, removes lateral discontinuities in the coarse driveline to generate an adjusted coarse driveline, and generates lateral constraints around the adjusted coarse driveline and a discrete-time speed plan based on observed objects. The AV can then be operated according to the discrete-time speed plan. In an example, the AV can be operated according to an optimized trajectory, such as described with respect to the trajectory optimization layer 508 of FIG. 5.

At operation 2802, the process 2800 determines a coarse driveline from a first location to a second location. The first location and the second location can be locations as described with respect to the drive goals 501 of FIG. 5. The coarse driveline can be a coarse driveline that is determined by a driveline concatenation module, such as the driveline concatenation module 522 of FIG. 5. As such, the coarse driveline can be determined as described with respect to the driveline concatenation module 522 of FIG. 5. The coarse driveline may not include speed information. However, in some examples, the coarse driveline can include speed limit information. The coarse driveline can include discontinuities.

In an implementation, determining the coarse driveline can include splicing (e.g., linking, fusing, merging, connecting, integrating, or otherwise splicing) input data, such as from the driveline data layer 502, to determine the coarse driveline along the longitudinal direction (e.g., along the path of the autonomous vehicle), as described with respect to the driveline concatenation module 522 of FIG. 5. For example, to get from location A (e.g., work) to location D (e.g., home), to determine the coarse driveline, the driveline concatenation module 522 can use input data from the parking lot data 518 to determine a path from the work location parking spot to the main road, can use data from the HD map data 510 to determine a path from the main road to the home, and can use data from the recorded paths data 514 to navigate from the main road into the garage at home.

In an implementation, determining the coarse driveline can include obtaining driveline data comprising first data relating to a first segment from the first location to the second location and second data relating to a second segment from the first location to the second location and concatenating the first data and the second data, as described with respect to the strategic speed plan module 524 of FIG. 5. In an example, the first data can be HD map data, such as described with respect to the HD map data 510 of FIG. 5. In an example, the second data can be recoded path data, such as described with respect to the paths data 514 of FIG. 5. In an example, the first data or the second data can include HD map data, such as described with respect to the HD map data 510 of FIG. 5, and teleoperation data, such as described with respect to the teleoperation map data 512 of FIG. 5. In some examples, the first data and/or the second data can include any combination of HD map data 510, teleoperation map data 512, recorded paths data 514, preceding vehicle data 516, parking lot data 518, and perceived path data 520.

At operation 2804, the process 2800 determines a strategic speed plan for the coarse driveline. The strategic speed plan can be a strategic speed plan determined by a strategic speed plan module, such as the strategic speed plan module 524 of FIG. 5. As such, the strategic speed plan module 524 determines specific speed(s) along the different portions of the coarse driveline.

In an example, determining the strategic speed plan can include using speed limits and acceleration limits, such as described with respect to FIG. 7, to determine the strategic speed plan. The speed limits can include at least one of road speed limits (such as described with respect to the road speed limits 702 of FIG. 7), curvature speed limits (such as described with respect to the curvature speed limits 704 of FIG. 7), and seamless autonomous mobility data (such as described with respect to the SAM data 706 of FIG. 7.). As described above, the seamless autonomous mobility data can be data collected from other vehicles. In an example, the seamless autonomous mobility data can be received at the AV from a networked server. In an example, the acceleration limits can include at least one of vehicle acceleration limits (such as described with respect to the vehicle acceleration limits 710 of FIG. 7) and comfort limits (such as described with respect to the comfort limits 712 of FIG. 7).

At operation 2806, the process 2800 removes lateral discontinuities in the coarse driveline based on the strategic speed plan to generate an adjusted coarse driveline. The coarse drivelines can include two or more segments (e.g., referred to as coarse drivelines). The process 2800 synthesizes coarse drivelines to remove lateral discontinuities in the coarse driveline. That is, the process 2800 can synthesize coarse drivelines that connect lateral discontinuities in the coarse driveline based on the strategic speed plan and target lateral rates. Considering the coarse driveline with lateral discontinuities and the strategic speed profile, the operation 2806 determines the start and end locations of a lane change and synthesizes a driveline connecting the two locations. The drivelines can be synthesized by a driveline synthesis module, such as the driveline synthesis module 526 of FIG. 5. As such, removing the lateral discontinuities in the coarse driveline can include synthesizing a driveline for merging from a first lane to a second lane. As such, removing the lateral discontinuities can include determining a merge speed plan for merging from a first lane to a second lane.

At operation 2808, the process 2800 generates lateral constraints around the adjusted coarse driveline and a discrete-time speed plan based on observed objects The generated discrete-time speed plan is a collision-free discrete time-speed plan. That is, the generated discrete-time speed plan is such that the AV can be operated to avoid colliding (such as by stopping, yielding, decelerating, accelerating, etc.) with the observed objects. The process 2800 can generate lateral constraints and the discrete-time speed plan as described with respect to the object avoidance layer 506 of FIG. 5. As such, in an example, generating lateral constraints can include determining boundaries of a drivable area based on static objects, as described with respect to the module 530 of FIG. 5. In an example, generating a discrete time-speed plan can include applying a longitudinal constraint based on a classification of a dynamic object, as described with respect to the module 532 of FIG. 5 and the operation 830 of FIG. 8.

Figure 29:
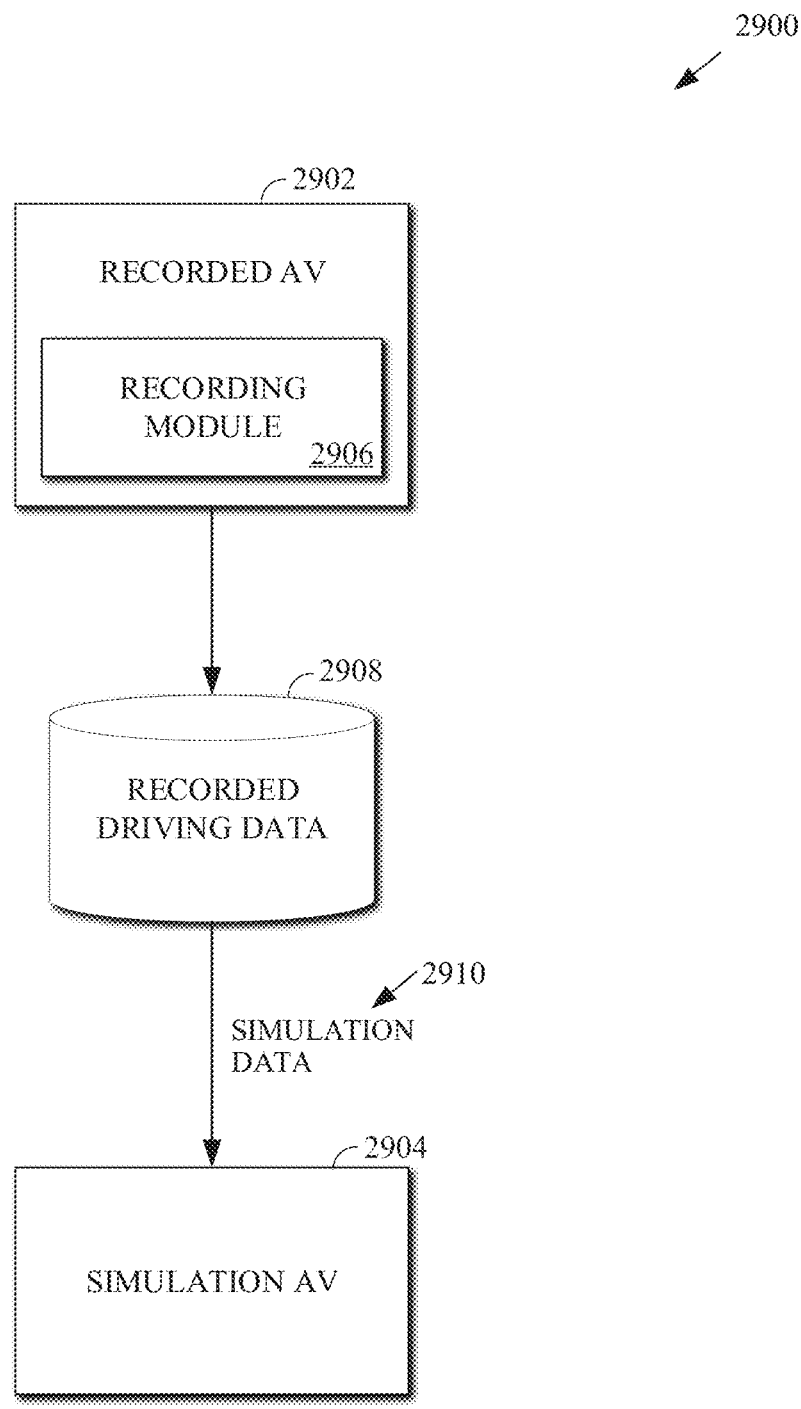
FIG. 29 is an example of a system for time-warping for autonomous driving simulation according to implementations of this disclosure.

FIG. 29 is an example of a system 2900 for time-warping for autonomous driving simulation according to implementations of this disclosure. The system 2900 includes a recorded AV 2902 and a simulation AV 2904. In an example, the recorded AV can be an autonomous vehicle that is driven in the real world.

As the recorded AV 2902 is being driven, a recording module 2906 records data (i.e., recorded driving data 2908) related to the drive. In an example, an operator can cause the recording module 2906 to initiate and to stop the recording of the recorded driving data. However, other means can be available for initiating and stopping the recoding of the recorded driving data 2908. For example, the recording module 2906 can start recording when the recoded AV is at a predefined start location and can stop recording when the recorded AV is a predefined stop location.

The recorded driving data 2908 can be stored in a memory of the recorded AV 2902, such as the memory 122 of FIG. 1. The recorded driving data 2908 can be transmitted, as they are being recorded, at intermittent times, after the drive is complete, or a combination thereof, to a network-based location, such as a cloud-based location. Regardless of the storage location of the recoded driving data 2908, the recorded driving data 2908 can be made available to the simulation AV 2904. In some examples, simulation data 2910, which can be a subset of the recorded driving data 2908 can be used by the simulation AV 2904 to simulate autonomous driving.

In an example, the recorded AV 2902 can be the vehicle 100 of FIG. 1 or the vehicle 202 of FIG. 2. The recorded AV 2902 can be configured as described herein. That is, for example, the recorded AV 2902 can include one or more of the components described with respect to the system 400 of FIG. 4. For example, the recorded AV 2902 can include a trajectory planner (such as the trajectory planner 408 of FIG. 4), a world model module (such as the world model module 402 of FIG. 4), a decision making module (such as the decision-making module 406 of FIG. 4), a route planner (such as the route planning module 404 of FIG. 4), a reactive trajectory control module (such as the reactive trajectory control module 410 of FIG. 4), fewer, more, or other modules; for example, the recorded AV 2902 can perform more, fewer, or other of the processes described herein, such as a process for determining a drivable area and a discrete-time speed plan (such as described with respect to FIG. 8), a process for determining static boundaries (such as described with respect to FIG. 13), a process for object avoidance (such as described with respect to FIG. 18), a process for world modeling (such as described with respect to FIG. 20), a process for world objects tracking and prediction (such as described with respect to FIG. 25), and a process for predicting a trajectory (such as described with respect to FIG. 26). However, that need not be the case. That is, the recorded AV 2902 need not be configured as described herein.

In an example, the simulation AV 2904 can include one or more of the components described with respect to the system 400 of FIG. 4. For example, the simulation AV 2904 can include a trajectory planner (such as the trajectory planner 408 of FIG. 4), a world model module (such as the world model module 402 of FIG. 4), a decision making module (such as the decision-making module 406 of FIG. 4), a route planner (such as the route planning module 404 of FIG. 4), a reactive trajectory control module (such as the reactive trajectory control module 410 of FIG. 4), fewer, more, or other modules; for example, the simulation AV 2904 can perform more, fewer, or other of the processes described herein, such as a process for determining a drivable area and a discrete-time speed plan (such as described with respect to FIG. 8), a process for determining static boundaries (such as described with respect to FIG. 13), a process for object avoidance (such as described with respect to FIG. 18), a process for world modeling (such as described with respect to FIG. 20), a process for world objects tracking and prediction (such as described with respect to FIG. 25), and a process for predicting a trajectory (such as described with respect to FIG. 26). The components and/or modules of the simulation AV 2904 need not be the same as the components and/or modules of the recorded AV 2902. For example, and similarly for other modules, components, and/or processes, while the recorded AV 2902 can include a first decision-making module and the simulation AV can include a second decision-making module, the implementations, algorithms, types of decisions, more, fewer, or other aspects of the first decision-making module and the second decision-making module can differ.

FIG. 30 is an example of recorded driving data 3000 according to implementations of this disclosure. As mentioned above, recorded driving data (or a subset thereof) from a recorded AV can be used by a simulation AV in a simulation of autonomous driving. The recoded driving data 3000 can be the recorded driving data 2908 of FIG. 29. As such, the recoded driving data 3000 can be recorded by a recoding module, such as the recording module 2906 of FIG. 29. For ease of explanation, the recoded driving data 3000 is shown in tabular format. However, the recoded driving data 3000 can be captured (e.g., stored, organized, etc.) in any other suitable format. The recoded driving data 3000 includes data entries (further explained below), such as recorded entries 3002A-E.

In an example, each recorded entry can include a time 3004 of the recoded entry, a type 3006 of the recorded entry, a position 3008 of the recorded AV at the time 3004 that the recorded entry was recorded, objects 3010 that are maintained by the recorded AV at the time 3004, one or more images 3012, and other data 3014.

The time 3004 can be a relative time from a recording start time of the recorded driving data. The recording state time can be the start of the drive that is being recorded or the time that recording is started (e.g., initiated). As such, examples of values of the time 3004 include "10 seconds from the start of the recording," "20 seconds from the start of the recording," etc. The time 3004 can be an absolute time (e.g., clock time). The time 3004 can be a sampling number (e.g., a sequence number). For example, the time of the first recorded data entry can have a time of 1, the time of the second recorded data entry can have a time of 2, and so on.

The type 3006 indicates the type of the data entry. In an example, the recorded driving data 3000 can include different types of entries. For example, "POSITION" entries, such the entries 3002A and 3004C are data entries that are recorded according to a predefined sampling rate. For example, the sampling rate can be 1 recorded entry every 10 milliseconds, 1 recorded entry every 20 milliseconds, 1 recorded entry every 1 second. Any other sampling rate can be available. The recorded driving data 3000 can include entries that record events, which may be considered interesting and, therefore, warrant recording. For example, the entry 3002D, corresponding to an "OPERATOR" type entry, records that at time t17.3, the operator overrode the decision-making of the recorded AV (e.g., a decision to proceed at a certain speed) by pressing on the brake, as indicated by "SLOW" in the other data 3014. The entry 3002, corresponding to the entry type "OBSERVATION" indicates that the recorded AV received new sensor observation at time t11.1. The new sensor observation can be received by the AV as described with respect to 2502, 2504, or a combination thereof of FIG. 25. The entry 3002E, corresponding to a decision (i.e., determined by the decision-making algorithm of, and executed by, the recorded AV), indicates that the recorded AV "switch[ed] to the right lane" at time t11.8.

The position 3008 can be the Global Position Location (GPS) of the recorded AV at the respective time of the data entry, the time 3004. The position 3008 can be, or can include, data such that at least one of a longitudinal and a lateral position of the recorded AV can be determined from the position 3008.

The objects 3010 can be or can include the list of objects described with respect to the world model module 402 of FIG. 4. That is, the objects 3010 can include the list of objects maintained by the world model module 402 at the time 3004 of the recoded data entry. The image 3012 can include one or more images of the sensing area of the recorded AV at the time 3004 of the recorded data entry. The other data 3014 can include, for at least some of the data entries of the of the recorded driving data 3000, other entry-type specific and useful information.

In an example, recorded driving data can include the time 3004, the position 3008, the objects 3010, and the image 3012. In another example, the recorded driving data can include the time 3004, the position 3008, and the objects 3010. In yet another example, the recorded driving data can include the time 3004, the position 3008, and the image 3012.

As described above, the recorded driving data 3000 includes sensing data, movement data, and decision-making data of the recorded AV as the recorded AV drives on a road. The sensing data corresponds to the objects and/or raw sensor observations, such as described with respect to the objects 3010, the image 3012, or a combination thereof. The movement data corresponds to the sequence of position information, over time, of the recorded AV, such as described with respect to the position 3008. The decision-making data corresponds, for example, to entries of type "DECISION," as described above.

In an implementation, the data entries of type OBSERVATION can be used to influence the simulation AV; the data entries of type POSITION can be used to regulate (i.e., adjust by speeding up or slowing down) the playback speed of the recorded driving data (as further described below); and the data entries of type DECISION are not used by the simulation AV.

FIG. 31 is an example of simulation data 3100 according to implementations of this disclosure. The simulation data 3100 can be the simulation data 2910 of FIG. 29. The simulation data 3100 corresponds by the subset of the recorded driving data, such as the recorded driving data 3000 of FIG. 30, that is useful to perform an autonomous driving simulation. In an example, the simulation data 3100 can be extracted from the recorded driving data 3000. That is, for example, the simulation data 3100 can be extracted to another data structure, to another data storage location, the like, or a combination thereof that is separate from the recorded driving data 3000. In another example, the simulation data 3100 can a filtering in place (e.g., a logical view) of the recorded driving data 3000.

In a case where the decision-making algorithms of the simulation AV are to be tested, any data entries in the recorded driving data relating to decision-making are not included in the simulation data 3100. The data relating to the decision-making, if any, are not included since it is data that is to be generated by the simulation AV during the simulation. Similarly, any data relating to operator intervention are also not includes in the simulation data 3100. The simulation data 3100 includes the movement data (i.e., the positions of the recorded AV) and the sensing data (i.e., the objects and or images as described with respect to FIG. 30).

The sensing data and the movement data are used by the simulation AV. The simulation AV makes decisions (e.g., using decision-making algorithms or modules) based on the sensing and movement data. Decision-making algorithms decide a next or future step (e.g., a maneuver, an acceleration, a deceleration, a stop, etc.) based on what is currently sensed (e.g., the currently sensed and identified objects). For example, and as described above, the sensing data can be used to create and maintain hypotheses for at least some of the identified objects in the sensing range, and to, accordingly, determine (e.g., calculate) a trajectory. As such, the movement data and the sensing data can be considered as inseparable data for the purpose of decision making by the decision-making algorithms of the simulation AV.

The recorded AV (more specifically, the sensors of the recorded AC) senses other road users using a line-of-sight of the sensors. The line-of-sight is determined by (e.g., constrained by, defined by, limited to) the position of the recorded AV. For the simulation AV to use a sensing datum (e.g., an entry of the recorded driving data) of the recorded AV, the position of the simulation AV during a simulation must be synchronized with the position of the recorded AV at the time of the sensing datum such that the sensing datum is within the sensing range of the simulation AV. If the sensing datum is not within the sensing range of the simulation AV, then one or more decisions of the decision-making algorithms of the simulation AV may be made using incomplete data and/or an inaccurate view of the environment of the simulation AV. That is, the world view (e.g., the actual collection of other road users) of the simulation AV may be incomplete. This is undesirable because a purpose of using the recorded driving data in a simulation is to test (e.g., observe) the decisions of simulation AV under the same conditions as those of the recorded AV.

Referring to FIG. 31, the simulation data 3100 are illustrated on a timeline 3102. The timeline 3102 includes ellipses 3104 and 3106 to illustrate that the simulation data 3100 can include additional simulation data that are earlier and/or later in time than those illustrated. Each simulation datum, such as a simulation datum 3108, is illustrated with a numbered box for ease of reference. Each simulation datum includes sensing and movement information. As the simulation data 3100 can be, or can be derived from, the recorded driving data 3000 of FIG. 30, the simulation data 3100 can have the same sampling rate as the recorded driving data 3000. The timeline 3102 illustrates that five simulations data points are available between every two time points that are $\Delta t$ time units apart. However, the sampling rate can be any sampling rate.

Figure 32:
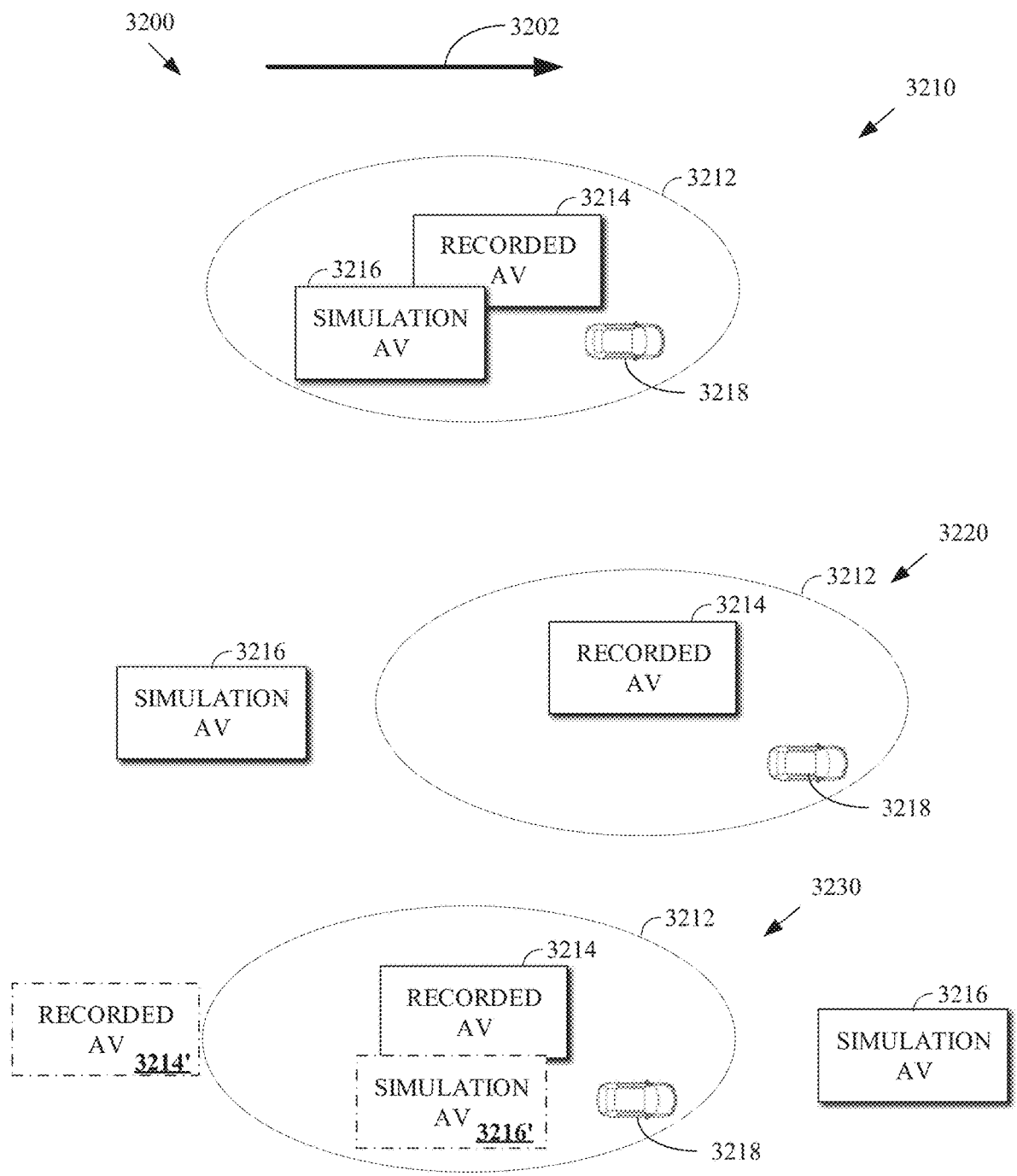
FIG. 32 illustrates examples of positions of a recorded AV and positions of a simulation AV at a time T.

FIG. 32 illustrates examples of positions 3200 of a recorded AV and positions of a simulation AV at a time T. The positions 3200 includes an example 3210, an example 3220, and an example 3230. Each of the examples 3210, 3220, 3230 includes a recorded AV 3214, such as the recorded AV 2902 of FIG. 29, and a simulation AV 3216, such as the simulation AV 2904 of FIG. 29. An arrow 3202 illustrates the assumed direction of travel of the recorded AV 2902 and the simulation AV 2904.

The examples 3210, 3220, 3230 illustrate positions of the simulation AV 3216 with respect to a sensing range 3212 of the recorded AV 3214. The sensing range 3212 corresponds to the field of view of the sensors of the recorded AV 3214. The sensing range 3212 can be measured with respect to an eye-point (e.g., a point that can be considered to be the center of all the sensors) of the recorded AV. In an example, the field of view can be in the range of 50-100 meters in each of the longitudinal directions (e.g., in front and behind) and in the range of 10-50 meters in each of the lateral directions (e.g., on the right and the left sides) of the recorded AV. Each of the examples 3210, 3220, 3230 also includes an other road user 3218 that is within the sensor range of the recorded AV 3214.

Since, as described with respect to FIGS. 30-31, simulation data that may be a subset of recorded driving data from the recorded AV 3214 is used by the simulation AV 3216, the sensing range of the simulation AV 3216 is assumed to coincide with the sensing range of the recorded AV 3214.

The example 3212, which can be considered as an idea situation, illustrates a situation where the simulation AV 3216 remains within the sensing range 3212 of the recorded AV 3214. As such, no drift (or, at least, no significant drift) occurs between the positions of the simulation AV 3216 and the recorded AV at the time T.

Simulation data, such as the simulation data 3100 of FIG. 31, is used by the simulation AV 3216 in order to perform decision making and plan a trajectory. At sampling times corresponding to the sampling rate of the simulation data, a respective simulation datum is provided to (or, equivalently, accessed or retrieved by) the decision-making algorithms and/or other modules described herein.

In the example 3212, the recorded AV 3214 and the simulation AV 3216 remain co-located within the sensing range 3212 of the recorded AV. As such, each simulation datum of the simulation data (e.g., the simulation data 3100 of FIG. 31) can be said to "make sense" to the simulation AV 3216. This is so because the recorded AV 3214 and the simulation AV 3216 can "see" the same other world objects (such as the other road user 3218), and the decision-making algorithms of the simulation AV 3216 can make decisions accordingly. For example, if the recorded AV detected an oncoming vehicle (such as the oncoming vehicle 302 of FIG. 3), then that oncoming vehicle (or a representation thereof) is recorded in the recorded driving data; and via the simulation data, the oncoming vehicle is visible to the simulation AV. The simulation AV, thus, can interact (virtually) with the representation of the oncoming vehicle according to the decision-making, trajectory planning, and/or other processes and modules of the simulation AV 3216.

The examples 3220 and 3230 illustrate situations where the positions of the recorded AV 3214 and the simulation AV 3216 have drifted. The examples 3220 and 3230 illustrate situations where the time-warping for autonomous driving simulation is not applied.

The examples 3220 and 3230 illustrate situations where the positions of the recorded AV 3214 and the simulation AV 3216 are not synchronized according to implementations of this disclosure. That is, in the examples 3220 and 3230, simulation data are presented to the simulation AV 3216 at the same time steps that the recorded driving data was captured by the recorded AV 3214. That is, for example, regardless of whether the positions of the recorded AV and the simulation AV have drifted, the same recorded data points (e.g., simulation data 11-15 of FIG. 31) recorded between two time points (e.g., between $4+2\Delta t$) and $(t+3\Delta t)$ of FIG. 31) of the recorded drive are used by the simulation AV between the same two time points of the simulation.

The example 3220 illustrates a case where the simulation AV 3216 lags behind the recorded AV 3214 at the time T. "Lags behind" can mean that at the time T, and according to the recorded driving data, the position (e.g., in the longitudinal direction and along the trajectory of travel) of the recorded AV 3214 is ahead of the position of the simulation AV 3216 at the time T of the simulation. The drift can be due to one or more of the reasons described above or to any other reason. Note that the simulation datum at the time T includes the other road user 3218.

As, at the time T, the other road user 3218 is outside the sensing range of the simulation AV 3216 (given its position), processes or modules of the simulation AV 3216 do not "see" the other road user 3218. For example, the other road user 3218 may not be maintained in a world model module, such as the world model module 402 of FIG. 4, of the simulation AV 3216.

Still referring to the example 3220. For simplicity of explanation, assume that the other road user 3218 is stationary and assume further that at time T', which is later than T, the position of the recorded AV 3214 is such that the recorded AV 3214 no longer sees (i.e., senses) the other road user 3218. As such, at time T', the world model of the recorded AV 3214 does not include the other road user 3218 and, therefore, a recorded datum at time T' would not include the other road user 3218. Assume further that, at time T', the position of the simulation AV 3216 is within the sensing range 3212 illustrated in the example 3230. As such, at time T', even though the simulation AV 3216 should "see" the other road user 3218, the simulation AV 3216 receives a simulation datum (corresponding to the recorded datum at time T') that does not include the other road user 3218. As such, while the simulation AV 3216 should make decisions taking the other road user 3218 into account, the simulation AV 3216 makes decisions as if the simulation AV 3216 is traversing an empty world (i.e., as the other road user 3218 is not present).

As such, in "lag cases," such as described above with respect to the example 3220, sensor messages (e.g., simulation datums) from recorded AV 3214 are said to be received too far ahead for the simulation AV 3216 to respond.

The example 3230 illustrates a case where the simulation AV 3216 leads the recorded AV 3214, which can mean that at the time T, and according to the recorded driving data, the position (in the longitudinal direction and along the trajectory of travel) of the recorded AV 3214 is behind of the position of the simulation AV 3216 at the time T of the simulation. The simulation datum at time T includes the other road user 3218.

Still referring to the example 3230. Assume that, at a time T" that is before the time T, the simulation AV 3216 is in the area of the sensing range 3212 and that the recorded AV is lagging behind. The position of the simulation AV at time T" is illustrated with a dashed simulation AV 3216', and the position of the recorded AV at time T" is illustrated with a dashed recorded AV 3214'. As the other road user 3218 is outside the sensing range of the dashed recorded AV 3214', a recorded driving datum corresponding to the time T" does not include the other road user 3218. As such, the simulation AV at time T" does not receive the other road user 3218 when, in fact, it should. As such, while the simulation AV 3216' should make decisions taking the other road user 3218 into account, the simulation AV 3216' makes decisions as if the simulation AV 3216 is traversing an empty world.

As such, in "lead cases," such as described above with respect to the example 3230, sensor messages (e.g., simulation datums) from recorded AV 3214 are said to be received too late for the simulation AV 3216 to respond (in this case, to the presence of the other road user 3218).

Additionally, at the time T, when in fact the simulation AV 3216 may be traversing an empty world, the simulation AV 3216 receives a simulation datum that includes the other road user 3218 since the other road user 3218 is included in the recorded driving datum corresponding to time T. As such, the simulation AV 3216 may make decisions as if the other road user 3218 is within the sensor range of simulation AV 3216 when, in fact, the other road user 3218 is not.

To overcome problems associated with using recorded driving data in simulations of autonomous driving, such as those described with respect to the examples 3220 and 3230, implementations according to this disclosure time-warp the simulation data, which may be a subset of recorded driving data received from a recorded AV, for autonomous driving simulation by a simulation AV. The problems may be due to drift in the positions (as captured in the recorded driving data) of the recorded AV and the positions of the simulation AV (as determined by the decision-making algorithms of the simulation AV).

The time-warping of the simulation data can be accomplished by continuously varying, as necessary, the speed of the simulation data such that the position of the simulation AV matches the position of the recorded AV, as captured in the recorded driving data, with respect to sensing (e.g., observing and reacting to) substantially the same other road users as the recorded AV. That is, by varying the playback speed of the simulation data, the simulation AV receives data regarding the other road users consistent with the positions of the other road users and the positions of the simulation AV.

The time-warping of the simulation data can be summarized as follows.

When the simulation AV and the recorded AV are substantially co-located, the playback speed of the simulation data is maintained. For example, when the simulation AV is within the sensor range of the recorded AV, then the playback speed is maintained. For example, when the simulation AV is within a threshold distance of the recorded AV, then the playback speed is maintained.

When the simulation AV lags the recorded AV, such as described with respect to the example 3220, the playback speed of the simulation data is slowed down so that sensing data regarding other road users are not received too late for the simulation AV to process (e.g., to "see" and react to). Said another way, the playback of the simulation data is slowed thereby allowing the simulation AV to catch up. In an example, whether the simulation AV is lagging the recorded AV can be determined based on whether the distance between the simulation AV and the recorded AV exceeds the threshold distance and the simulation AV is behind (position-wise) the recorded AV.

When the simulation AV leads the recorded AV, such as described with respect to the example 3230, the playback speed of the simulation data is sped up so that sensing data regarding other road users are not received too early for the simulation AV to process (e.g., to "see" and react to). Said another way, the playback of the simulation data is sped up thereby allowing the recorded AV to catch up. In an example, whether the simulation AV is leading the recorded AV can be determined based on whether the distance between the simulation AV and the recorded AV exceeds the threshold distance and the simulation AV is ahead of (position-wise) the recorded AV.

Whether, at a time T, the simulation AV is within the sensor range of the recorded AV can be determined using the position at the time T of the recorded AV (which is available in the simulation data), the boundaries of the sensor range of the recorded AV, and the position at the time T of the simulation AV, as determined by at least one of the processes and modules (e.g., a trajectory planner, a decision-making module, etc.) of the simulation AV.

Whether, at a time T', the simulation AV is within a threshold distance of the recorded AV can be determined using the position, at the time T', of the recorded AV and the position, at the time T', of the simulation AV. The threshold distance can be 1 meter, 2 meters, 10 meters, a longer distance, or a shorter distance. In an example, the threshold distance can be related to the sensing range of the recorded AV. For example, if the sensing range extends X meters in the longitudinal direction, the threshold distance can be a value that is greater than X, or some other value related to X (e.g., 0.75×X). The sensing range is related to the capabilities of the sensors (such as the sensor 126 of FIG. 1) available in the recorded AV. In an example, the sensor range can extend 100 meters in each of the longitudinal directions (e.g., 100 meters to the front and 100 meters behind the recorded AV). However, as mentioned above, other values are possible depending on the sensor capabilities.

Figure 33:
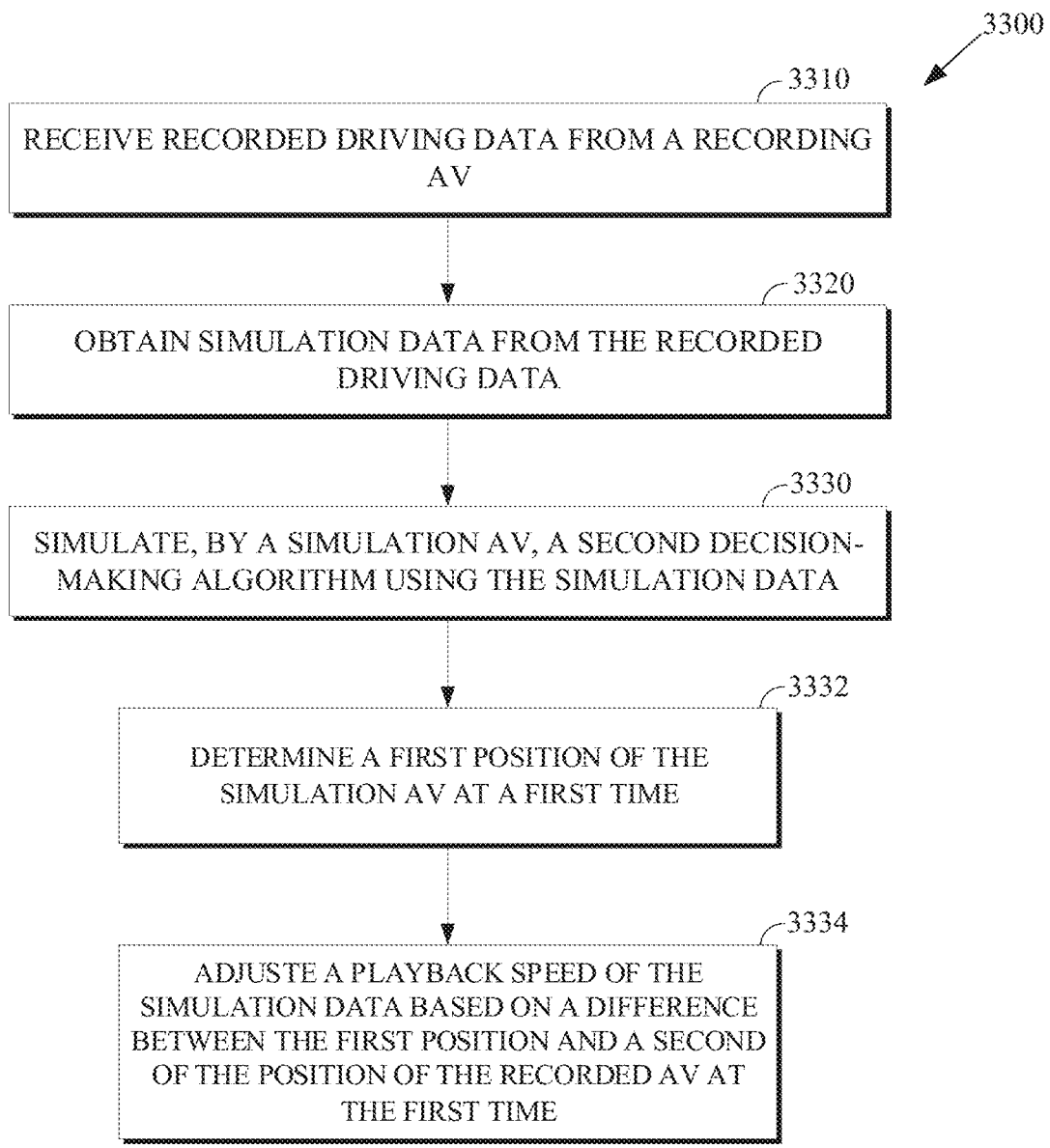
FIG. 33 is a flowchart diagram of a process for simulating autonomous driving in accordance with an implementation of this disclosure.

FIG. 33 is a flowchart diagram of a process 3300 for simulating autonomous driving in accordance with an implementation of this disclosure. The autonomous driving is simulated by a simulation AV. In an implementation, the simulation AV can be configured to include one or more of the modules described with respect to FIG. 4. In implementations where the simulation AV includes a module that plans a trajectory, the simulation AV can include one or more of the modules described with respect to FIG. 5. In an implementation, the simulation AV can include any combination of modules and/or execute any combination of process described in this disclosure, which are used to perform autonomous driving. However, the simulation AV is not limited to the processes and modules disclosed herein.

As the autonomous driving of the process 3300 is a simulation, the simulation AV does not include physical sensors (such as the sensor 126 of FIG. 1). As such, unlike an autonomous vehicle that includes sensors, the simulation AV receives recorded driving data (e.g., digital data) that includes data collected by physical sensors.

The simulation AV can be executed by an apparatus that includes a memory and a processor. The processor can be configured to execute instructions stored in the memory to simulate autonomous driving, including the process 3300.

At 3310, the process 3300 receives recorded driving data from a recorded AV. The recorded driving data can be as described with respect to the recorded driving data 2908 of FIG. 29. The recorded AV can be as described with respect to the recorded AV 2902 of FIG. 29. As such, the recorded driving data can include decision-making data generated using a first decision-making algorithm (i.e., a decision-making algorithm of the recorded AV), sensing data (i.e., data relating to other world objects observed, classified, and the like, by the recorded AV), and movement data of the recorded AV. The movement data includes positions of the recorded AV. In an example, the recorded driving data can be, or can be similar to, as described with respect to the recorded driving data 3000 of FIG. 30.

As described above, the sensing data includes representations of (e.g., data descriptive of) other road users that are obtained using sensors of the recorded AV.

At 3320, the process 3300 obtains simulation data from the recorded driving data. The simulation data can be obtained as described with respect to simulation data 2910 of FIG. 29. As such, obtaining the simulation data from the recorded driving data can include excluding the decision-making data from the recorded driving data. As used in this context, "exclude" means ignore, filter out, not copy, not use, or other exclude in any manner whatsoever. In cases where the recorded driving data further includes operator data, obtaining the simulation data can include excluding the operator data from the recorded driving data. An example of simulation is provided with respect to FIG. 31.

At 3330, the process 3300 simulates a second decision-making algorithm using the simulation data. That is, the simulation AV uses the simulation data to execute one or more processes related to autonomous driving. The one or more processes can include a second decision-making algorithm (which may be executed by a decision-making module, such as the decision-making module 406 of FIG. 4, of the simulation AV). As such, simulating the second decision-making algorithm includes receiving, by the second decision-making algorithm, representations of other road users.

In a non-limiting example, in response to receiving representations of the other road users, the simulation AV can perform one or more operations of the process 2000, such as the operation 2004 to predict trajectories for the other road users (i.e., the real-world objects).

In an implementation, the first decision-making algorithm and the second decision-making algorithm are identical. For example, assume that the recorded driving data includes a first recorded driving datum indicating the presence of a pedestrian (e.g., an another world object) and a second recorded driving datum indicating that an operator (e.g., a human back-up driver of the recorded AV) stopped the AV shortly before or after the pedestrian was detected by the recorded AV. By using the same decision-making algorithm, while excluding the second recorded driving datum from the simulation data, it can be observed how the simulation AV performs (and therefore, the recorded AV would have performed) without the human intervention. That is, the decision-making algorithm can be tested to determine whether decisions of the decision-making algorithm of the recorded AV would have caused the recorded AV to collide with or to avoid the pedestrian.

In an implementation, the first decision-making algorithm and the second decision-making algorithm are not identical. That is, the first decision-making algorithm and the second decision-making algorithm may determine different courses of actions (i.e., decisions) under the same conditions (e.g., the same observed other road users).

Simulating the second decision-making algorithm can include an operation 3332 for determining a first position of the simulation AV at a first time, and a second operation 3334 for adjusting a playback speed of the simulation data based on a difference between the first position and a second position of the positions of the recorded AV at the first time.

As mentioned above, the simulation AV can include a trajectory planner. As such, the position of the simulation at any point in time during the simulation can be determined based on the trajectory that is determined by the trajectory planner. As such, the first position of the simulation AV at the first time is the position (i.e., location) of the simulation AV at the first time on the determined trajectory. The second position of the recorded AV at the first time can be available in the movement data that are part of the recorded driving data, as described above.

The distance can be measured between respective co-located eye-points of the recorded AV and the simulation AV. An eye-point corresponds to a location on an AV. The eye-point can be considered the central point of all the sensors of the AV. In an example, the eye-point can be the center of the rear axle of the AV. As such, the distance can be the distance measured at the first time between the center of the real axle of the simulation AV and the center of the real axle of the recorded AV. In an example, the distance can be the Euclidian distance between the centers of the respective real axels of the simulation AV and the recorded AV. That is, the distance can be length of a straight line between the centers of the respective real axels. In another implementation, the distance can be measured only in the longitudinal direction, which is the direction of travel of the simulation AV and the recorded AV.

In an implementation, adjusting the playback speed of the simulation data can include, in response to the first position being outside a sensing range of the recorded AV, adjusting the playback speed of the simulation data. Adjusting the playback speed can have the effect that the first position and the second position are within the sensing range of the recorded AV.

In an implementation, adjusting the playback speed of the simulation data can include, in response to a distance between the first position and the second position exceeding a threshold distance, adjusting the playback speed of the simulation data. As mentioned above, adjusting the playback speed can have the effect that the first position and the second position are within the sensing range of the recorded AV.

The amount of adjustment of the playback speed can be determined using a Proportional-Integral-Derivative (PID) controller. The PID controller can use the distance between the first position and the second position as an error value.

Figure 34:
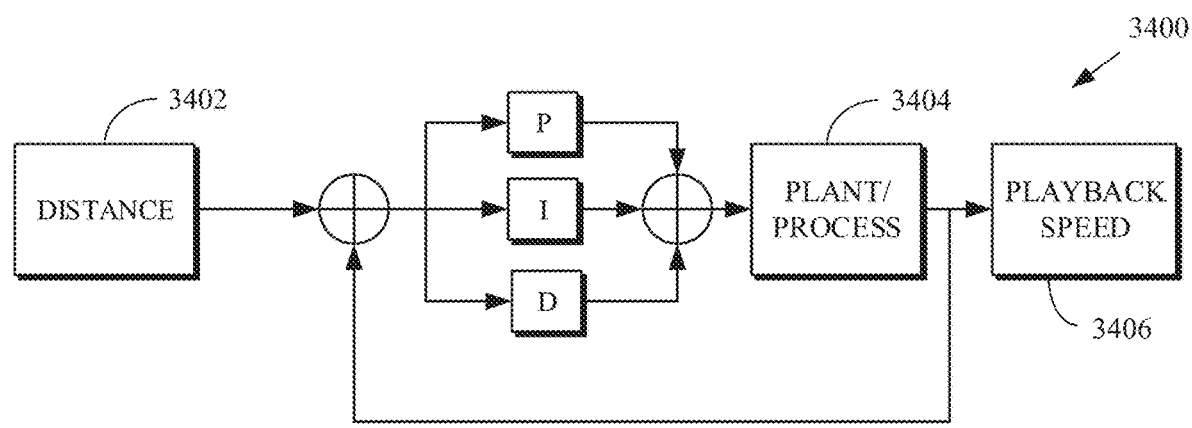
FIG. 34 is a block diagram of a Proportional-Integral-Derivative (PID) controller for determining a playback speed adjustment according to implementations of this disclosure.

FIG. 34 is a block diagram of a Proportional-Integral-Derivative (PID) controller 3400 for determining a playback speed adjustment according to implementations of this disclosure. A detailed description of the PID controller 3400 is omitted as PID controllers are well understood by a person skilled in the art. A distance 3402 is used as input to the PID controller 3400. The distance 3402 is the difference between the first position of the simulation AV and the second position of the positions of the recorded AV at a time T. The distance 3402 is a signed value to indicate whether the simulation AV lags or leads the recorded AV at the time T. An output 3404 of the PID controller indicates the amount of adjustment to the playback speed. As mentioned above, if the distance 3402 does not exceed (in absolute value) a threshold distance, then the PID controller 3400 can be configured to not adjust the playback speed. The threshold distance can be 1 meter, 2 meters, or some other threshold distance. A playback speed 3406 indicates the number of recorded data points that the simulation AV is to process in a next time window.

FIG. 31 is referred to again to illustrate adjusting the playback speed, such as by the PID controller 3400. Assume that the current simulation time is time t. In the case that the distance between the recorded AV and the simulation AV does not exceed the threshold distance, then the simulation AV processes the simulation data points at real time. That is, the simulation AV processes the simulation data points at the same rate that the simulation data points were recorded by the recorded AV. For example, and referring to FIG. 31, if the recorded AV recorded simulation data points labeled 1-5 (or, more accurately, the recorded driving data points from which the simulation data points are derived) between the times t and t+Δt, then the simulation AV processes the data points 1-5 at the same rate between simulation times t and t+Δt. That is, the simulation AV processes the simulation data numbered 1-5 between the simulations times t and t+Δt.

On the other hand, if the distance exceeds the threshold distance and indicates that the simulation AV leads the recorded AV, the PID controller 3400 may indicate (via the output 3404) that the playback speed 3406 should be increased to, for example, 140% of the real-time speed. As such, between the simulation times t and t+Δt, the simulation AV processes the simulation data points 1-7 (corresponding to 140%×(number of data points per time window)=140%×5=the next 7 simulation data points).

Assume next that the distance exceeds the threshold distance and indicates that the simulation AV lags the recorded AV and that the PID controller 3400 indicates (via the output 3404) that the playback speed 3406 should be decreased to, for example, 60% of the real-time speed. As such, between the simulation times t+Δt and t+2Δt, the simulation AV is to process the simulation data points labeled 8-10 (corresponding to 60%×(number of data points per time window)=60%×5=the next 3 simulation data points).

In some implementations, the playback speed is adjusted only for a portion of the simulation. For example, the purpose of the simulation may be to test, in the simulation, the interaction between an other road user and the simulation AV. For example, the simulation data may be for a recorded drive of length L, which includes an interaction between the recorded AV and a road user within an interval of the recorded drive, starting at time t1 and ending at time t2. For example, the recorded drive may be of length 20 minutes and the recorded AV may have encountered a pedestrian at time 10 minutes and 30 seconds into the recorded drive. As such, the playback speed may be adjusted up to time t1 of the simulation. Between times t1 and t2 of the simulation, the playback speed is not adjusted.

In an implementation, a process for simulating autonomous driving can include receiving recorded driving data from a recorded autonomous vehicle (AV) that uses a first decision-making algorithm; and simulating, by a simulation AV, a second decision-making algorithm using at least some of the recorded driving data. The simulating the second decision-making algorithm can include adjusting a playback speed of the at least some of the recorded driving data based on a difference between a first position of the simulation AV at a first time and a second of the position of the recorded AV at the first time.

For simplicity of explanation, the processes 800, 1300, 1800, 2000, 2050, 2500, 2700, 2800, and 3300 are each depicted and described as a series of operations. However, the operations in accordance with this disclosure can occur in various orders and/or concurrently. Additionally, other steps or operations not presented and described herein may be used. Furthermore, not all illustrated operations may be required to implement a technique in accordance with the disclosed subject matter.

As used herein, the terminology "driver" or "operator" may be used interchangeably. As used herein, the terminology "brake" or "decelerate" may be used interchangeably. As used herein, the terminology "computer" or "computing device" includes any unit, or combination of units, capable of performing any method, or any portion or portions thereof, disclosed herein.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. In some implementations, instructions, or a portion thereof, may be implemented as a special-purpose processor or circuitry that may include specialized hardware for carrying out any of the methods, algorithms, aspects, or combinations thereof, as described herein. In some implementations, portions of the instructions may be distributed across multiple processors on a single device, or on multiple devices, which may communicate directly or across a network, such as a local area network, a wide area network, the Internet, or a combination thereof.

As used herein, the terminology "example," "embodiment," "implementation," "aspect," "feature," or "element" indicate serving as an example, instance, or illustration. Unless expressly indicated otherwise, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "determine" and "identify," or any variations thereof, includes selecting, ascertaining, computing, looking up, receiving, determining, establishing, obtaining, or otherwise identifying or determining in any manner whatsoever using one or more of the devices shown and described herein.

As used herein, the terminology "or" is intended to mean an inclusive "or" rather than an exclusive "or." That is, unless specified otherwise or clearly indicated otherwise by the context, "X includes A or B" is intended to indicate any of the natural inclusive permutations thereof. If X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of operations or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and/or elements.

While the disclosed technology has been described in connection with certain embodiments, it is to be understood that the disclosed technology is not to be limited to the disclosed embodiments but, on the contrary, is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method of simulating autonomous driving, comprising:
   receiving recorded driving data from a recorded autonomous vehicle (AV), the recorded driving data including:
      decision-making data generated using a first decision-making algorithm;
      sensing data; and
      movement data including positions of the recorded AV;
   obtaining simulation data from the recorded driving data by:
      excluding the decision-making data from the recorded driving data; and
   simulating, by a simulation AV, a second decision-making algorithm using the simulation data, wherein the simulating the second decision-making algorithm comprises:
      determining a first position of the simulation AV at a first time; and
      adjusting a playback speed of the simulation data based on a difference between the first position and a second position of the positions of the recorded AV at the first time.

2. The method of claim 1, wherein the difference between the first position and a second of the position is measured in a longitudinal direction.

3. The method of claim 1,
   wherein the recorded driving data further includes operator data, and
   wherein obtaining the simulation data further comprises:
      excluding the operator data from the recorded driving data.

4. The method of claim 1, wherein adjusting the playback speed of the simulation data comprises:
   in response to the first position being outside a sensing range of the recorded AV, adjusting the playback speed of the recorded driving data.

5. The method of claim 1, wherein adjusting the playback speed of the simulation data comprises:
   in response to a distance between the first position and the second position exceeding a threshold distance, adjusting the playback speed of the simulation data.

6. The method of claim 1, wherein adjusting the playback speed of the simulation data comprises:
   adjusting, by a Proportional-Integral-Derivative controller (a PID controller), the playback speed of the simulation data, wherein the PID controller uses a distance between the first position and the second position as an error value.

7. The method of claim 6, wherein the PID controller adjusts the playback speed of the simulation data in a case that the distance exceeds a threshold.

8. The method of claim 6, wherein the distance is measured between respective co-located eye-points of the recorded AV and the simulation AV.

9. The method of claim 8, wherein the respective co-located eye-points correspond to respective centers of rear axles of the recorded AV and the simulation AV.

10. The method of claim 1, wherein the sensing data includes representations of other road users obtained using line-of-sight sensors of the AV.

11. The method of claim 1,
    wherein the sensing data includes a representation of another road user obtained using sensors of the recorded AV, and
    wherein simulating, by the simulation AV, the second decision-making algorithm using the recorded driving data comprises:
       receiving, by the second decision-making algorithm, the representation of the other road user.

12. An apparatus for simulating autonomous driving, comprising:
    a memory; and
    a processor configured to execute instructions of a simulation autonomous vehicle (AV) stored in the memory to:
       receive recorded driving data from a recorded AV, the recorded driving data including:
          decision-making data generated using a first decision-making algorithm;
          sensing data; and
          movement data including positions of the recorded AV;
       obtain simulation data from the recorded driving data by:
          excluding the decision-making data from the recorded driving data; and
       simulate a second decision-making algorithm using the simulation data, wherein the simulating the second decision-making algorithm comprises to:
          determine a first position of the simulation AV at a first time; and
          adjust a playback speed of the simulation data based on a difference between the first position and a second position of the positions of the recorded AV at the first time.

13. The apparatus of claim 12, wherein the difference between the first position and a second of the position is measured in a longitudinal direction.

14. The apparatus of claim 12,
    wherein the recorded driving data further includes operator data, and
    wherein obtaining the simulation data further comprises:
       excluding the operator data from the recorded driving data.

15. The apparatus of claim 12, wherein to adjust the playback speed of the simulation data comprises to:
    in response to the first position being outside a sensing range of the recorded AV, adjust the playback speed of the recorded driving data such that the first position and the second position are within the sensing range of the recorded AV.

16. The apparatus of claim 12, wherein to adjust the playback speed of the simulation data comprises to:
   in response to a distance between the first position and the second position exceeding a threshold distance, adjust the playback speed of the recorded driving data such that the first position and the second position are within a sensing range of the recorded AV.

17. The apparatus of claim 12, wherein to adjust the playback speed of the simulation data comprises to:
   adjust, by a proportional-integral-derivative (PID) controller, the playback speed of the simulation data, wherein the PID controller uses a distance between the first position and the second position as an error value.

18. The apparatus of claim 17, wherein the distance is measured between respective co-located eye-points of the recorded AV and the simulation AV corresponding to respective centers of rear axles of the recorded AV and the simulation AV.

19. The apparatus of claim 12,
   wherein the sensing data includes a representation of another road user obtained using sensors of the recorded AV, and
   wherein to simulate the second decision-making algorithm using the simulation data comprises to:
      receive, by the second decision-making algorithm, the representation of the other road user.

20. A method of simulating autonomous driving, comprising:
   receiving recorded driving data from a recorded autonomous vehicle (AV), the recorded AV using a first decision-making algorithm; and
   simulating, by a simulation AV, a second decision-making algorithm using at least some of the recorded driving data, wherein the simulating the second decision-making algorithm comprises:
      adjusting a playback speed of the at least some of the recorded driving data based on a difference between a first position of the simulation AV at a first time and a second of the position of the recorded AV at the first time.

* * * * *